United States Patent
Koyanagi

(10) Patent No.: US 7,906,363 B2
(45) Date of Patent: Mar. 15, 2011

(54) METHOD OF FABRICATING SEMICONDUCTOR DEVICE HAVING THREE-DIMENSIONAL STACKED STRUCTURE

(75) Inventor: Mitsumasa Koyanagi, Miyagi (JP)

(73) Assignee: ZyCube Co., Ltd., Tokyo (JP)

( * ) Notice: Subject to any disclaimer, the term of this patent is extended or adjusted under 35 U.S.C. 154(b) by 290 days.

(21) Appl. No.: 11/573,976

(22) PCT Filed: Aug. 19, 2005

(86) PCT No.: PCT/JP2005/015133
§ 371 (c)(1),
(2), (4) Date: Dec. 12, 2008

(87) PCT Pub. No.: WO2006/019156
PCT Pub. Date: Feb. 23, 2006

(65) Prior Publication Data
US 2009/0149023 A1    Jun. 11, 2009

(30) Foreign Application Priority Data
Aug. 20, 2004    (JP) .................................. 2004-240944

(51) Int. Cl.
*H01L 21/00* (2006.01)
(52) U.S. Cl. .................... 438/66; 438/67; 257/E21.513; 257/E21.606
(58) Field of Classification Search .................. 438/666, 438/667, 66, 67; 257/E21.597, E21.513, 257/E21.506, E21.606
See application file for complete search history.

(56) References Cited

U.S. PATENT DOCUMENTS

| | | | |
|---|---|---|---|
| 4,939,568 A | 7/1990 | Kato et al. | |
| 5,846,879 A | 12/1998 | Winnerl et al. | |
| 6,025,648 A | 2/2000 | Takahashi et al. | |
| 6,624,081 B2 * | 9/2003 | Dykstra et al. | 438/710 |
| 6,677,235 B1 * | 1/2004 | Yegnashankaran et al. | 438/667 |
| 6,936,532 B2 * | 8/2005 | Sakaida | 438/616 |
| 7,564,118 B2 * | 7/2009 | Pogge et al. | 257/621 |

(Continued)

FOREIGN PATENT DOCUMENTS

JP    60-7149    1/1985

(Continued)

OTHER PUBLICATIONS

Kurino, K., et al., "Intelligent Image Sensor Chip with Three Dimensional Structure," IEEE, 1999, pp. 879-882.

(Continued)

*Primary Examiner* — Caridad M Everhart
(74) *Attorney, Agent, or Firm* — Griffin & Szipl, P.C.

(57) ABSTRACT

A method of fabricating a semiconductor device having a three-dimensional stacked structure by stacking semiconductor circuit layers on a support substrate, including the steps of: forming a trench in a semiconductor substrate; filling inside the trench with a conductive material to form a conductive plug; forming an element or circuit in an inside or on a surface of the semiconductor substrate where the conductive plug was formed; covering the surface of the semiconductor substrate where the element or circuit was formed with a second insulating film; and fixing the semiconductor substrate to the support substrate or a remaining one of the semiconductor circuit layers by joining the second insulating film to the support substrate or the remaining one of the semiconductor circuit layers through a wiring structure; selectively removing the semiconductor substrate to expose the first insulating film; and selectively removing the first insulating film.

43 Claims, 26 Drawing Sheets

U.S. PATENT DOCUMENTS

| | | | | |
|---|---|---|---|---|
| 2003/0193076 | A1* | 10/2003 | Patti | 257/620 |
| 2003/0222343 | A1* | 12/2003 | Sakaida | 257/737 |
| 2006/0124927 | A1* | 6/2006 | Groves et al. | 257/48 |
| 2009/0215261 | A1* | 8/2009 | Kawano | 438/643 |

FOREIGN PATENT DOCUMENTS

| | | |
|---|---|---|
| JP | 62-272556 | 11/1987 |
| JP | 02-278893 | 11/1990 |
| JP | 03-276750 | 12/1991 |
| JP | 04-326757 | 11/1992 |
| JP | 8-509842 | 10/1996 |
| JP | 10-189653 | 7/1998 |
| JP | 11-238870 | 8/1999 |
| JP | 2000-326326 | 11/2000 |
| JP | 2001-057404 | 2/2001 |
| JP | 2001-274196 | 10/2001 |
| JP | 2001-326325 | 11/2001 |
| JP | 2001-326326 | 11/2001 |
| JP | 2002-110902 | 4/2002 |
| JP | 2002-513208 | 5/2002 |
| JP | 2002-289623 | 10/2002 |
| JP | 2003-124251 | 4/2003 |
| JP | 2004-014657 | 1/2004 |

OTHER PUBLICATIONS

Lee, Kang Wook, et al., "Development of Three-Dimensional Integration Technology for Highly Parallel Image-Processing Chip," Jpn. J. Appl. Phys., vol. 39. 2000, pp. 2473-2477.

Xiong, Xiaorong et al. "Controlled Multibatch Self-Assembly of Microdevices", Journal of Microelectromechanical Systems, vol. 12, No. 2, pp. 117-127, Apr. 2003.

Office Action issued in co-pending related U.S. Appl. No. 11/570,009, mailed Nov. 4, 2010.

* cited by examiner (FIG. 1)
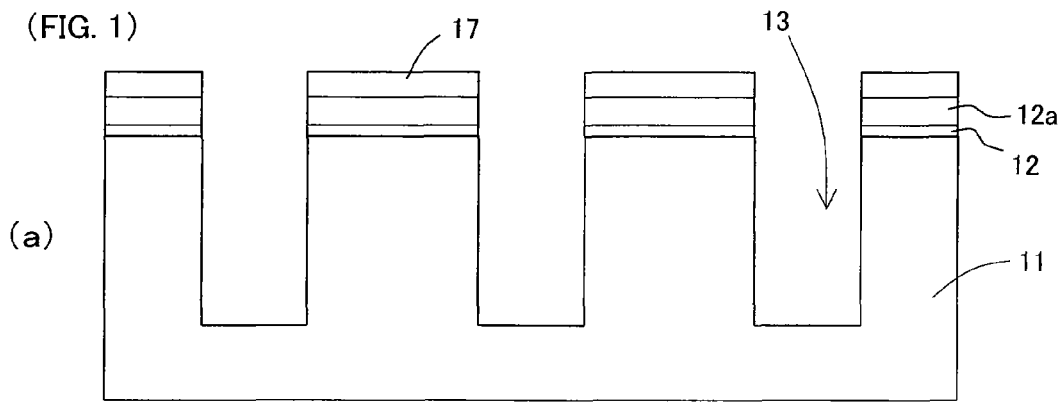
(a)
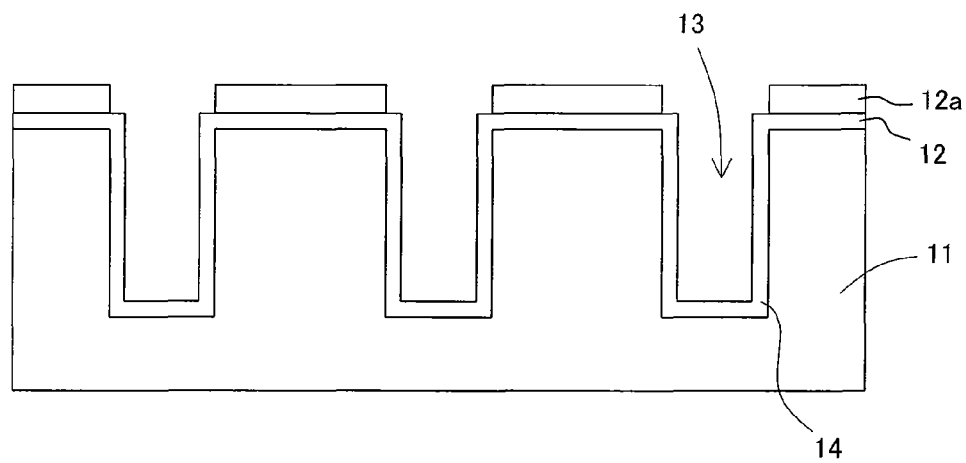
(b)
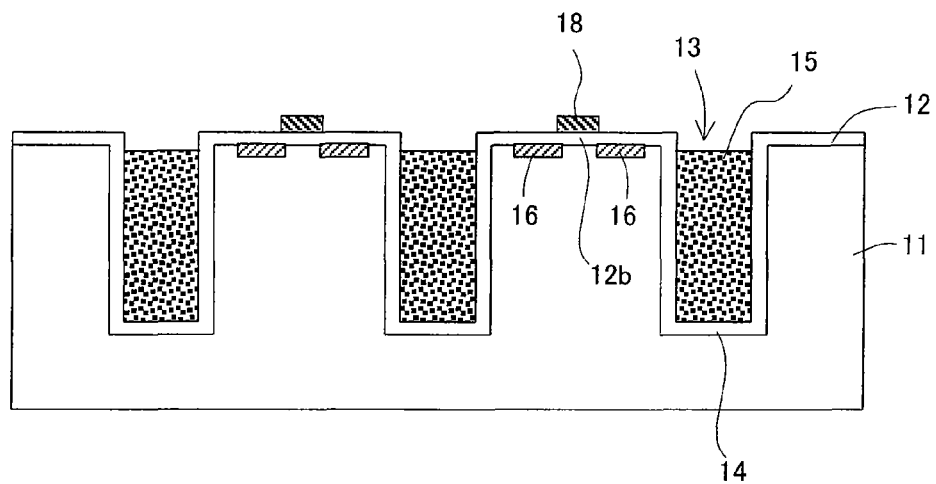
(c)

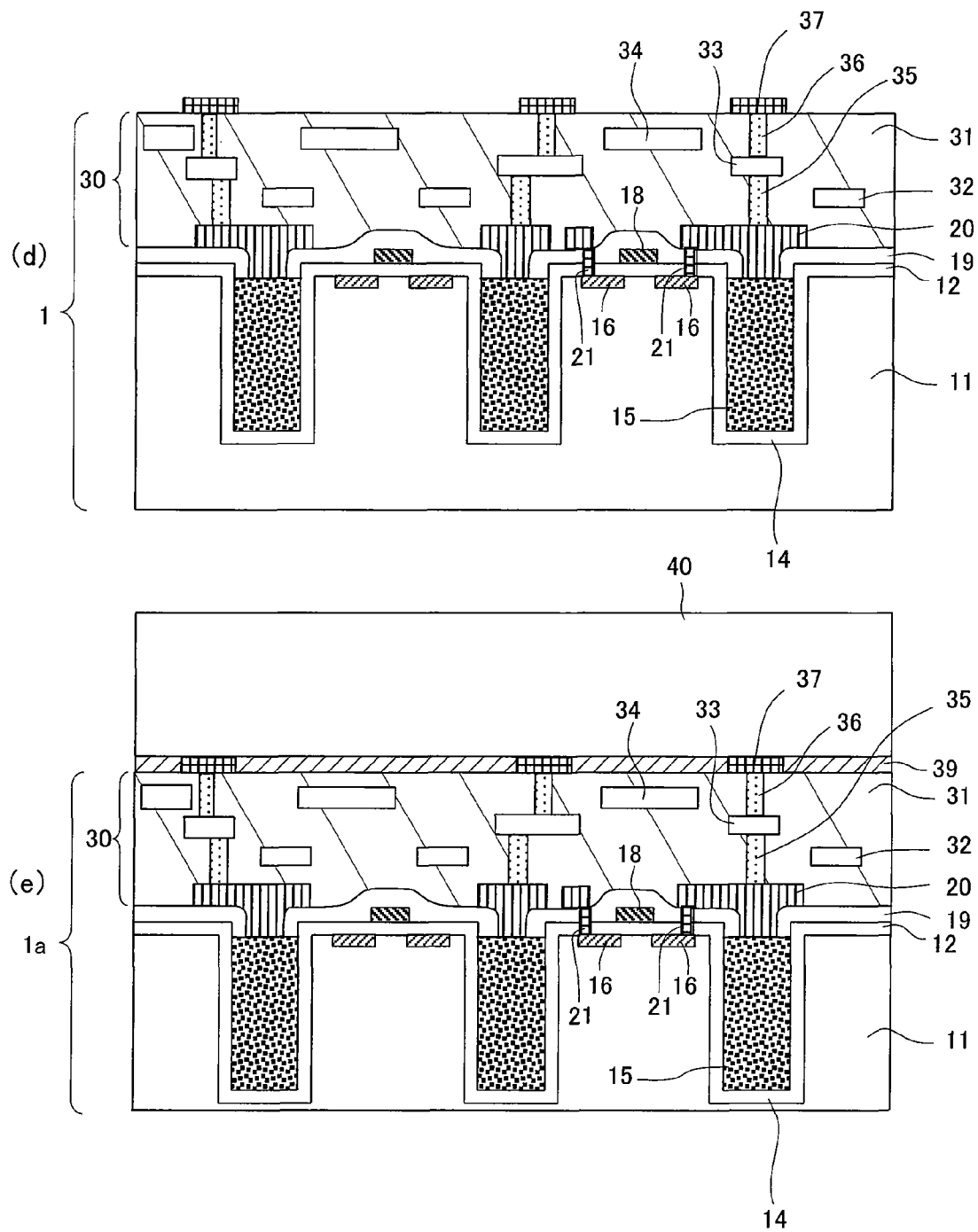
(FIG. 2)

(FIG. 3)
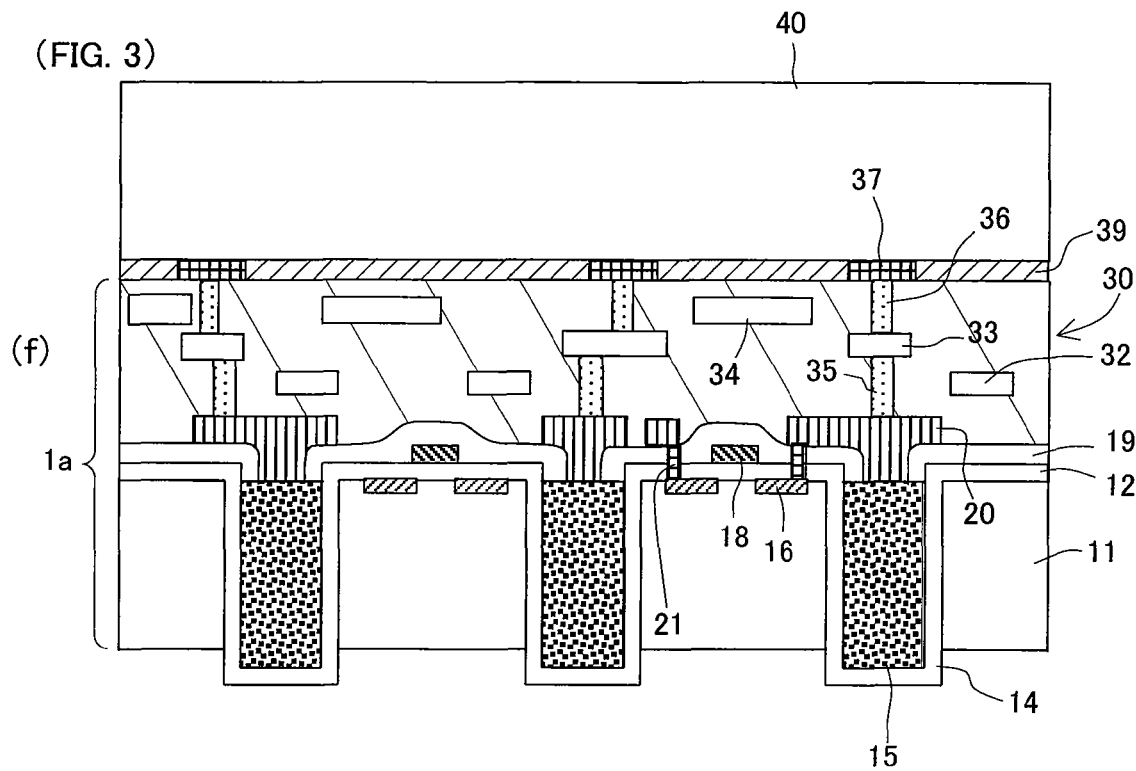
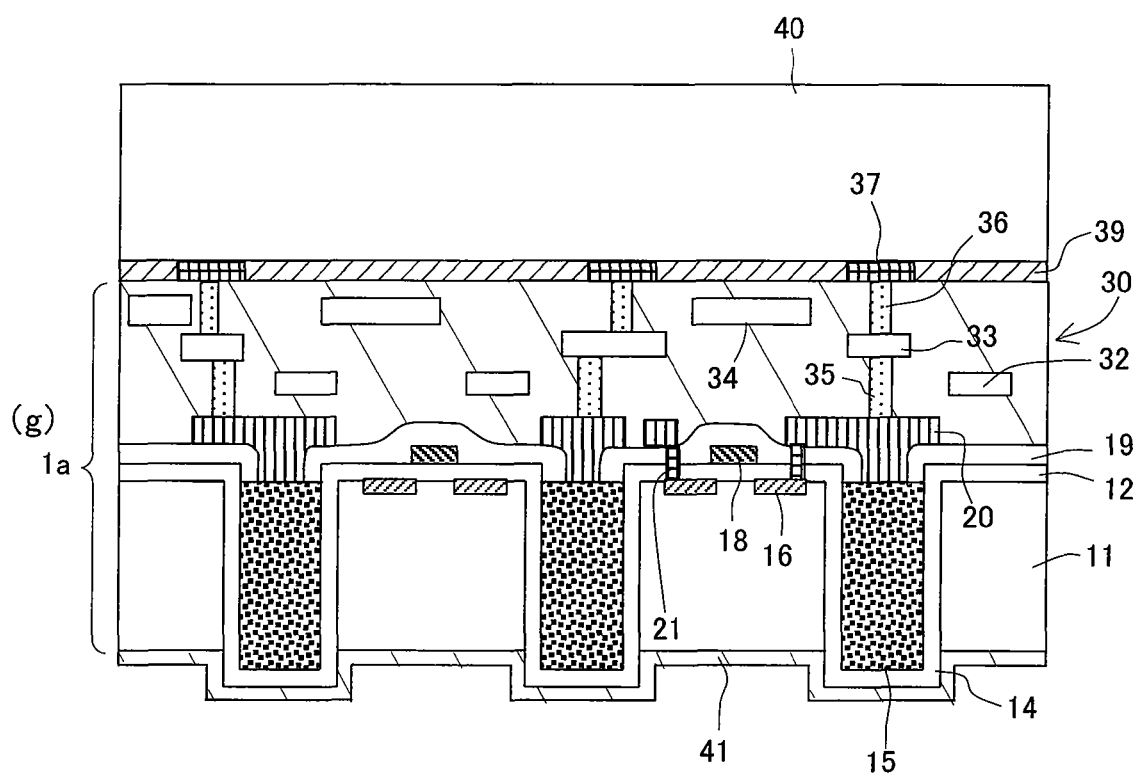

(FIG. 4)
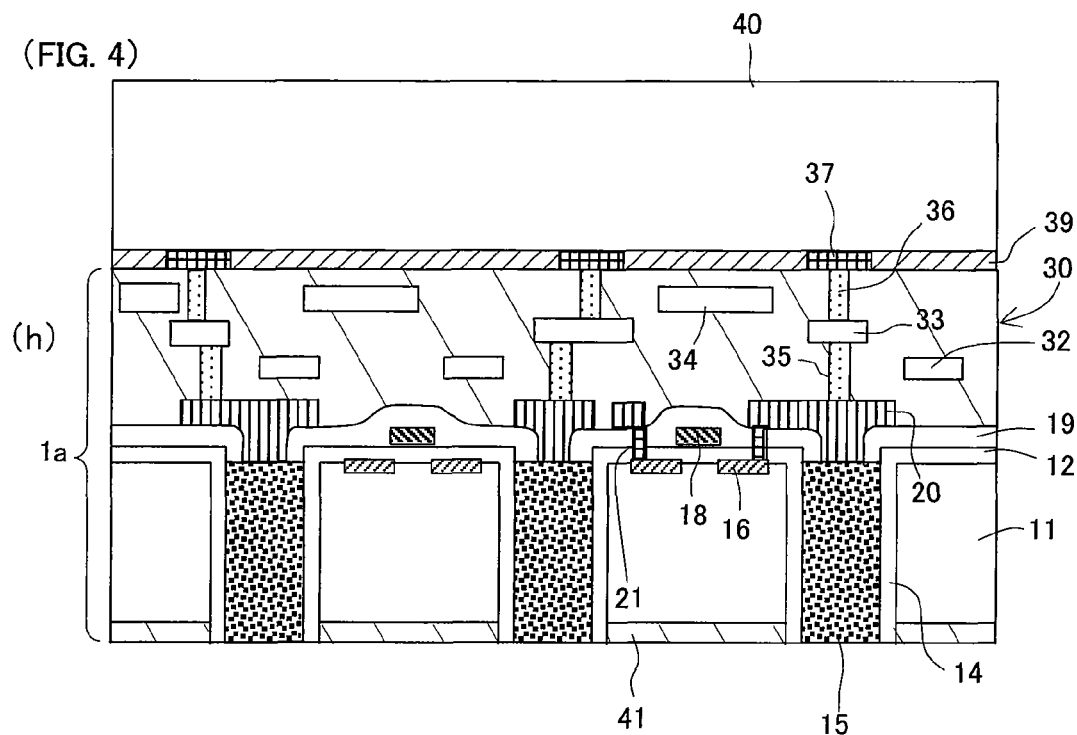
(h)
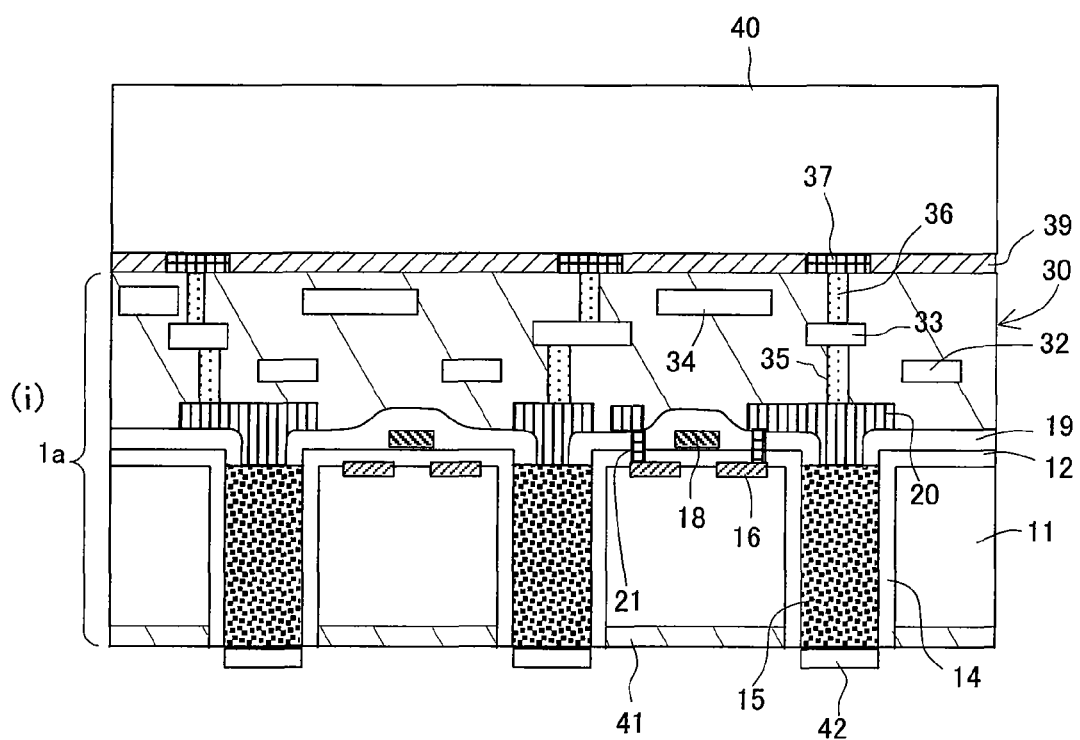
(i)

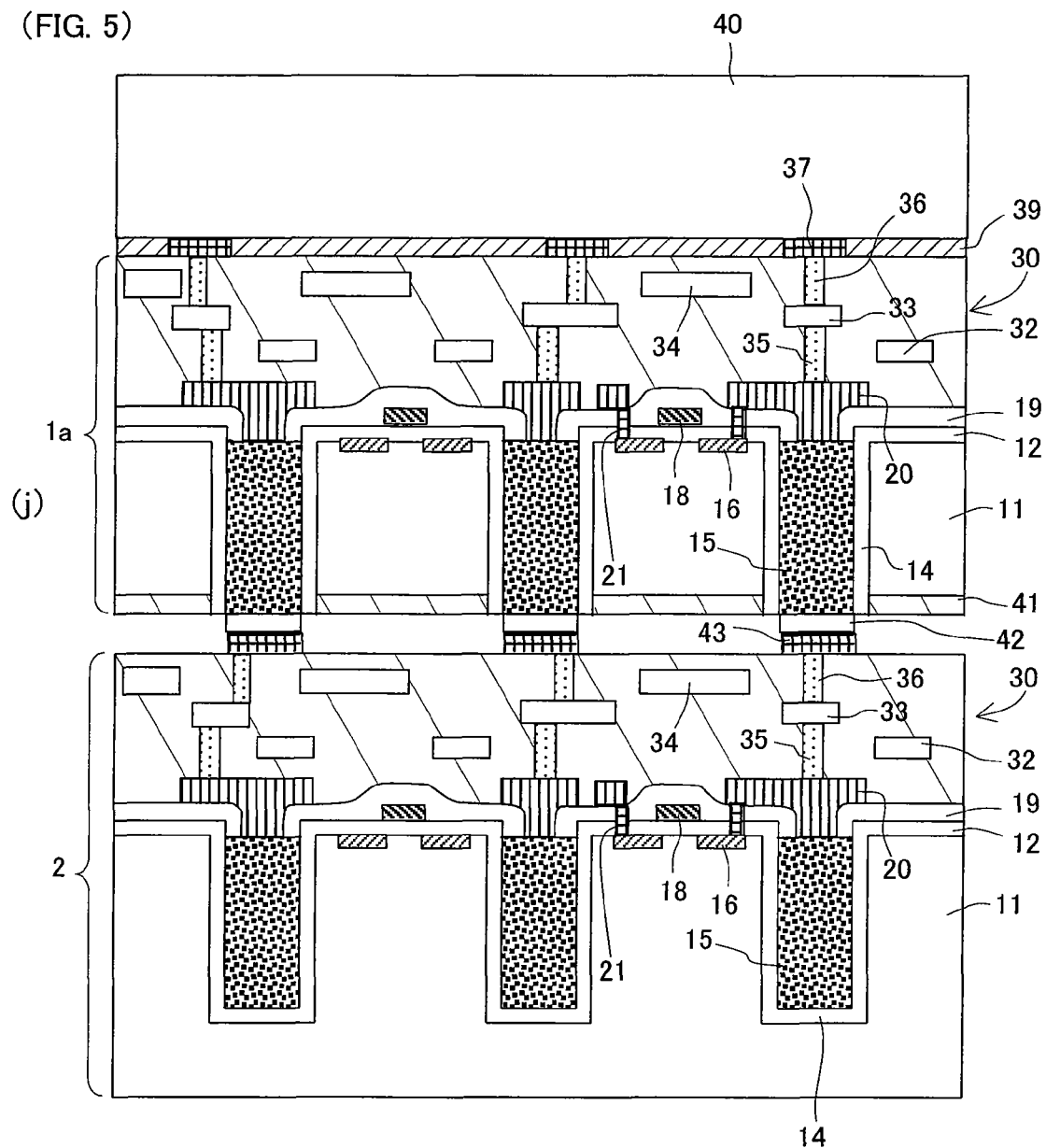

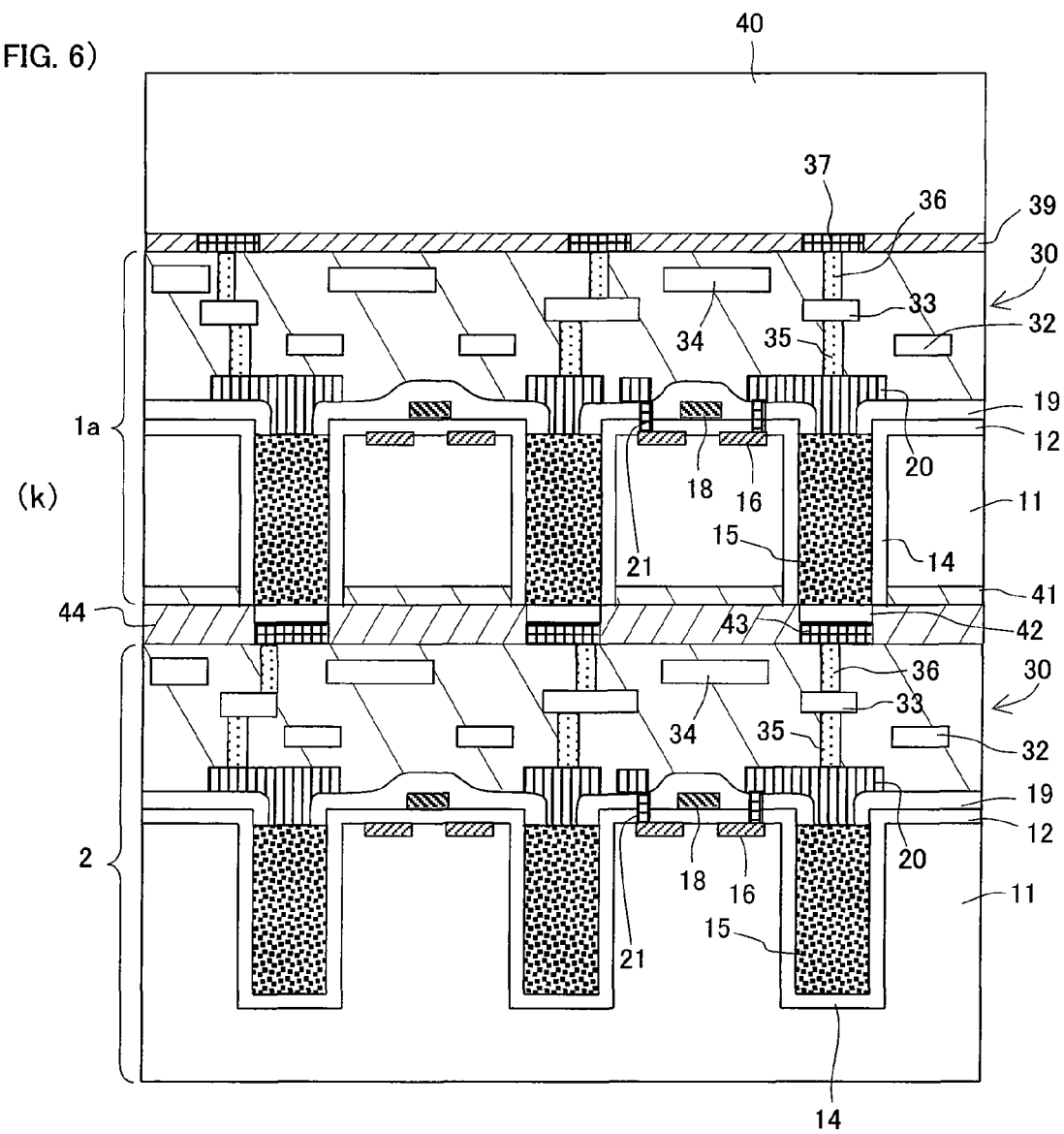
(FIG. 6)
(k)

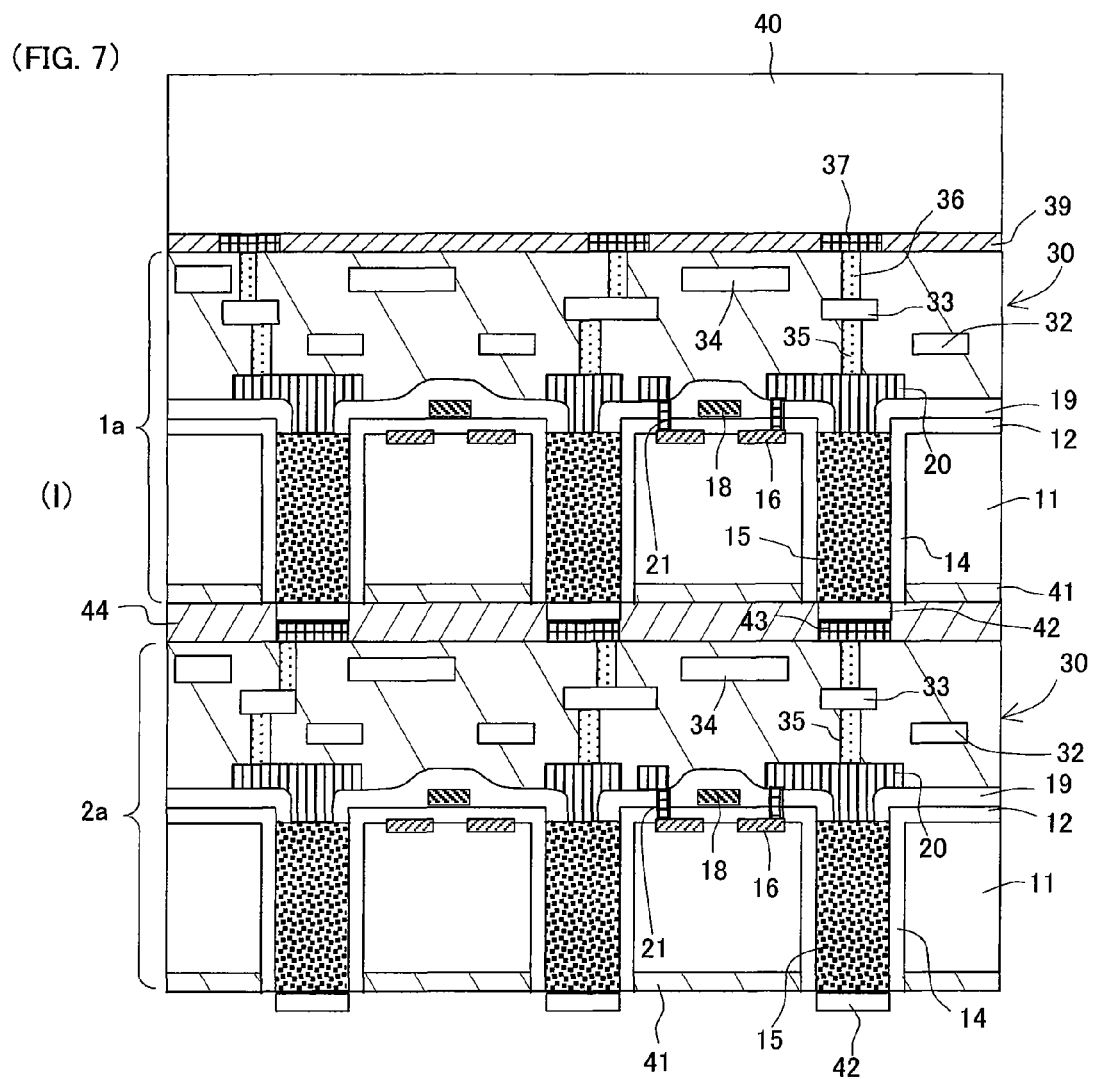

(FIG. 8)
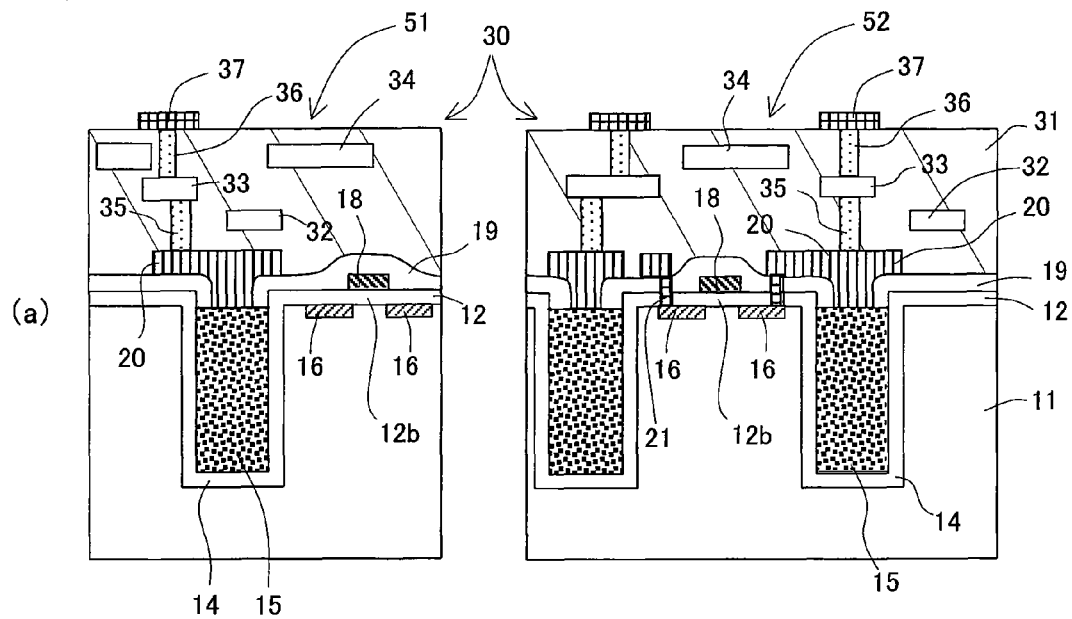
(a)
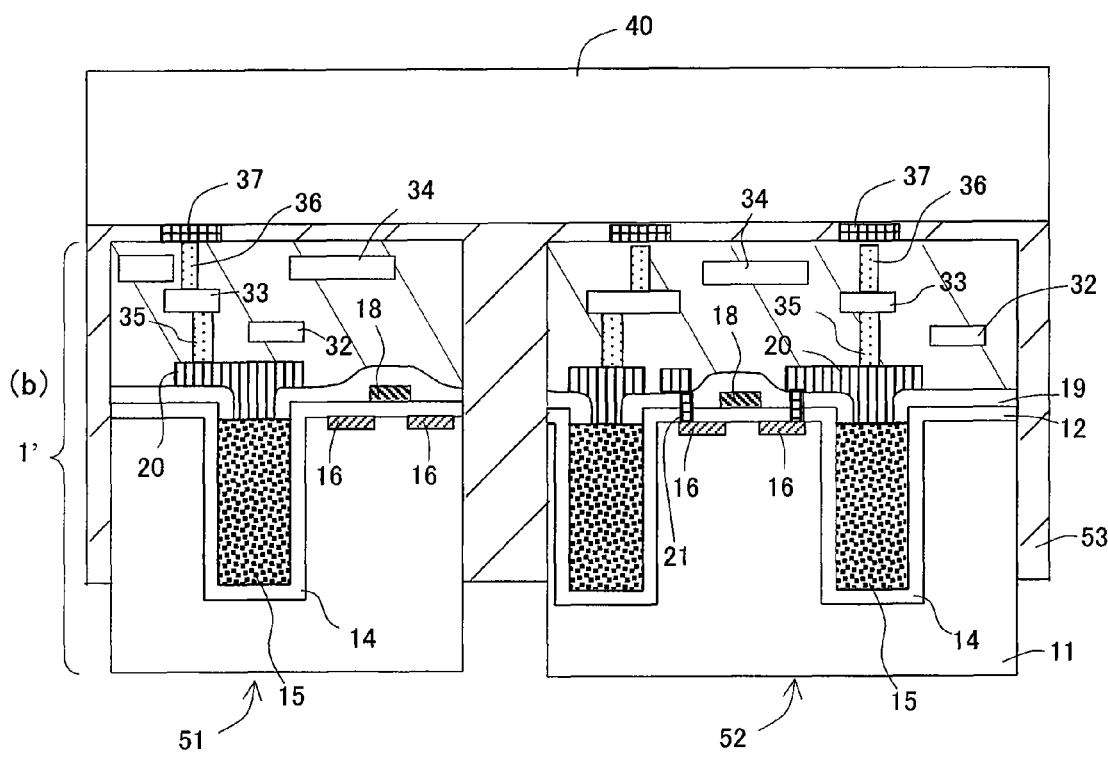
(b)

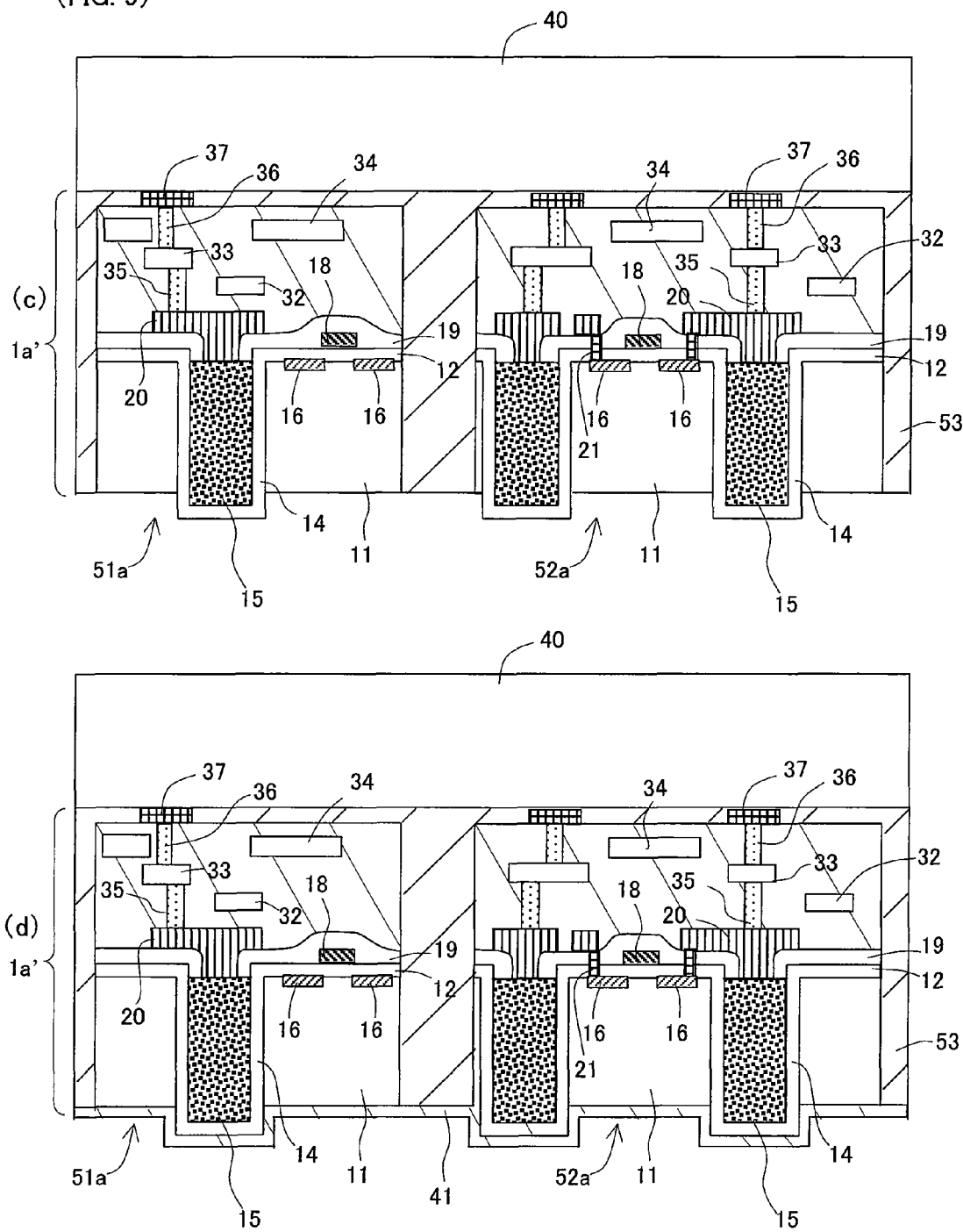

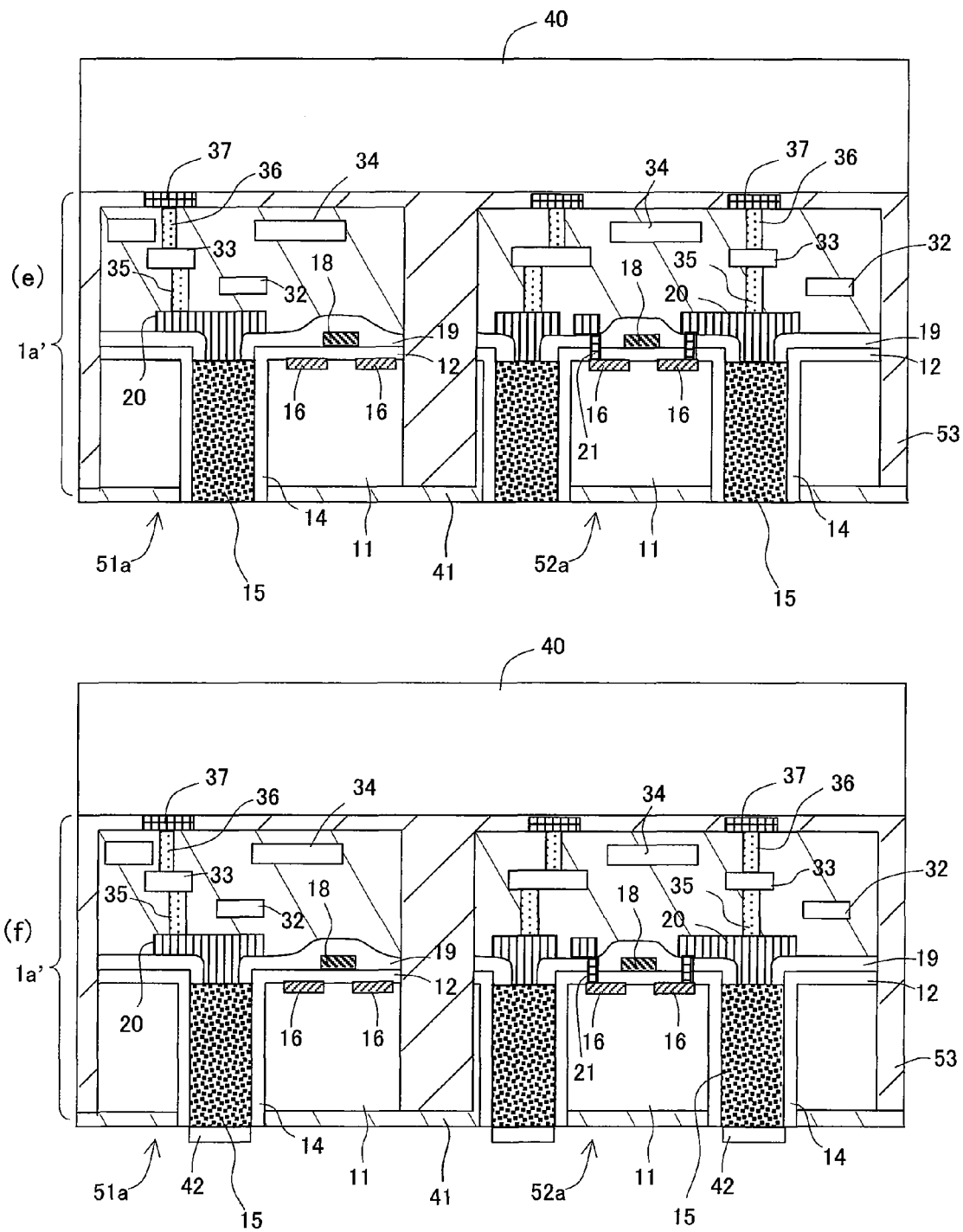

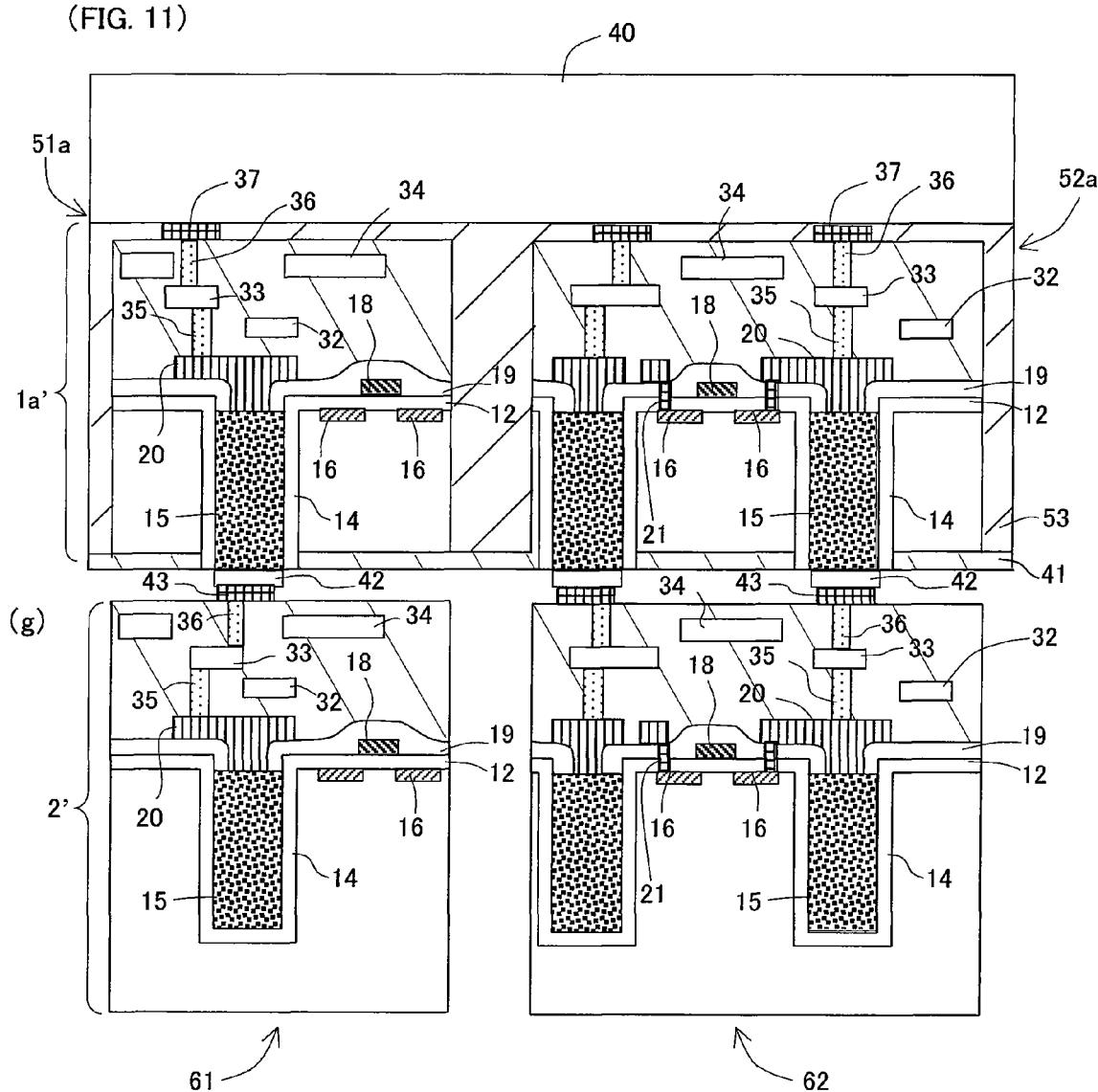
(FIG. 11)

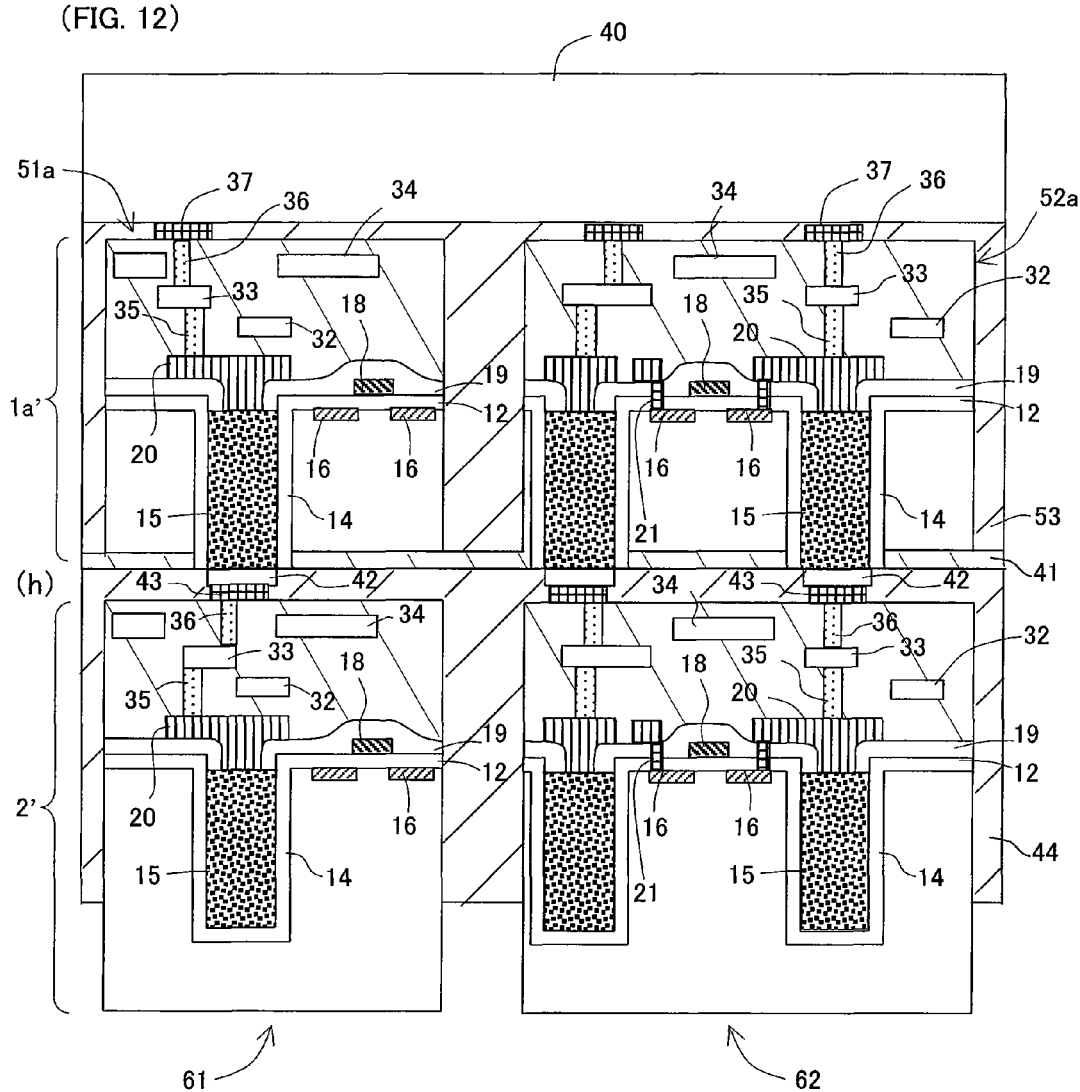

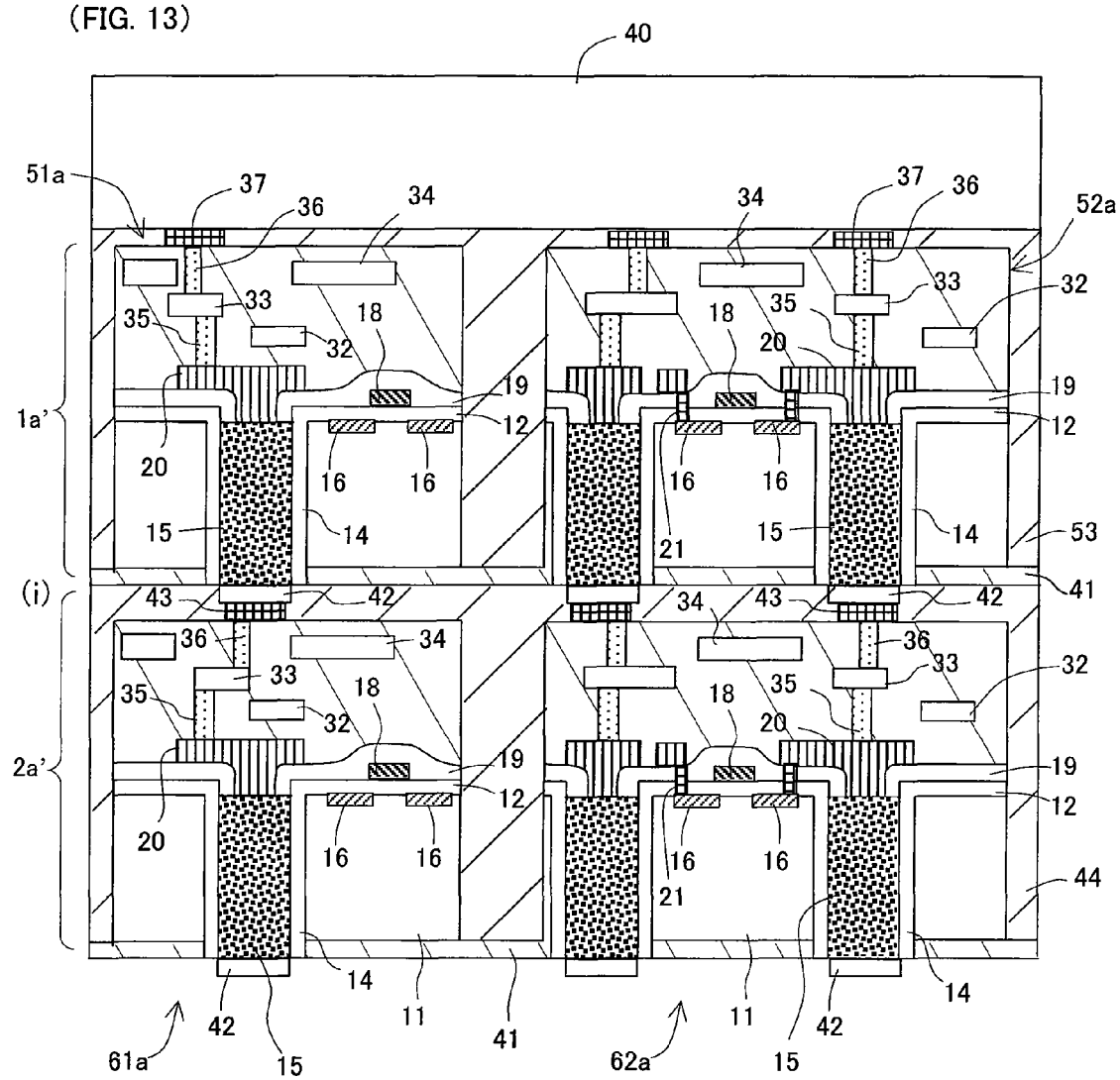
(FIG. 13)

(FIG. 14)
(a)
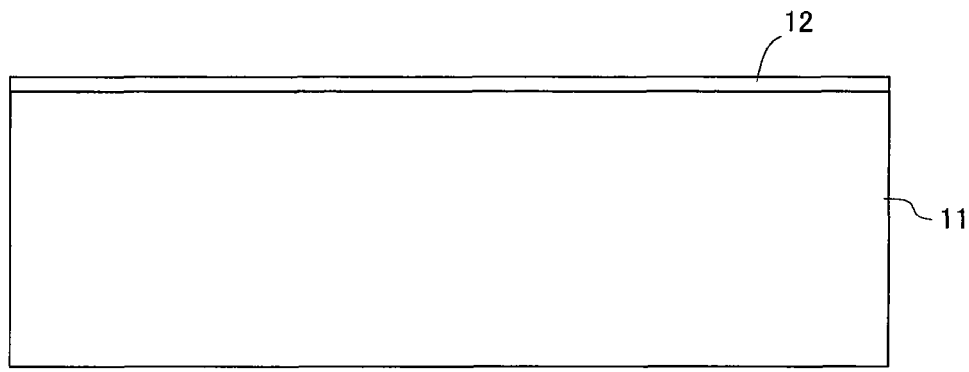
(b)
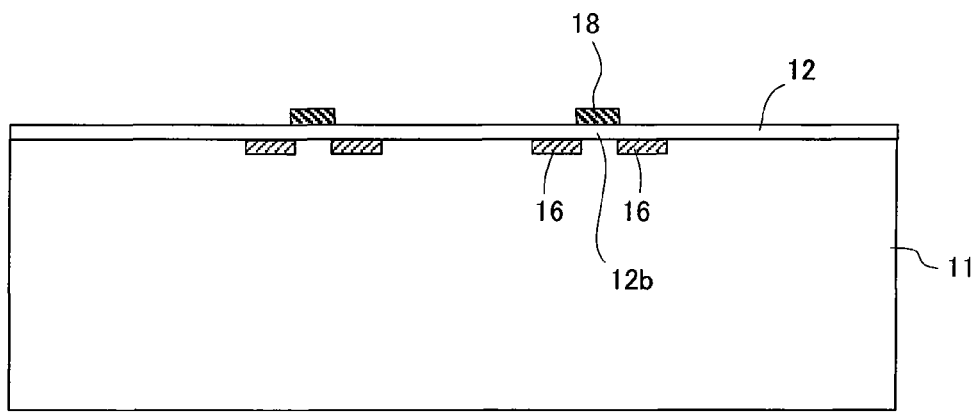

(FIG. 15)
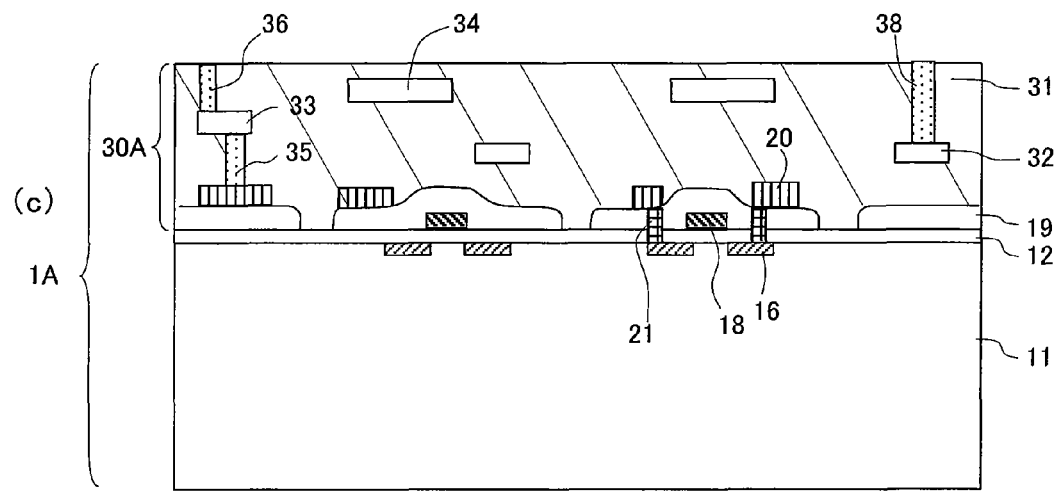
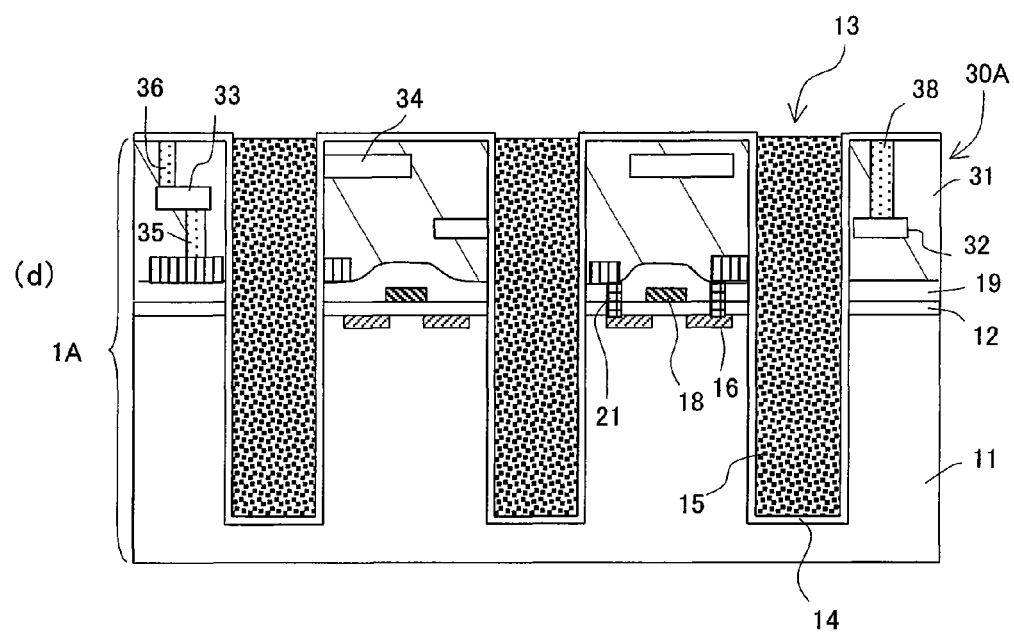

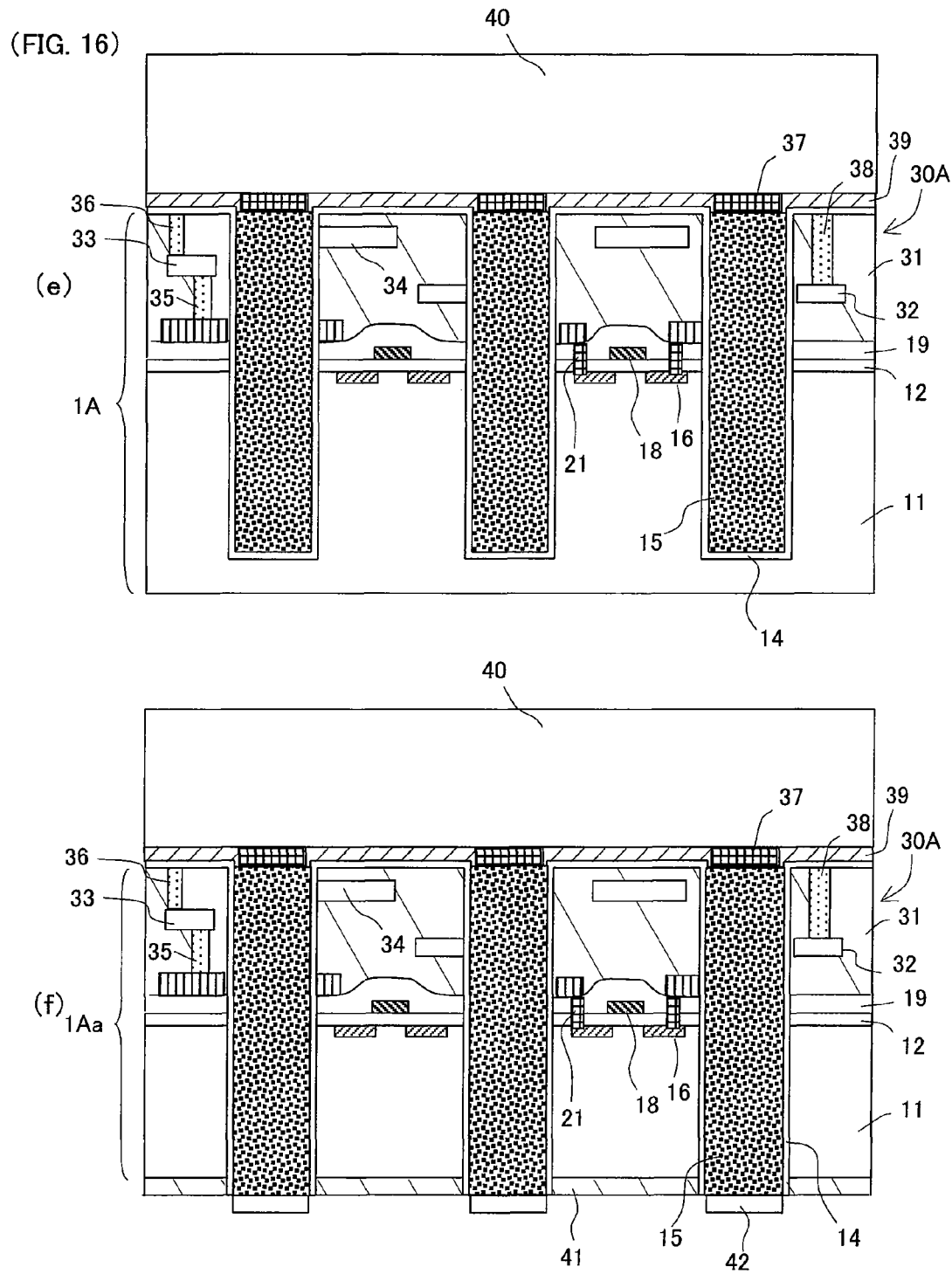

(FIG. 17)
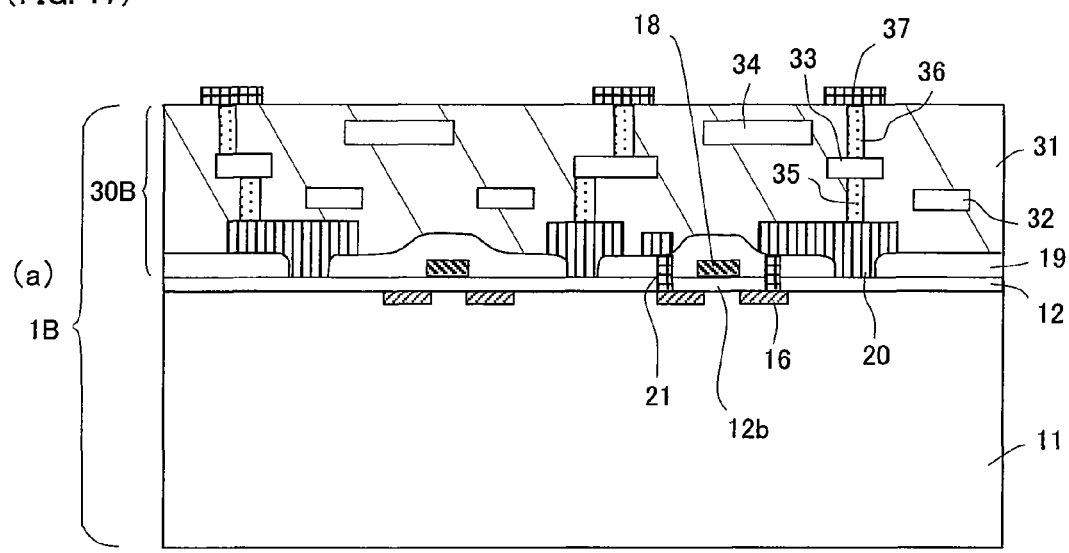
(a)
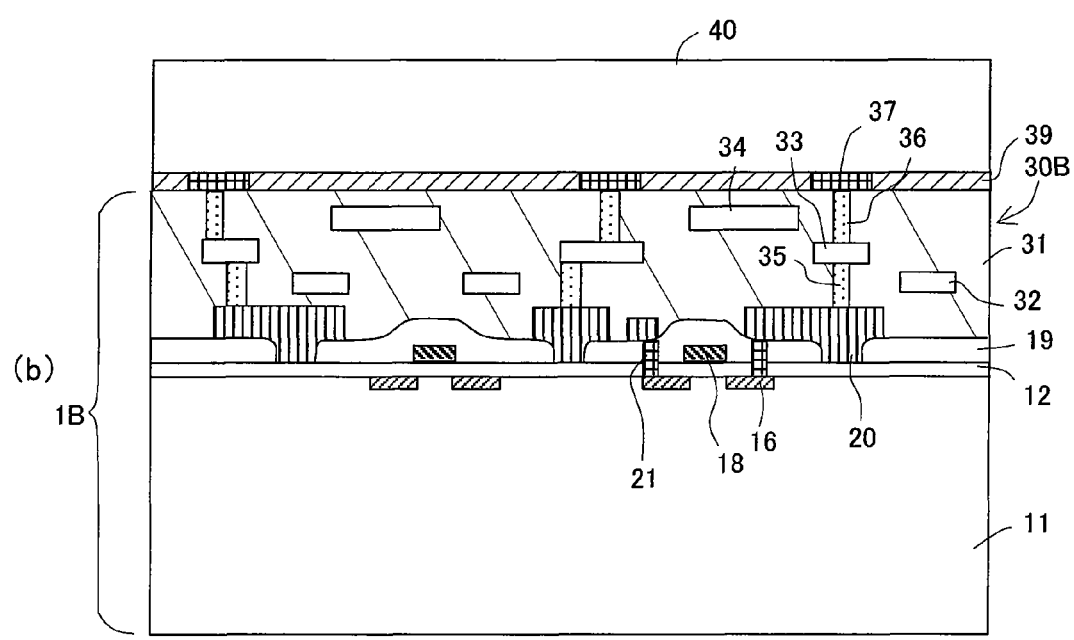
(b)

(FIG. 18)
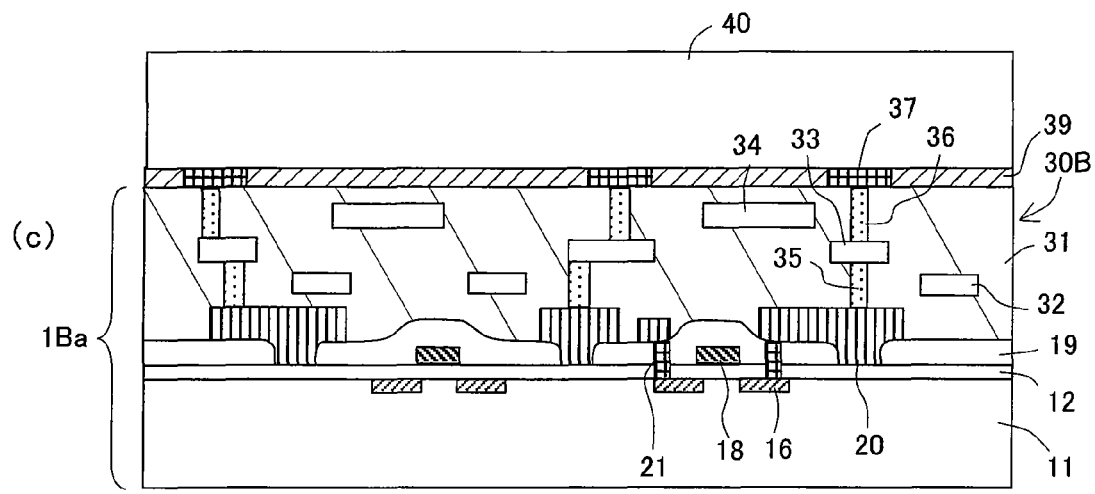
(c)
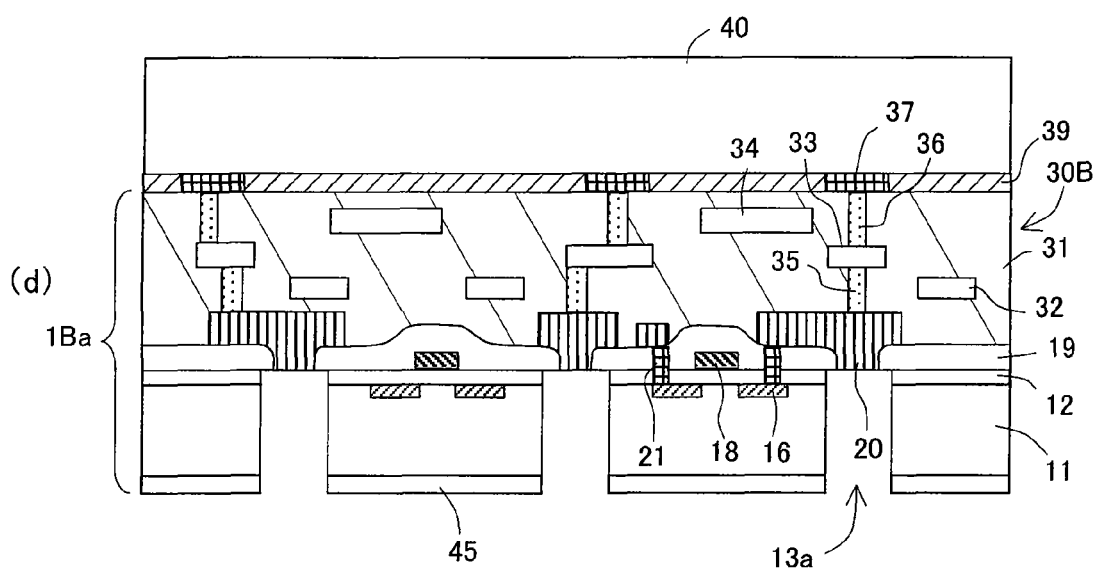
(d)

(FIG. 19)
(e)
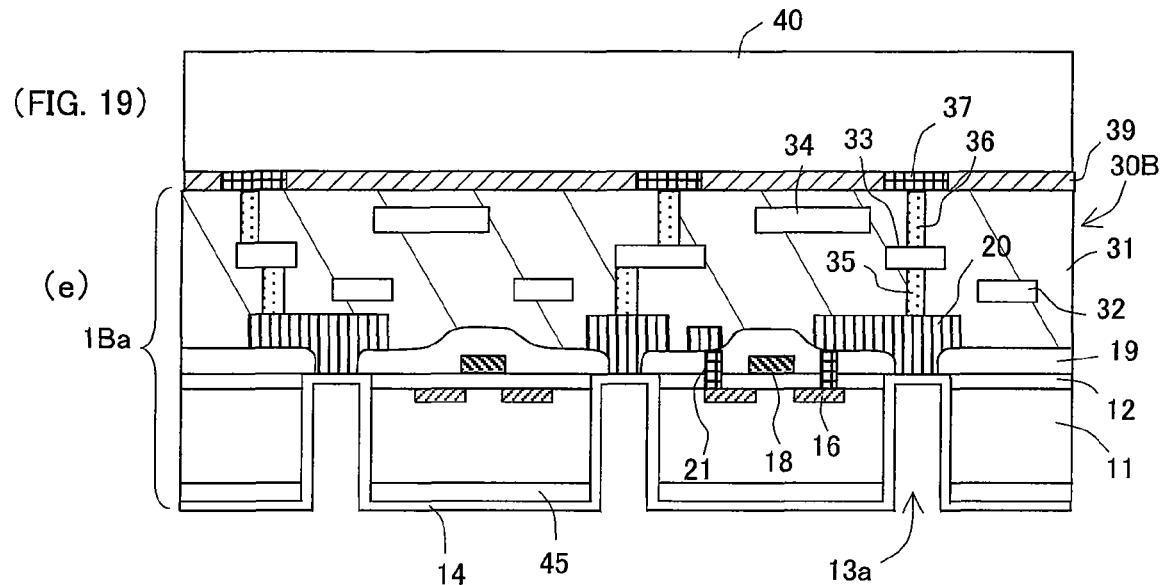
(f)
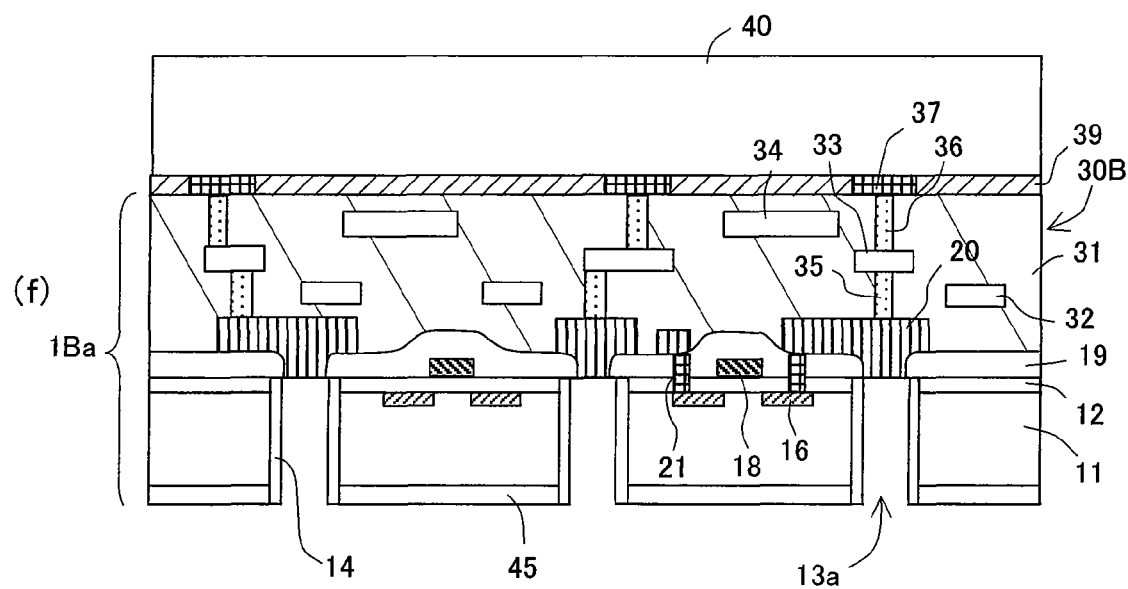

(FIG. 20)
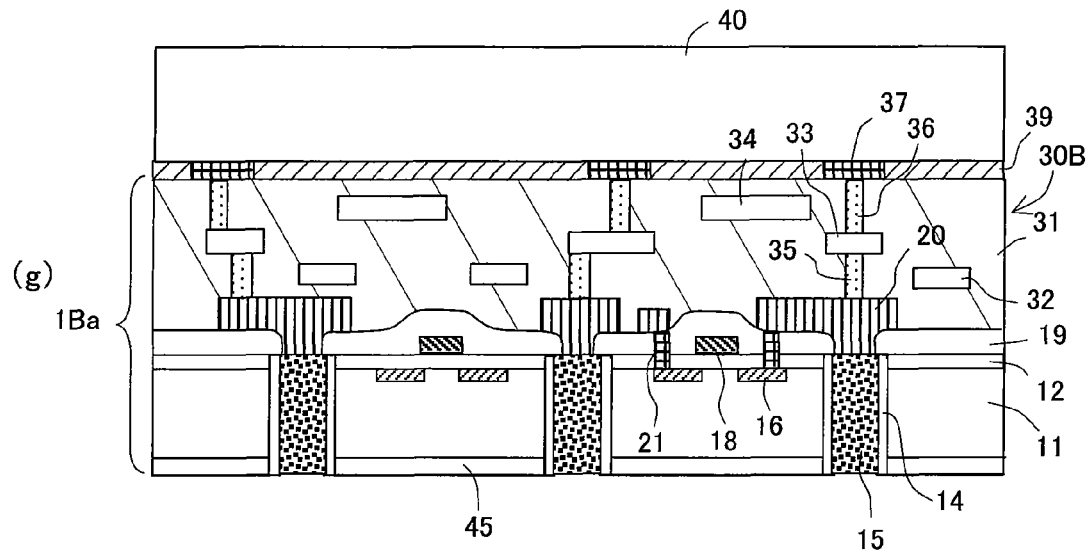
(g)
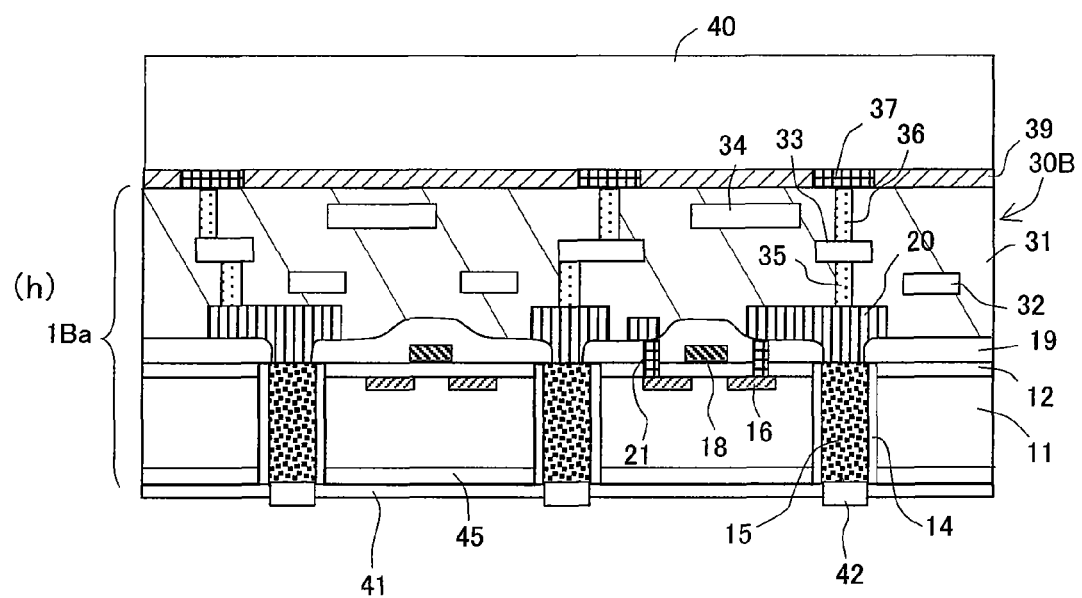
(h)

(FIG. 21)
(a) 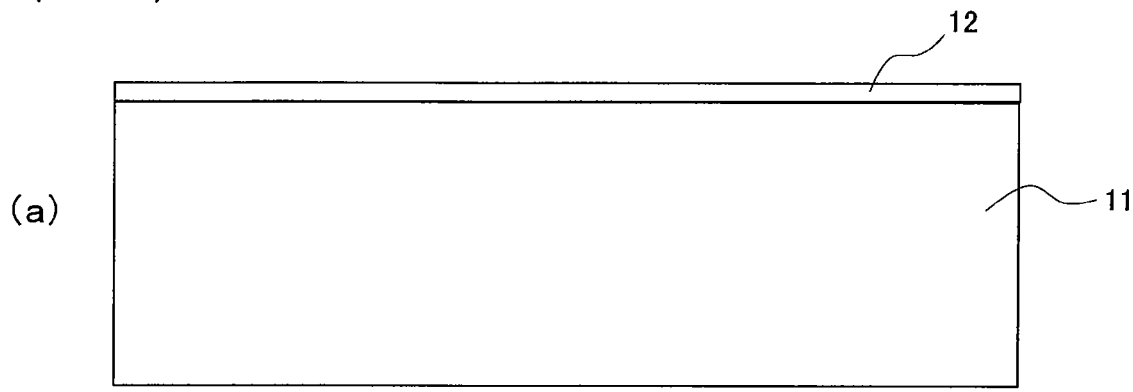
(b) 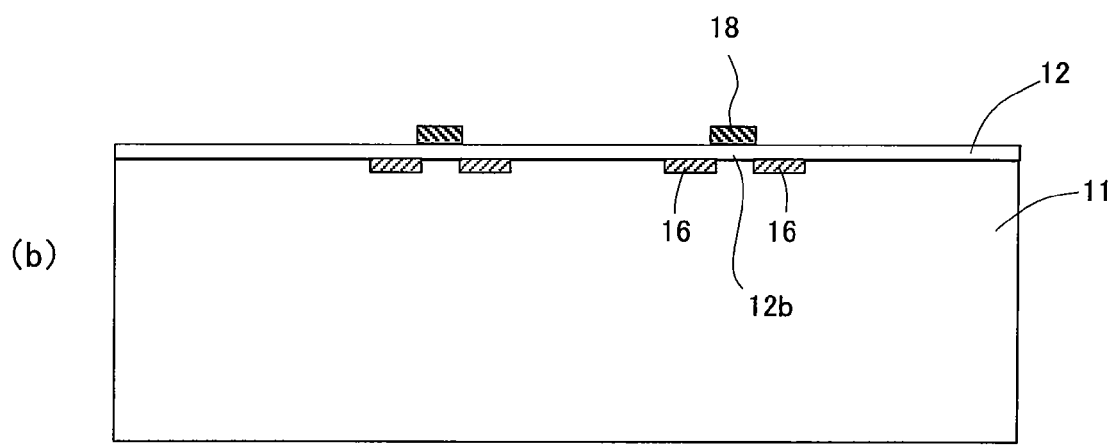
(c) 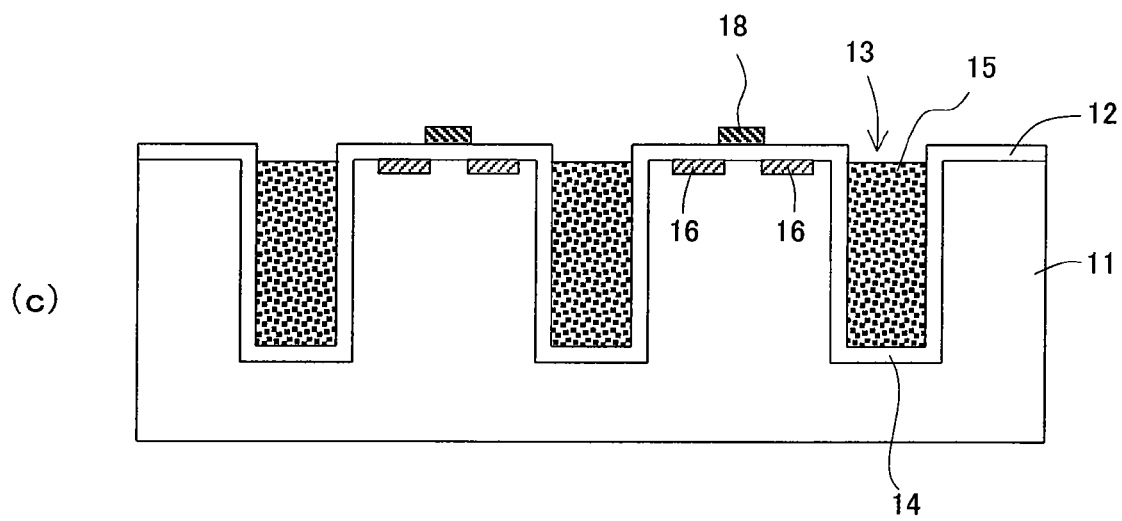

(FIG. 22)
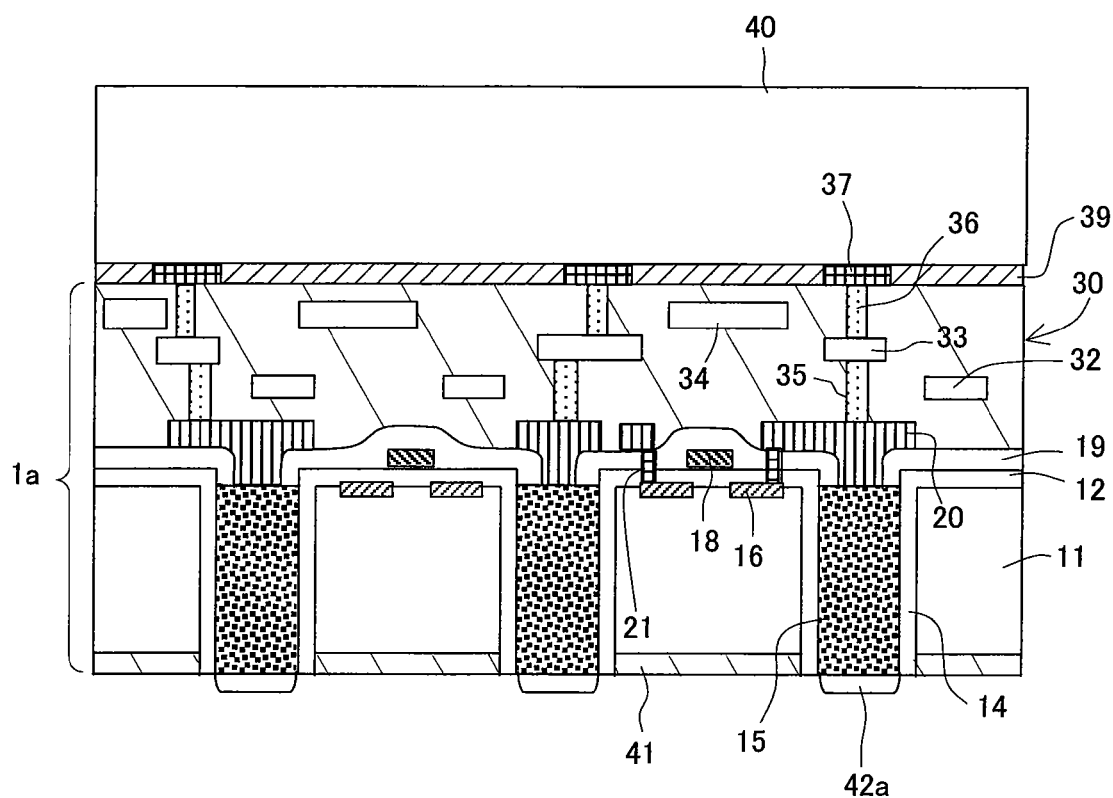

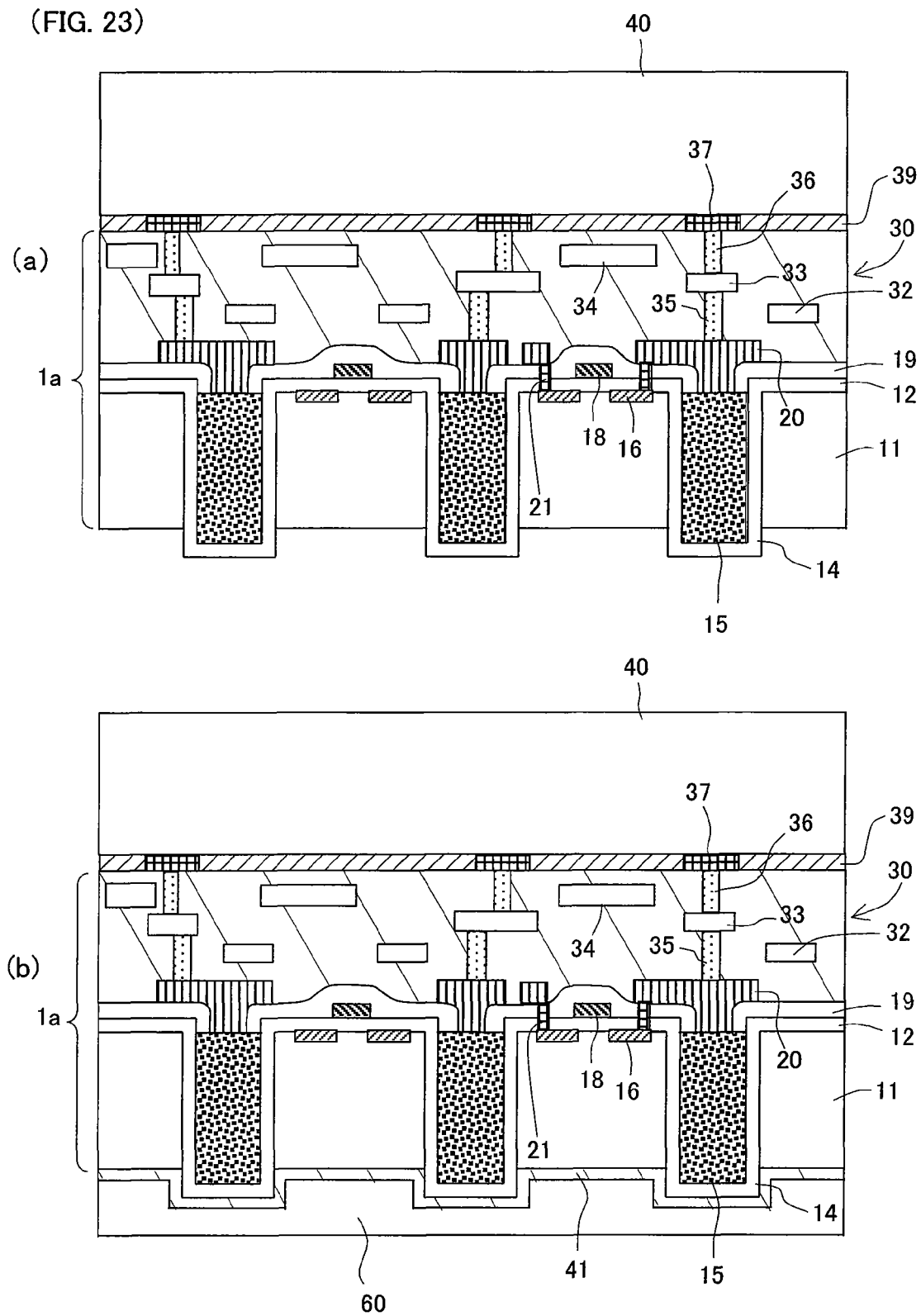
(FIG. 23)

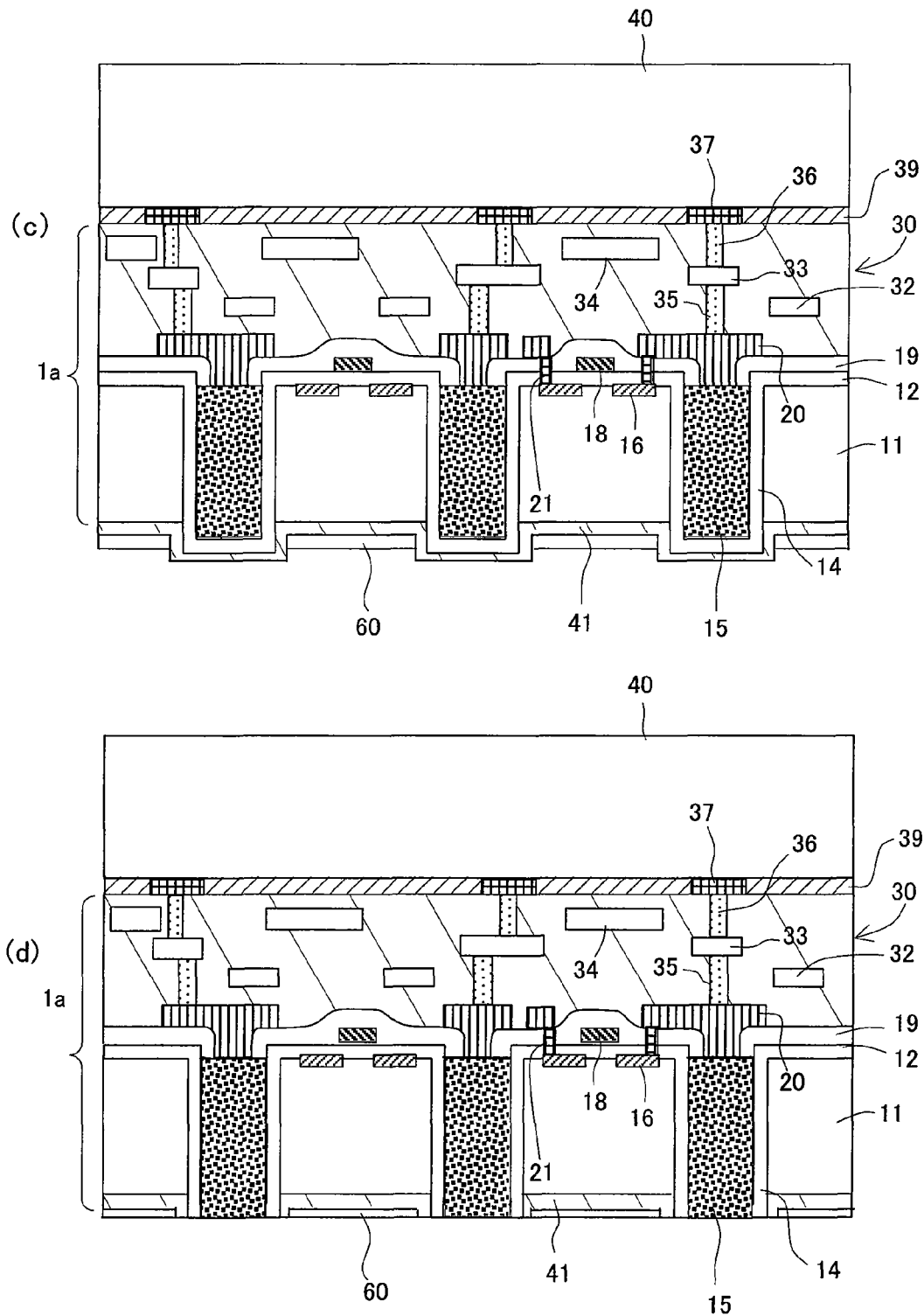
(FIG. 24)

(FIG. 25)
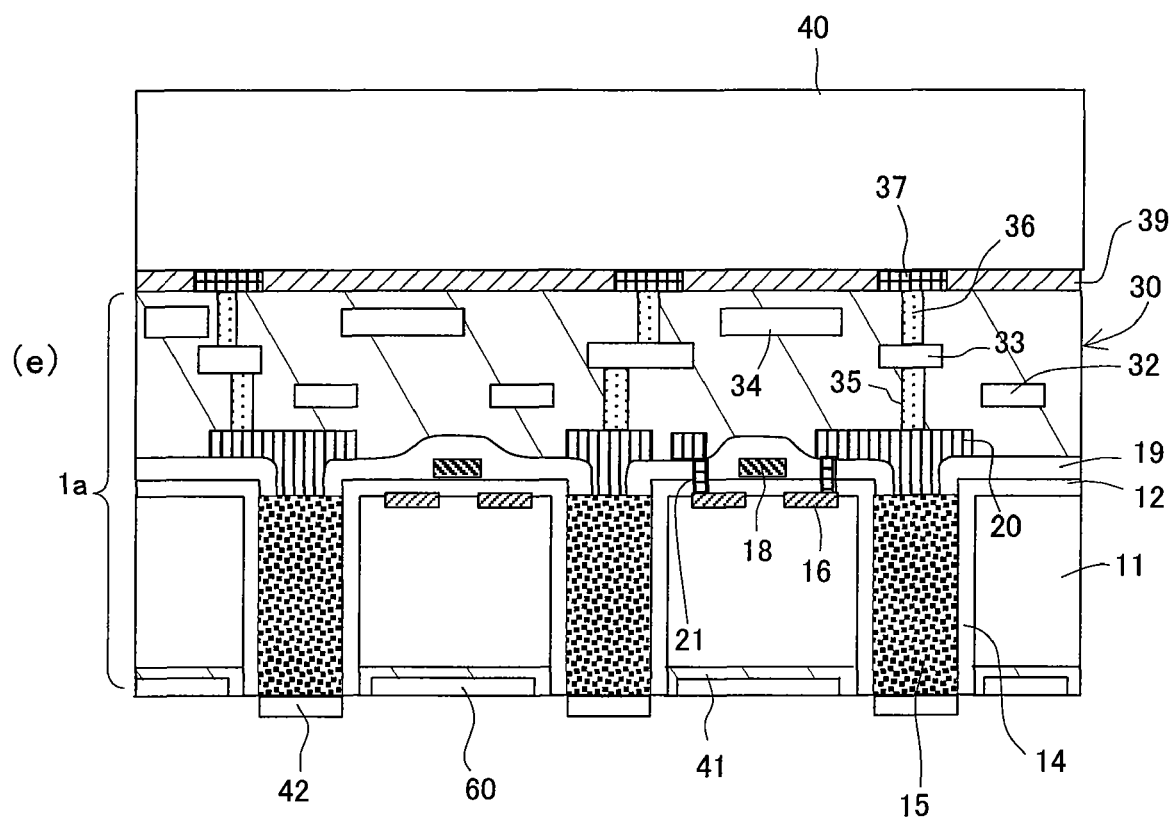

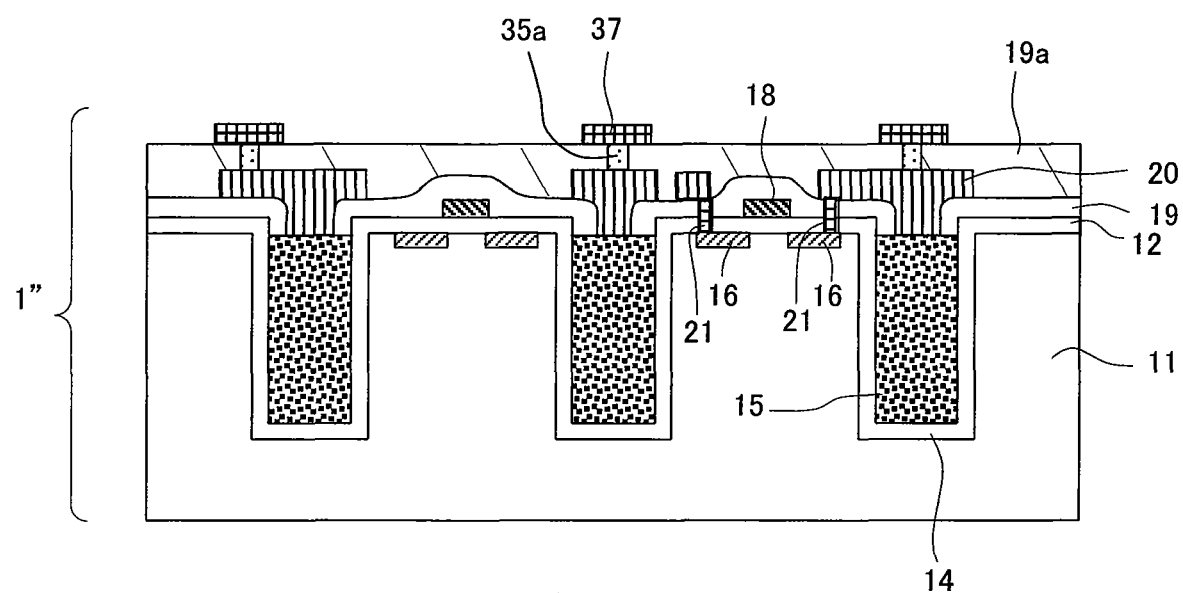
(FIG. 26)

METHOD OF FABRICATING SEMICONDUCTOR DEVICE HAVING THREE-DIMENSIONAL STACKED STRUCTURE

This is a National Phase Application in the United States of International Patent Application No. PCT/JP2005/015133 filed Aug. 19, 2005, which claims priority on Japanese Patent Application No. 2004-240944, filed Aug. 20, 2004. The entire disclosures of the above patent applications are hereby incorporated by reference.

TECHNICAL FIELD

The present invention relates to a method of fabricating a semiconductor device having a three-dimensional stacked structure formed by stacking semiconductor circuit layers with various functions (a three-dimensional stacked semiconductor device) and more particularly, to a method of fabricating a three-dimensional stacked semiconductor device including buried interconnections for vertical electrical connection between the stacked semiconductor layers (along the stacking direction). Here, "buried interconnections" have the meaning of interconnection lines for electrical connection along the stacking direction embedded in each of the semiconductor layers.

BACKGROUND ART

In recent years, semiconductor devices each having a three-dimensional structure formed by stacking semiconductor chips were announced. For example, Kurino et al. announced an "Intelligent Image Sensor Chip with Three-Dimensional Structure" in 1999 IEDM Technical Digest published in 1999 (see Non-Patent Document 1).

This image sensor chip has a four-layer structure, where a processor array and an output circuit are located in the first semiconductor circuit layer, data latches and masking circuits are located in the second semiconductor circuit layer, amplifiers and analog-to-digital converters are located in the third semiconductor circuit layer, and an image sensor array is located in the fourth semiconductor circuit layer. The uppermost surface of the image sensor array is covered with a quartz glass layer containing a microlens array. The microlens array is formed on the surface of the quartz glass layer. A photodiode is formed as the semiconductor light-receiving element in each image sensor of the image sensor array. The respective semiconductor circuit layers constituting the four-layer structure are mechanically connected to each other with adhesive, and are electrically connected to each other with buried interconnections using conductive plugs and microbump electrodes contacted with the interconnections.

With the image sensor chip, bonding wires are not used for electrical connection among the semiconductor circuit layers. Therefore, this image sensor chip is different from a three-dimensionally structured semiconductor device fabricated by stacking and unifying semiconductor chips on a support substrate, placing bonding wires around the stacked chips, and making electrical interconnection among the semiconductor chips with the bonding wires (such a semiconductor device is conventionally known, as seen from the Non-Patent Document 1).

Moreover, Lee et al. announced an image-processing chip comprising an image sensor similar to the above-described solid-state image sensor announced by Kurino et al. in Japan Journal of Applied Physics entitled "Development of Three-Dimensional Integration Technology for Highly Parallel Image-processing Chip" published in April 2000 (see Non-Patent Document 2).

The image-processing chip of Lee et al. has approximately the same configuration as the solid-stage imaging sensor announced by Kurino et al. in the above-described treatise.

With any one of the above-described image sensor chip and the image-processing chip each having the three-dimensional stacked structure, a plurality of semiconductor wafers (which may be termed simply "wafers" below), each of which includes desired built-in semiconductor circuits, are stacked and adhered to each other and thereafter, the wafer stack thus obtained is divided into a plurality of chips by cutting (dicing), resulting in the image sensor chips or the image-processing chips. In other words, semiconductor wafers in which sets of semiconductor circuits have been respectively formed are stacked and fixed on the wafer level to thereby realize the three-dimensional stacked structure and thereafter, the stacked structure is divided to form the image sensor chips or the image-processing chips.

In addition, with the conventional image sensor chip and the conventional image-processing chip, each of the stacked semiconductor circuits stacked in the chip constitutes the "semiconductor circuit layer".

Furthermore, a method of fabricating a semiconductor chip is disclosed in the Non-Patent Document 2. In this method, penetrating holes with ?-shaped structures whose relatively large parts and relatively small parts are respectively joined together are formed in a semiconductor substrate, where the ends of the relatively small parts are exposed to the first main surface of the substrate and the ends of the relatively large parts are exposed to the second main surface thereof. Next, the walls of the penetrating holes are covered with insulating films and then, the holes are filled with conductive material to form conductive plugs. Thereafter, a multilayer wiring structure is formed on the first main surface. It is described in the Non-Patent Document 2 that high integration level of devices, high fixing strength to the bumps and high reliability against thermal stress are obtained by this method.

Non-Patent Document 1: H. Kurino et al., "Intelligent Image Sensor Chip with Three-Dimensional Structure", 1999 IEDM Technical Digest, pp. 36.4.1-36.4.4, 1999

Non-Patent Document 2: K. Lee et al., "Development of Three-Dimensional Integration Technology for Highly Parallel Image-processing Chip", Jpn. J. of Appl. Phys., Vol. 39, pp. 2473-2477, April 2000

Patent Document 1: Japanese Non-Examined Patent Publication No. 2002-110902 (FIGS. 1 and 4)

Patent Document 2: Japanese Non-Examined Patent Publication No. 2004-14657 (FIGS. 1 to 9)

DISCLOSURE OF THE INVENTION

Problems to be Solved by the Invention

With the fabrication processes of the above-described conventional image sensor and image-processing chips each having the three-dimensional stacked structure, vertical (along the stacking direction) electrical interconnection between the respective semiconductor circuit layers (here, the semiconductor wafers) in the wafer stack (which is formed by stacking and unifying the semiconductor wafers) is carried out with the minute buried interconnections (or the conductive plugs) formed to penetrate through the respective semiconductor circuit layers along the stacking direction, and microbump electrodes fixed to the ends of the buried interconnections. However, concrete methods of forming the buried interconnections and the microbump electrodes are not disclosed. Since the buried interconnections and the microbump electrodes are not only as minute as several micrometers but also arranged closely, they cannot be realized easily. Thus, there is the need to provide a method of realizing highly reliable electrical connection along the stacking direction using such the buried interconnections and microbump electrodes as above.

Moreover, the semiconductor circuit layers (semiconductor wafers) in the wafer stack are generally constituted by sets of semiconductor elements formed in the surfaces of the semiconductor substrates that form the respective semiconductor circuit layers, and wiring structures formed over the semiconductor elements by way of intervening interlayer insulating films. For this reason, the buried interconnections (or the conductive plugs) need to be formed by the most suitable method in accordance with the layout of the semiconductor elements on the respective substrates, the layout of the wiring lines in the respective wiring structures, and the fabrication processes thereof. For example, there is a possibility that the buried interconnections (or the conductive plugs) penetrating through the wiring structure cannot be formed according to the layout of the wiring lines in the wiring structure. There is another possibility that the formation of the trenches for the buried interconnections is difficult or impossible from the surface side of the semiconductor substrate. Therefore, it is preferred that the buried interconnections can cope with such the restrictions.

These two demands are applicable to the case where a "chip stack" including semiconductor chips stacked and united is used instead of the "wafer stack" in the fabrication processes of the above-described conventional image sensor and image-processing chips each having the three-dimensional stacked structure.

With the method of fabricating the semiconductor chip disclosed in the above-described Patent Document 2, since the penetrating holes having the joined ?-shaped structures whose relatively large parts and relatively small parts are respectively joined together need to be formed in the semiconductor substrate, there is a disadvantage that each of the mask formation process and the etching process needs to be carried out twice in order to form the penetrating holes.

The present invention was created in consideration of these points and its object is to provide a method of fabricating a semiconductor device having a three-dimensional stacked structure that makes it possible to realize easily the electrical interconnection between the stacked semiconductor circuit layers along the stacking direction with buried interconnections.

Another object of the present invention is to provide a method of fabricating a semiconductor device having a three-dimensional stacked structure that makes it possible to form optimum buried interconnections for the electrical interconnection responsive to the restrictions due to the layout of the elements and/or circuits in the respective semiconductor circuit layers stacked (if the semiconductor circuit layer has a wiring structure, the layout of the wiring lines in the wiring structure is included, in addition to the layout of the respective elements and/or circuits).

The other objects not specifically mentioned here will become clear from the following description and attached drawings.

Means for Solving the Problems (1) As shown in one embodiment of the invention, a method of fabricating a semiconductor device having a three-dimensional stacked structure according to a first aspect of the present invention is provided, which is a method of fabricating a semiconductor device having a three-dimensional stacked structure formed by stacking semiconductor circuit layers on a support substrate, comprises the steps of:

forming a trench in a semiconductor substrate that constitutes one of the semiconductor circuit layers from a surface side of the semiconductor substrate, an inner wall face of the trench being covered with a first insulating film;

filling an inside of the trench with a conductive material from the surface side of the semiconductor substrate, thereby forming a conductive plug;

forming a desired element or circuit, from the surface side of the semiconductor substrate, in an inside or on a surface of the semiconductor substrate where the conductive plug has been formed;

covering the surface of the semiconductor substrate where the element or circuit has been formed with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing the semiconductor substrate which has been fixed to the support substrate or the remaining one of the semiconductor circuit layers from a back side of the semiconductor substrate, thereby exposing the first insulating film to the back side of the semiconductor substrate; and selectively removing the first insulating film which has been exposed to the back side of the semiconductor substrate, thereby exposing the conductive plug to the back side of the semiconductor substrate.

(2) With the method of fabricating a semiconductor device having a three-dimensional stacked structure according to the first aspect of the present invention, as explained above, first, the trench is formed in the semiconductor substrate that constitutes one of the semiconductor circuit layers from the surface side of the semiconductor substrate, where the inner wall face of the trench is covered with the first insulating film. The inside of the trench is then filled with the conductive material from the surface side of the semiconductor substrate, thereby forming the conductive plug. Next, from the surface side of the semiconductor substrate, the desired element or circuit is formed in the inside or on the surface of the semiconductor substrate where the conductive plug has been formed. Then, the surface of the semiconductor substrate where the element or circuit has been formed is covered with the second insulating film. Thereafter, the semiconductor substrate is fixed to the support substrate or the remaining one of the semiconductor circuit layers by joining the second insulating film to the support substrate or the remaining one of the semiconductor circuit layers directly or indirectly through the wiring structure. Subsequently, the semiconductor substrate that has been fixed to the support substrate or the remaining one of the semiconductor circuit layers is selectively removed from the back side of the semiconductor substrate, thereby exposing the first insulating film to the back side of the semiconductor substrate. Following this, the first insulating film that has been exposed to the back side of the semiconductor substrate is selectively removed, thereby exposing the conductive plug to the back side of the semiconductor substrate.

Each of these steps can be performed by using a known process or processes (e.g., a CVD, isotropic etching, mechanical polishing, or CMP process). Moreover, the electrical connection between the support substrate or the remaining one of the semiconductor circuit layers and the conductive plug exposed to the back side of the semiconductor substrate can be realized by utilizing a wiring line or lines formed on the surface of the semiconductor substrate (if the semiconductor substrate includes a wiring structure, by utilizing a wiring line or lines in the wiring structure and a wiring line or lines formed on the surface of the semiconductor substrate). Furthermore, the wiring line or lines formed on the surface of the semiconductor substrate (if the wiring structure exists, the wiring line or lines in the wiring structure and the wiring line or lines formed on the surface of the semiconductor substrate) and the conductive plug in the trench will be a "buried interconnection" that penetrates through the semiconductor circuit layer along the stacking direction. Accordingly, the electrical connection between the stacked semiconductor circuit layers along the stacking direction can be realized easily with the buried interconnection.

Besides, with the method of fabricating a semiconductor device according to the first aspect of the present invention, the formation of the trench and the filling of the conductive material are carried out from the surface side of the semiconductor substrate, and the trench does not penetrate through the second insulating film (if the wiring structure exists, the trench does not penetrates through the second insulating film and the wiring structure). Therefore, this fabrication method is preferably applicable to the case where the formation of the trench and the filling of the conductive material is impossible from the back side of the semiconductor substrate, or the case where the formation of the trench that penetrates through the second insulating film (if the wiring structure exists, the formation of the trench that penetrates through the second insulating film and the wiring structure) is impossible or difficult. In other words, an optimum buried interconnection for the electrical connection can be formed responsive to the restrictions due to the layout of the elements and circuits in the semiconductor circuit layers (if the semiconductor circuit layer has the wiring structure, the layout of the wiring lines in the wiring structure is included, in addition to the layout of the elements and circuits).

In addition, in the step of fixing the semiconductor substrate to the support substrate or the remaining one of the semiconductor substrates, a first electrode or electrodes may be used. In this case, the first electrode or electrodes is/are disposed on at least one of the second insulating film or the wiring structure and the support substrate or the remaining one of the semiconductor circuit layers. The semiconductor substrate is fixed to the support substrate or the remaining one of the semiconductor circuit layers with the first electrode or electrodes.

(3) In the method of fabricating a semiconductor device according to the first aspect of the invention, it is sufficient that the "support substrate" has a rigidity enough for supporting the semiconductor circuit layers. The material of the "support substrate" is optional; for example, semiconductor, glass, or other material may be used. A semiconductor substrate in which circuits are formed, i.e., a so-called LSI wafer, may be used for this purpose.

The "semiconductor circuit layer" means a layer of a semiconductor circuit or circuits, in other words, a layer-shaped semiconductor circuit. Therefore, it is sufficient that the "semiconductor circuit layer" comprises the "semiconductor substrate", and the "element(s)" or "circuit(s)" formed in the semiconductor substrate or on the surface thereof. The other structure of the "semiconductor circuit layer" is optional.

Although some type of "circuit(s)" (e.g., amplification circuit, signal processing circuit, or integrated circuit providing a predetermined function) is (are) usually formed in the "semiconductor substrate" or on the surface thereof, only some type of "element(s)" (e.g., light-receiving element) may be formed. For example, many "light-receiving elements" alone, which are arranged in an array, may be formed in the "semiconductor substrate" or on the surface thereof. As the "element", any one of active elements such as a transistor and passive elements such as a resister may be used. As the "active element", a Metal-Oxide-Semiconductor Field-Effect Transistor (MOSFET) is typically used in consideration of reducing the occupation area or the like. However, any other type of the transistor than the MOSFET, a diode, or the like may be used. As the "passive element", for example, a resister, a capacitor, or the like may be used.

The "semiconductor substrate" may be formed by a single semiconductor member (e.g., a semiconductor wafer or a semiconductor chip) or a plurality of semiconductor members (e.g., semiconductor wafers or semiconductor chips). No limitation is applied to the physical dimensions of the "semiconductor substrate". Specifically, any one of the size of a semiconductor wafer (i.e., a wafer size), the size of a chip (i.e., a chip size) obtained by dividing a semiconductor wafer, an intermediate size between the wafer size and the chip size, and a size larger than the wafer size may be used for the "semiconductor substrate". The material of the "semiconductor substrate" is optional and therefore, silicon, a compound semiconductor, or other type of semiconductor may be used if it can make a desired semiconductor element or elements or a desired circuit or circuits. Since the structure of the "semiconductor substrate" also is optional, a simple plate made of semiconductor or a so-called SOI (Silicon On Insulator) substrate may be used.

It is sufficient for the "trench" to have a desired depth and to receive the conductive material to be the buried interconnection. The structure of the "trench" is optional. The depth of the "trench", the shape and size of the opening of the "trench", the cross-sectional shape of the "trench", and so on may be optionally set according to the necessity. Any formation method may be used for the "trench" if it can remove selectively the semiconductor substrate from its surface side to thereby form the "trench". An anisotropic etching method using a mask may be preferably used for this purpose.

Any insulating film may be used for the "first insulating film" that covers the inner wall face of the trench if it can provide electrical insulation between the "semiconductor substrate" of the semiconductor circuit layer and the "conductive material" embedded in the trench. Silicon dioxide ($SiO_2$), silicon nitride ($SiN_x$) or the like may be preferably used for this purpose. The formation method of the "first insulating film" is optional.

Any material may be used for the "conductive material" embedded in the trench if it can be used as the conductive plug (i.e., the buried interconnection). For example, a semiconductor such as polysilicon or a metal such as tungsten (W), copper (Cu), or aluminum (Al) may be preferably used for this purpose. Any method may be used for the filling method of the "conductive material" if it can fill the trench with the conductive material from the surface side of the semiconductor substrate.

Any insulating film may be used for the "second insulating film" if it can cover the surface of the "semiconductor substrate" where the element or circuit has been formed to provide electrical insulation between the surface and the adjoining parts of the surface. Silicon dioxide ($SiO_2$), silicon nitride ($SiN_x$) or the like may be preferably used for this purpose. The formation method of the "second insulating film" is optional.

It is sufficient for the "first electrode" to be disposed on at least one of the second insulating film or the wiring structure and the support substrate or the remaining one of the semiconductor circuit layers. The structure and shape of the "first electrode" are optionally selectable. Preferably, the "first electrode" is formed directly on the second insulating film or indirectly over the second insulating film through the wiring structure, where the structure and shape of the "first electrode" are optionally selectable. Usually, the "first electrode" is formed to protrude from the surface of the second insulating film (if the semiconductor circuit layer has the wiring structure, the "first electrode" is formed to protrude from the surface of the wiring structure); however, the "first electrode" may not protrude from the surface. It is sufficient for the "first electrode" to provide electrical interconnection with the support substrate or the remaining one of the semiconductor circuit layers. Any material may be used for the "first substrate" if it has a conductivity applicable to the electrical interconnection with the outside using the conductive plug in the trench. The "first electrode" may be formed by fixing a piece of conductive material that has been formed separately to the surface of the second insulating film or the surface of the wiring structure (or, an opposite surface of the support substrate or the remaining one of the semiconductor circuit layers), or by directly depositing a conductive material on the surface of the second insulating film or the surface of the wiring structure (or, an opposite surface of the support substrate or the remaining one of the semiconductor circuit layers) by a plating method or the like. The "first electrode" may be formed by utilizing the wiring line(s) formed on the surface of the semiconductor substrate and covered with the second insulating film, the wiring line(s) formed in the wiring structure, or the wiring line(s) formed on the opposite surface of the support substrate or the remaining one of the semiconductor circuit layers.

The material, structure, and function of the "wiring structure" are optional. The "wiring structure" may have a single or multiple layer structure. Usually, the "wiring structure" is formed by one or more patterned metal wiring films and one or more insulating films; however, the concrete structure of the "wiring structure" may be optionally selected according to the necessity. The "wiring structure" may include an electrode or electrodes for electrical connection with the support substrate or the remaining one of the semiconductor circuit layers in addition to the first electrode used for the electrical connection along the stacking direction.

No limitation is applied to the method for performing the "step of fixing the semiconductor substrate to the support substrate or the remaining one of the semiconductor circuit layers by joining the second insulating film to the support substrate or the remaining one of the semiconductor circuit layers directly or indirectly through the wiring structure".

No limitation is applied to the method for performing the "step of fixing the semiconductor substrate to the support substrate or the remaining one of the semiconductor circuit layers with the first electrode" as well. Typically, the first electrode is bonded to the support substrate or the remaining one of the semiconductor circuit layers by welding, or pressurization under heat or at room temperature, where an adhesive is used together. However, any other method may be used for this purpose. If welding and direct bonding under pressure cannot be used, the bonding is carried out while placing an appropriate bonding metal (e.g., In, Au, Ag, Sn, Cu, Al, or W, or an alloy of two or more of these metals, or stacked films made of two or more of these metals and alloys) therebetween.

No limitation is applied to the method for performing the "step of selectively removing the semiconductor substrate which has been fixed to the support substrate or the remaining one of the semiconductor circuit layers from the back side of the substrate, thereby exposing the first insulating film to the back side of the semiconductor substrate". Typically, an isotropic etching method, an anisotropic etching method, or a CMP method using a mask is used. A mechanical polishing method may be used together.

No limitation is applied to the method for performing the "step of selectively removing the first insulating film which has been exposed to the back side of the semiconductor substrate, thereby exposing the conductive plug to the back side of the semiconductor substrate". Typically, an isotropic etching method, an anisotropic etching method, or a CMP method using a mask is used.

(4) In a preferred embodiment of the method according to the first aspect of the invention, the semiconductor circuit layer comprises a wiring structure formed on the second insulating film in addition to the element or circuit, and the first electrode is formed indirectly over the second insulating film through the wiring structure. In this embodiment, there is an advantage that an optimum buried interconnection for the electrical interconnection can be formed responsive to the restrictions due to not only the layout of the element or circuit in the semiconductor circuit layer but also the layout of the wiring line(s) in the wiring structure.

In another preferred embodiment of the method according to the first aspect of the invention, a step of forming a third insulating film that covers the back of the semiconductor substrate is additionally provided between the step of exposing the first insulating film to the back side of the semiconductor substrate and the step of exposing the conductive plug to the back side of the semiconductor substrate. In the step of exposing the conductive plug, the third insulating film is selectively removed along with the first insulating film. In this embodiment, there is an advantage that electrical insulation of the back of the semiconductor substrate can be ensured, because the back of the semiconductor substrate is covered with the remaining third insulating film after the step of exposing the conductive plug is completed.

In still another preferred embodiment of the method according to the first aspect of the invention, a step of forming a third insulating film that covers the back of the semiconductor substrate, a step of forming a planarization film on the third insulating film, and a step of selectively removing the planarization film are additionally provided between the step of exposing the first insulating film to the back side of the semiconductor substrate and the step of exposing the conductive plug to the back side of the semiconductor substrate. In the step of exposing the conductive plug, the third insulating film and the remaining planarization film are selectively removed along with the first insulating film. In this embodiment, there is an advantage that electrical insulation of the back of the semiconductor substrate can be ensured, because the back of the semiconductor substrate is covered with the remaining third insulating film after the step of exposing the conductive plug is completed. Moreover, there is another advantage that the conductive plug can be used as a bump electrode, because the conductive plug is formed to protrude from the back of the semiconductor substrate.

In a further preferred embodiment of the method according to the first aspect of the invention, a step of forming a second electrode on an end of the conductive plug that has been exposed to the back side of the semiconductor substrate is additionally provided. The second electrode is used for a bump electrode. In the step of forming the second electrode, a piece of conductive material formed separately may be fixed onto the end of the conductive plug or a conductive material may be directly deposited onto the end of the conductive plug by a plating method or the like. However, the end of the conductive plug itself may be used as the second electrode.

In a still further preferred embodiment of the method according to the first aspect of the invention, the semiconductor substrate is formed by a single semiconductor member or a plurality of semiconductor members.

(5) With a method of fabricating a semiconductor device having a three-dimensional stacked structure according to a second aspect of the present invention, unlike the above-described method according to the first aspect of the present invention, a conductive plug (buried interconnection) is formed to penetrate through a first insulating film that covers a surface of a semiconductor substrate constituting one of semiconductor circuit layers (if the semiconductor substrate includes a wiring structure, the conductive plug is formed to penetrate through the first insulating film and the wiring structure).

Specifically, as shown in another embodiment of the invention, the method according to the second aspect of the invention is provided, which is a method of fabricating a semiconductor device having a three-dimensional stacked structure formed by stacking semiconductor circuit layers on a support substrate, comprises the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

forming a trench from the surface side of the semiconductor substrate, the trench penetrating through the first insulating film to reach the inside of the semiconductor substrate, and an inner wall face of the trench being covered with a second insulating film;

filling an inside of the trench with a conductive material from the surface side of the semiconductor substrate, thereby forming a conductive plug;

fixing the semiconductor substrate to the support substrate or a remaining one of the semiconductor circuit layers by using a first electrode disposed on a corresponding position to an end of the conductive plug on the surface side of the semiconductor substrate;

selectively removing the semiconductor substrate, which has been fixed to the support substrate or the remaining one of the semiconductor circuit layers, from a back side of the semiconductor substrate, thereby exposing the second insulating film to the back side of the semiconductor substrate; and selectively removing the second insulating film which has been exposed to the back side of the semiconductor substrate, thereby exposing the conductive plug to the back side of the semiconductor substrate.

(6) With the method of fabricating a semiconductor device having a three-dimensional stacked structure according to the second aspect of the present invention, as explained above, first, the desired element or circuit is formed, from the surface side of the semiconductor substrate, in the inside or on the surface of the semiconductor substrate that constitutes one of the semiconductor circuit layers. Then, the surface of the semiconductor substrate is covered with the first insulating film. Next, the trench is formed from the surface side of the semiconductor substrate, where the trench penetrates through the first insulating film to reach the inside of the semiconductor substrate, and the inner wall face of the trench is covered with the second insulating film. Further, the conductive plug is formed in the inside of the trench from the surface side of the semiconductor substrate and thereafter, the semiconductor substrate is fixed to the support substrate or the remaining one of the semiconductor circuit layers by using the first electrode disposed on the corresponding position to the end of the conductive plug on the surface side of the semiconductor substrate. Subsequently, the semiconductor substrate, which has been fixed to the support substrate or the remaining one of the semiconductor circuit layers, is selectively removed from the back side of the semiconductor substrate, thereby exposing the second insulating film to the back side of the semiconductor substrate. Following this, the second insulating film, which has been exposed to the back side of the semiconductor substrate, is selectively removed, thereby exposing the conductive plug to the back side of the semiconductor substrate.

Each of these steps can be performed by using a known process or processes (e.g., a CVD, isotropic etching, mechanical polishing, or CMP process). Moreover, since the trench penetrates through the first insulating film to reach the inside of the semiconductor substrate, the conductive plug in the trench will be a "buried interconnection" that penetrates through the semiconductor circuit layer along the stacking direction. Therefore, the electrical interconnection between the stacked semiconductor circuit layers along the stacking direction can be easily realized by using the buried interconnection and the first electrode.

Besides, with the method of fabricating a semiconductor device according to the second aspect of the present invention, the formation of the trench and the filling of the conductive material are carried out from the surface side of the semiconductor substrate, and the trench penetrates through the first insulating film to reach the inside of the semiconductor substrate. Therefore, this fabrication method is preferably applicable to a case where the formation of the trench that penetrates through the first insulating film to reach the inside of the semiconductor substrate is possible. In other words, an optimum buried interconnection for the electrical interconnection can be formed responsive to the restrictions due to the layout of the element or circuit in the semiconductor circuit layer (if the semiconductor circuit layer has the wiring structure, the layout of the wiring lines in the wiring structure is included, in addition to the layout of the element or circuit).

(7) In the method of fabricating a semiconductor device according to the second aspect of the invention, the meanings of the "support substrate", the "semiconductor circuit layer", the "semiconductor substrate", the "circuit", the "element", and the "conductive material" filled in the inside of the trench are the same as those in the method of fabricating a semiconductor device according to the first aspect of the invention, respectively.

Any insulating film may be used for the "first insulating film" if it can cover the surface of the "semiconductor substrate" where the element or circuit has been formed to thereby provide electrical insulation of the surface from the adjoining parts thereof. Silicon dioxide ($SiO_2$), silicon nitride ($SiN_x$) or the like may be preferably used for this purpose. The formation method of the "first insulating film" is optional.

It is sufficient for the "trench" to have a desired depth and to receive the conductive plug for the buried interconnection if it penetrates through the first insulating film (if the semiconductor circuit layer has a wiring structure, it penetrates through the first insulating film and the wiring structure) to reach the inside of the semiconductor substrate, and its inner wall face is covered with the second insulating film. The structure of the "trench" is optional. The depth of the "trench", the shape and size of the opening thereof, the cross-sectional shape thereof, and so on may be optionally set according to the necessity. Any formation method is applicable to the "trench" if it can form the trench by penetrating through the first insulating film and removing selectively the semiconductor substrate from its surface side (if the semiconductor circuit layer has the wiring structure, by penetrating through the first insulating film and the wiring structure). An anisotropic etching method using a mask may be preferably used for this purpose.

Any insulating film may be used for the "second insulating film" that covers the inner wall face of the trench if it can provide electrical insulation between the "semiconductor substrate" of the semiconductor circuit layer and the "conductive material" filled in the trench. Silicon dioxide ($SiO_2$), silicon nitride ($SiN_x$) or the like may be used for this purpose. The formation method of the "second insulating film" is optional.

The "first electrode" disposed on the corresponding position to the end of the conductive plug on the surface side of the semiconductor substrate may have any structure and shape. Usually, the "first electrode" is formed to protrude from the surface of the wiring structure; however, the "first electrode" may not be formed to protrude from the surface. The "first electrode" may be formed at a corresponding position of the support substrate or the remaining one of the semiconductor circuit layers to the conductive plug. In summary, it is sufficient that the "first electrode" provides electrical connection to the support substrate or the remaining one of the semiconductor circuit layers. Any material may be used for the "first substrate" if it has conductivity applicable to the electrical connection to the outside using the conductive plug in the trench. The "first electrode" may be formed by fixing a piece of conductive material formed separately to the end of the conductive plug, or by directly depositing a conductive material on the end of the conductive plug by a plating method or the like. The first electrode may be formed by utilizing the conductive plug. The first electrode may be formed on the support substrate or the remaining one of the semiconductor circuit layers, not on the end of the conductive plug, using one of these methods.

No limitation is applied to the method for performing the "step of fixing the semiconductor substrate to the support substrate or the remaining one of the semiconductor circuit layers by using the first electrode disposed on the corresponding position to the end of the conductive plug on the surface side of the semiconductor substrate". Typically, the first electrode is bonded to the support substrate or the remaining one of the semiconductor circuit layers by welding, or pressurization under heat or at room temperature, where an adhesive is used together. However, any other method may be used for this purpose. If welding or direct bonding with pressurization cannot be used, the bonding may be carried out while placing an appropriate bonding metal as shown in the method of fabricating a semiconductor device according to the first aspect of the invention between them.

Similar to the method of fabricating a semiconductor device according to the first aspect of the invention, no limitation is applied to the method for performing the "step of selectively removing the semiconductor substrate, which has been fixed to the support substrate or the remaining one of the semiconductor circuit layers, from the back side of the semiconductor substrate, thereby exposing the second insulating film to the back side of the semiconductor substrate". Typically, an isotropic etching method, an anisotropic etching method, or a CMP method using a mask is used. A mechanical polishing method may be used together.

Similar to the method of fabricating a semiconductor device according to the first aspect of the invention, no limitation is applied to the method for performing the "step of selectively removing the second insulating film which has been exposed to the back side of the semiconductor substrate, thereby exposing the conductive plug to the back side of the semiconductor substrate". Typically, an isotropic etching method, an anisotropic etching method, or a CMP method using a mask is used.

(8) In a preferred embodiment of the method according to the second aspect of the invention, the semiconductor circuit layer comprises a wiring structure formed on the first insulating film in addition to the element or circuit, and the trench is formed to penetrate through the first insulating film and the wiring structure. In this embodiment, there is an advantage that an optimum buried interconnection for the electrical connection can be formed responsive to the restrictions due to not only the layout of the element or circuit in the semiconductor circuit layer but also the layout of the wiring line in the wiring structure.

The material, structure, and function of the "wiring structure" are optional. The "wiring structure" may have a single or multiple layer structure. Usually, the "wiring structure" is formed by using one or more patterned metal wiring films and one or more insulating films; however, the concrete structure of the "wiring structure" may be optionally selected according to the necessity. The "wiring structure" may include an electrode for electrical connection to the support substrate or the remaining one of the semiconductor circuit layers in addition to the first electrode used for the electrical interconnection along the stacking direction.

In another preferred embodiment of the method according to the second aspect of the invention, a step of forming a third insulating film that covers the back of the semiconductor substrate is additionally provided between the step of exposing the second insulating film to the back side of the semiconductor substrate and the step of exposing the conductive plug to the back side of the semiconductor substrate. In the step of exposing the conductive plug, the third insulating film is selectively removed along with the second insulating film that covers the wall face of the trench. In this embodiment, there is an advantage that electrical insulation of the back of the semiconductor substrate can be ensured, because the back of the semiconductor substrate is covered with the remaining third insulating film after the step of exposing the conductive plug is completed.

In still another preferred embodiment of the method according to the second aspect of the invention, a step of forming a third insulating film that covers the back of the semiconductor substrate, a step of forming a planarization film on the third insulating film, and a step of selectively removing the planarization film are additionally provided between the step of exposing the second insulating film to the back side of the semiconductor substrate and the step of exposing the conductive plug to the back side of the semiconductor substrate. In the step of exposing the conductive plug, the third insulating film and the remaining planarization film are selectively removed along with the second insulating film. In this embodiment, there is an advantage that electrical insulation of the back of the semiconductor substrate can be ensured, because the back of the semiconductor substrate is covered with the remaining third insulating film after the step of exposing the conductive plug is completed. Moreover, there is another advantage that the conductive plug can be used as a bump electrode, because the conductive plug is formed to protrude from the back of the semiconductor substrate.

In a further preferred embodiment of the method according to the second aspect of the invention, a step of forming a second electrode on an end of the conductive plug which has been exposed to the back side of the semiconductor substrate is additionally provided. The second electrode is used as a bump electrode. In the step of forming the second electrode, a piece of conductive material formed separately may be fixed onto the end of the conductive plug, or a conductive material may be directly deposited onto the end of the conductive plug by a plating method or the like. However, the end of the conductive plug itself, which has been exposed to the back side of the semiconductor substrate, may be used as the second electrode.

In a still further preferred embodiment of the method according to the second aspect of the invention, the semiconductor substrate is formed by a single semiconductor member or a plurality of semiconductor members.

(9) With a method of fabricating a semiconductor device having a three-dimensional stacked structure according to a third aspect of the present invention, unlike the above-described methods according to the first and second aspects, a trench is formed from a back side of a semiconductor substrate that constitutes one of semiconductor circuit layers, and the inside of the trench is filled with a conductive material from the back side of the semiconductor substrate, thereby forming a conductive plug (a buried interconnection).

Specifically, as shown in yet another embodiment of the invention, the method according to the third aspect of the invention is provided, which is a method of fabricating a semiconductor device having a three-dimensional stacked structure formed by stacking semiconductor circuit layers on a support substrate, comprises the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

fixing the semiconductor substrate to the support substrate or a remaining one of the semiconductor circuit layers by joining the first insulating film to the support substrate or the remaining one of the semiconductor circuit layers directly or indirectly through a wiring structure;

forming, from the back side of the semiconductor substrate, a trench in the semiconductor substrate which has been fixed to the support substrate or the remaining one of the semiconductor circuit layers, an inner wall face of the trench being covered with a second insulating film; and filling an inside of the trench with a conductive material from the back side of the semiconductor substrate, thereby forming a conductive plug.

(10) With the method of fabricating a semiconductor device having a three-dimensional stacked structure according to the third aspect of the present invention, as explained above, first, the desired element or circuit is formed in the inside or on the surface of the semiconductor substrate that constitutes one of the semiconductor circuit layers. Then, the surface of the semiconductor substrate, where the element or circuit has been formed, is covered with the first insulating film. Next, the first insulating film is joined to the support substrate or the remaining one of the semiconductor circuit layers directly or indirectly through the wiring structure, thereby fixing the semiconductor substrate to the support substrate or the remaining one of the semiconductor circuit layers. Thereafter, the trench is formed in the semiconductor substrate, which has been fixed to the support substrate or the remaining one of the semiconductor circuit layers, from the surface side of the semiconductor substrate, where the inner wall face of the trench is covered with the second insulating film. Subsequently, the inside of the trench is filled with the conductive material from the back side of the semiconductor substrate, forming the conductive plug.

Each of these steps can be performed by using a known process or processes (e.g., a CVD, isotropic etching, mechanical polishing, or CMP process). Moreover, the electrical interconnection between the support substrate or the remaining one of the semiconductor circuit layers and the conductive plug can be easily realized by utilizing a wiring line formed on the surface of the semiconductor substrate (if the semiconductor substrate includes a wiring structure, it can be easily realized by utilizing a wiring line existing in the wiring structure and a wiring line formed on the surface of the semiconductor substrate). Furthermore, since the wiring line formed on the surface of the semiconductor substrate (if the wiring structure exists, the wiring line existing in the wiring structure and the wiring line formed on the surface of the semiconductor substrate) and the conductive plug in the trench will be a "buried interconnection" that penetrates through the semiconductor circuit layer along the stacking direction. Therefore, the electrical interconnection between the stacked semiconductor circuit layers along the stacking direction can be easily realized by using the buried interconnection.

Besides, with the method of fabricating a semiconductor device according to the third aspect of the present invention, the formation of the trench and the filling of the conductive material are carried out from the back side of the semiconductor substrate. Therefore, this fabrication method is preferably applicable to a case where the formation of the trench and the filling of the conductive material from the surface side of the semiconductor substrate is impossible, or a case where the formation of the trench that penetrates through the first insulating film (if the wiring structure exists, the formation of the trench that penetrates through the first insulating film and the wiring structure) is impossible or difficult. In other words, an optimum buried interconnection for the electrical interconnection can be formed responsive to the restrictions due to the layout of the element or circuit in the semiconductor circuit layer (if the semiconductor circuit layer has the wiring structure, the layout of the wiring lines in the wiring structure is included, in addition to the layout of the element or circuit).

In addition, in the step of fixing the semiconductor substrate to the support substrate or the remaining one of the semiconductor substrates, a first electrode may be used. In this case, the first electrode is disposed on at least one of the first insulating film or the wiring structure and the support substrate or the remaining one of the semiconductor circuit layers. The semiconductor substrate is fixed to the support substrate or the remaining one of the semiconductor circuit layers by using the first electrode.

(11) In the method of fabricating a semiconductor device according to the third aspect of the invention, the meanings of the "support substrate", the "semiconductor circuit layer", the "semiconductor substrate", the "circuit", the "element", and the "conductive material" filled in the trench are the same as those in the method of fabricating a semiconductor device according to the first aspect of the invention, respectively.

Any insulating film may be used for the "first insulating film" if it can cover the surface of the "semiconductor substrate" of the semiconductor circuit layer where the element or circuit has been formed to thereby provide electrical insulation of the surface from the adjoining parts thereof. For example, silicon dioxide ($SiO_2$), silicon nitride ($SiN_x$) or the like may be preferably used for this purpose. The formation method of the "first insulating film" is optional.

It is sufficient for the "trench" to have a desired depth and to receive the conductive material for the buried interconnection. The structure of the "trench" is optional. The shape and size of the opening of the "trench", the cross-sectional shape thereof, and so on may be optionally set according to the necessity. Any formation method is applicable to the "trench" if it can remove selectively the semiconductor substrate from its back side to thereby form the trench. An anisotropic etching method using a mask may be preferably used for this purpose.

Any insulating film may be used for the "second insulating film" that covers the inner wall face of the trench if it can provide electrical insulation between the "semiconductor substrate" of the semiconductor circuit layer and the "conductive material" filled in the trench. Silicon dioxide ($SiO_2$), silicon nitride ($SiN_x$) or the like may be preferably used for this purpose. The formation method of the "second insulating film" is optional.

It is sufficient for the "first electrode" to be disposed on at least one of the first insulating film or the wiring structure and the support substrate or the remaining one of the semiconductor circuit layers. The structure and shape of the "first electrode" are optionally selectable. Preferably, the "first electrode" is formed directly on the first insulating film or indirectly over the first insulating film through the wiring structure. The structure and shape of the "first electrode" are optionally selectable. Usually, the "first electrode" is formed to protrude from the surface of the first insulating film (if the semiconductor circuit layer has a wiring structure, the "first electrode" is formed to protrude from the surface of the wiring structure); however, the "first electrode" may not be formed to protrude from the surface. It is sufficient for the "first electrode" to provide electrical connection to the support substrate or the remaining one of the semiconductor circuit layers. Any material may be used for the "first substrate" if it has conductivity applicable to the electrical connection to the outside using the conductive plug in the trench. The "first electrode" may be formed by fixing a piece of conductive material formed separately to the surface of the second insulating film or the surface of the wiring structure (or, an opposite surface of the support substrate or the remaining one of the semiconductor circuit layers), or by directly depositing a conductive material on the surface of the first insulating film or the surface of the wiring structure (or, an opposite surface of the support substrate or the remaining one of the semiconductor circuit layers) by a plating method or the like. The "first electrode" may be formed by utilizing the wiring line formed on the surface of the semiconductor substrate and covered with the second insulating film, or the wiring line existing in the wiring structure, or the wiring line formed on the opposite surface of the support substrate or the remaining one of the semiconductor circuit layers.

No limitation is applied to the method for performing the "step of fixing the semiconductor substrate to the support substrate or the remaining one of the semiconductor circuit layers by joining the first insulating film to the support substrate or the remaining one of the semiconductor circuit layers directly or indirectly through the wiring structure".

No limitation is applied to the method for performing the "step of fixing the semiconductor substrate to the support substrate or the remaining one of the semiconductor circuit layers using the first electrode" as well. Typically, the first electrode is bonded to the support substrate or the remaining one of the semiconductor circuit layers by welding, or pressurization under heat or at room temperature, where an adhesive is used together. However, any other method may be used for this purpose. If welding or direct bonding with pressurization cannot be used, the bonding is carried out while placing an appropriate bonding metal as shown in the method of fabricating a semiconductor device according to the first aspect of the invention between them.

(12) In a preferred embodiment of the method according to the third aspect of the invention, the semiconductor circuit layer comprises a wiring structure formed on the first insulating film in addition to the element or circuit, and the first electrode is formed indirectly over the first insulating film through the wiring structure. In this embodiment, there is an advantage that an optimum buried interconnection for the electrical interconnection can be formed responsive to the restrictions due to not only the layout of the element or circuit in the semiconductor circuit layer but also the layout of the wiring line existing in the wiring structure.

In another preferred embodiment of the method according to the third aspect of the invention, in the step of forming the trench whose inner wall face is covered with the second insulating film, the semiconductor substrate is selectively removed from its back side, thereby forming the trench that penetrates through the semiconductor substrate; and the second insulating film that covers the inner wall face of the trench is formed in such a way as to have an opening that enables electrical interconnection between the first electrode and the conductive plug. In this embodiment, there is an advantage that electrical interconnection between the first electrode and the conductive plug can be easily performed by way of the opening by only filling the inside of the trench with the conductive material.

It is preferred that the opening of the second insulating film is formed near an end of the trench on the surface side of the semiconductor substrate. Since the conductive plug is easily contacted with the element or circuit formed in the inside or on the surface of the semiconductor substrate, there is an advantage that electrical interconnection between the first electrode and the conductive plug can be performed more easily.

In a further preferred embodiment of the method according to the third aspect of the invention, a step of forming a second electrode on an end of the conductive plug that has been exposed to the back side of the semiconductor substrate is additionally provided. The second electrode is used as a bump electrode. In the step of forming the second electrode, a piece of conductive material formed separately may be fixed onto the end of the conductive plug or a conductive material may be directly deposited onto the end of the conductive plug by a plating method or the like. However, the end of the conductive plug itself that has been exposed to the back side of the semiconductor substrate may be used as the second electrode.

In a still further preferred embodiment of the method according to the third aspect of the invention, the semiconductor substrate is formed by a single semiconductor member or a plurality of semiconductor members.

(13) A method of fabricating a semiconductor device having a three-dimensional stacked structure according to a fourth aspect of the present invention corresponds to a method obtained by interchanging the orders of the step of forming the element or circuit and the step of forming the trench in the method of fabricating a semiconductor device according to the first aspect of the invention.

Specifically, as shown in still another embodiment of the invention, the method according to the fourth aspect of the invention is provided, which is a method of fabricating a semiconductor device having a three-dimensional stacked structure formed by stacking semiconductor circuit layers on a support substrate, comprises the steps of:

forming a desired element or circuit in an inside or on a surface of a semiconductor substrate that constitutes one of the semiconductor circuit layers from a surface side of the semiconductor substrate;

forming, from the surface side of the semiconductor substrate, a trench in the semiconductor substrate where the element or circuit has been formed, an inner wall face of the trench being covered with a first insulating film;

filling an inside of the trench with a conductive material from the surface side of the semiconductor substrate, thereby forming a conductive plug;

covering the surface of the semiconductor substrate, where the element or circuit and the conductive plug have been formed, with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing, from a back side of the semiconductor substrate, the semiconductor substrate which has been fixed to the support substrate or the remaining one of the semiconductor circuit layers, thereby exposing the first insulating film to the back side of the semiconductor substrate; and selectively removing the first insulating film which has been exposed to the back side of the semiconductor substrate, thereby exposing the conductive plug to the back side of the semiconductor substrate.

(14) The method of fabricating a semiconductor device having a three-dimensional stacked structure according to the fourth aspect of the invention is the same as the method according to the first aspect of the invention except that the order of the step of forming the element or circuit and the order of the step of forming the trench are interchanged, as explained above. Therefore, it is apparent that the same advantages as those of the method according to the first aspect are obtained in the method according to the fourth aspect because of the same reason as that of the method according to the first aspect.

In addition, in the step of fixing the semiconductor substrate to the support substrate or the remaining one of the semiconductor substrates, a first electrode may be used. In this case, the first electrode is disposed on at least one of the second insulating film or the wiring structure and the support substrate or the remaining one of the semiconductor circuit layers. The semiconductor substrate is fixed to the support substrate or the remaining one of the semiconductor circuit layers by using the first electrode.

(15) In the method of fabricating a semiconductor device according to the fourth aspect of the invention, the meanings of the "support substrate" and so on are the same as those in the method of fabricating a semiconductor device according to the first aspect of the invention.

(16) In a preferred embodiment of the method according to the fourth aspect of the invention, the semiconductor circuit layer comprises a wiring structure formed on the second insulating film in addition to the element or circuit, and the first electrode is formed indirectly over the second insulating film through the wiring structure. In this embodiment, there is an advantage that an optimum buried interconnection for the electrical interconnection can be formed responsive to the restrictions due to not only the layout of the element or circuit in the semiconductor circuit layer but also the layout of the wiring line existing in the wiring structure.

In another preferred embodiment of the method according to the fourth aspect of the invention, a step of forming a third insulating film that covers the back of the semiconductor substrate is additionally provided between the step of exposing the first insulating film to the back side of the semiconductor substrate and the step of exposing the conductive plug to the back side of the semiconductor substrate. In the step of exposing the conductive plug, the third insulating film is selectively removed along with the first insulating film. In this embodiment, there is an advantage that electrical insulation of the back of the semiconductor substrate can be ensured, because the back of the semiconductor substrate is covered with the remaining third insulating film after the step of exposing the conductive plug is completed.

In still another preferred embodiment of the method according to the fourth aspect of the invention, a step of forming a third insulating film that covers the back of the semiconductor substrate, a step of forming a planarization film on the third insulating film, and a step of selectively removing the planarization film are additionally provided between the step of exposing the first insulating film to the back side of the semiconductor substrate and the step of exposing the conductive plug to the back side of the semiconductor substrate. In the step of exposing the conductive plug, the third insulating film and the remaining planarization film are selectively removed along with the first insulating film. In this embodiment, there is an advantage that electrical insulation of the back of the semiconductor substrate can be ensured, because the back of the semiconductor substrate is covered with the remaining third insulating film after the step of exposing the conductive plug is completed. Moreover, there is another advantage that the conductive plug can be used as a bump electrode, because the conductive plug is formed to protrude from the back of the semiconductor substrate.

In a further preferred embodiment of the method according to the fourth aspect of the invention, a step of forming a second electrode on an end of the conductive plug that has been exposed to the back side of the semiconductor substrate is additionally provided. The second electrode is used as a bump electrode. In the step of forming the second electrode, a piece of conductive material formed separately may be fixed onto the end of the conductive plug or a conductive material may be directly deposited onto the end of the conductive plug by a plating method or the like. However, the end of the conductive plug itself may be used as the second electrode.

In a still further preferred embodiment of the method according to the fourth aspect of the invention, the semiconductor substrate is formed by a single semiconductor member or a plurality of semiconductor members.

These preferred embodiments are the same as those of the method according to the first aspect of the invention.

(17) The above-described methods of fabricating a semiconductor device according to the first to fourth aspects of the invention are applicable to any semiconductor device having a three-dimensional stacked structure, where the size of the device is optional. The three-dimensional stacked semiconductor device may have a wafer size (in this case, each of the semiconductor circuit layers that constitute the three-dimensional stacked structure has a wafer size), a chip size (in this case, each of the semiconductor circuit layers has a chip size), an intermediate size between the wafer size and the chip size (in this case, each of the semiconductor circuit layers has an intermediate size between the wafer size and the chip size), or a size larger than the wafer size (in this case, each of the semiconductor circuit layers has a size larger than the wafer size). Here, the "wafer size" has the meaning of an approximately equal size to a semiconductor wafer (e.g., 8 inches in diameter). Since the stacking count of the semiconductor circuit layers is optional in the present invention, the height of the three-dimensional stacked semiconductor device is optional as well.

Each of the semiconductor circuit layers may be formed by a single semiconductor wafer, a plurality of semiconductor wafers arranged two-dimensionally, a single semiconductor chip (or a semiconductor member), or a plurality of semiconductor chips (or semiconductor members) arranged two-dimensionally.

ADVANTAGEOUS EFFECTS OF THE INVENTION

With the methods of fabricating a semiconductor device having a three-dimensional stacked structure according to the first to fourth aspects of the present invention, there are advantageous effects that (i) the electrical interconnection between the stacked semiconductor circuit layers along the stacking direction can be easily realized with buried interconnections, and (ii) optimum buried interconnections for the electrical connection can be formed responsive to the restrictions due to the layout of the elements or circuits in the respective semiconductor circuit layers stacked (if the semiconductor circuit layer has a wiring structure, the layout of the wiring lines in the wiring structure is included, in addition to the layout of the elements and circuits).

BEST MODE FOR CARRYING OUT THE INVENTION

Preferred embodiments of the present invention will be described in detail below while referring to the drawings attached.

First Embodiment

FIGS. 1(a) to 7(l) are partial cross-sectional views showing the process steps of a method of fabricating a semiconductor device having a three-dimensional stacked structure according to a first embodiment of the invention, respectively. This first embodiment is an example where semiconductor wafers are stacked to fabricate a semiconductor device having a three-dimensional stacked structure.

First, as shown in FIG. 1(a), a wafer 11 made of single crystal silicon (Si) (a Si wafer) is prepared as a semiconductor substrate. Next, a silicon dioxide ($SiO_2$) film 12 (approximately 10 nm in thickness) is formed on the surface (the first main surface) of the wafer 11, covering the whole surface of the wafer 11 with the $SiO_2$ film 12. Subsequently, a silicon nitride ($Si_3N_4$) film 12a (approximately 50 nm in thickness) is formed on the $SiO_2$ film 12, covering the whole surface of the $SiO_2$ film 12 with the $Si_3N_4$ film 12a. Moreover, a patterned photoresist film 17, which has been patterned to obtain desired trenches 13, is formed on the $Si_3N_4$ film 12a.

Thereafter, using the photoresist film 17 as a mask, the underlying $Si_3N_4$ film 12a is selectively removed to thereby form openings at the positions where the trenches 13 are to be formed. Using the $Si_3N_4$ film 12a having the openings thus formed as a mask, the underlying $SiO_2$ film 12 and the Si substrate (wafer) 11 are selectively removed successively. Here, a known anisotropic etching method (a dry etching method) is used. In this way, the trenches 13 with desired depths are formed at the predetermined positions in the substrate (wafer) 11 from the surface side thereof. The trenches 13 are arranged at the respective positions where buried interconnections (conductor plugs) for electrical interconnection along the stacking direction of the Si substrate (wafer) 11 are to be formed. The cross-sectional shape and size of each trench 13 is optional; for example, a circular or rectangular shape having a diameter or side of approximately several micrometers is adopted. The state at this time is shown in FIG. 1(a).

After the etching is completed, the photoresist film 17 used as the mask is removed. In addition, the photoresist film 17 used as the mask may be removed after the completion of the etching of the $Si_3N_4$ film 12a and before the start of the etching of the $SiO_2$ film 12.

Thereafter, while leaving the $Si_3N_4$ film 12a over the surface of the Si substrate (wafer) 11, $SiO_2$ films 14 (approximately 500 nm in thickness) are selectively formed on the exposed surfaces (the inner wall faces) of the respective trenches 13 by a thermal oxidation method. The $SiO_2$ films 14 cover respectively the inner wall faces of the trenches 13, and are connected to the $SiO_2$ film 12 to be united with the same. The state at this time is shown in FIG. 1(b). After the thermal oxidation is completed, the $Si_3N_4$ film 12a is removed.

Next, the respective trenches 13, the exposed surfaces of which have been covered with the insulating films 14, are selectively filled with an appropriate conductive material from the surface side of the substrate 11 by a known method, forming conductive plugs 15. For example, a conductive material film is deposited on the whole surface of the Si substrate (wafer) 11 by a CVD (Chemical Vapor Deposition) method and thereafter, the part of the conductive material film located on the $SiO_2$ film 12 is selectively removed and at the same time, the remaining parts of the conductive material film located in the trenches 13 are left by an etch back method or the combination of a mechanical polishing method and a CMP (Chemical Mechanical Polishing) method, resulting in the conductive plugs 15. As the conductive material used here, for example, a semiconductor such as polysilicon or a metal such as tungsten (W), copper (Cu), and aluminum (Al) may be used; however, the conductive material is not limited to such the semiconductor or metal.

In FIG. 1(c), the top end of each conductive plug 15 is shown in such a way as to be slightly lower than the surface of the $SiO_2$ film 12. However, the top end of each conductive plug 15 may be placed on the same level as the surface of the $SiO_2$ film 12.

Then, in the areas on the surface of the substrate 11 where the trenches 13 are not formed, in other words, at the positions on the surface of the substrate 11 which are not overlapped with the trenches 13, a necessary count of MOSFETs (Metal-Oxide-Semiconductor Field-Effect Transistors) (which will be termed MOS transistors) are formed by a known method, resulting in a desired circuit. Each of the MOS transistors is constituted by a pair of source/drain regions 16 formed apart from each other in the substrate 11, a gate insulating film 12b formed between the source/drain regions 16, and a gate electrode 18 formed on the gate insulating film 12b. The gate insulating film 12b is formed by a $SiO_2$ film formed in a separate process from that of the $SiO_2$ film 12. Specifically, the $SiO_2$ film 12 is selectively removed in the areas where the gate insulating films 12b are to be formed and thereafter, a $SiO_2$ film is formed again in the same areas, resulting in the gate insulating films 12b. The state at this time is shown in FIG. 1(c).

Here, MOS transistors are shown as an example of the semiconductor elements formed on the substrate 11; however, needless to say, the embodiment is not limited to this and any other semiconductor element than the MOS transistor may be formed according to the necessity. This point is applicable to the other embodiments to be explained later.

Next, as shown in FIG. 2(d), an interlayer insulating film 19 is formed over the whole surface of the substrate (wafer) 11 on the insulating film 12 covering the surface of the Si substrate 11, thereby entirely covering the MOS transistors and the exposed surfaces from the MOS transistors. As the interlayer insulating film 19, a known organic or inorganic insulative film is optionally used. Then, the interlayer insulating film 19 is selectively etched, thereby forming penetrating holes that reach respectively the desired source/drain regions 16 and the conductive plugs 15 in the trenches 13. Next, the penetrating holes of the interlayer insulating film 19 corresponding to the source/drain regions 16 are filled with a conductive material 21 by a known method. Subsequently, after forming a conductive metal film (not shown) on the interlayer insulating film 19, the conductive metal film is selectively etched to thereby form a patterned metal wiring film 20. This metal wiring film 20 is divided into several wiring parts. These wiring parts are in contact with the corresponding conductive plugs 15 by way of the penetrating holes of the interlayer insulating film 19, thereby making electrical interconnection between the wiring parts of the metal wiring film 20 and the corresponding plugs 15. In FIG. 2(d), one of the wiring parts of the metal wiring film 20 is electrically connected to a corresponding one of the source/drain regions 16 by way of a corresponding one of conductive materials 21 embedded in the penetrating holes of the interlayer insulating film 19.

Following this, a multilayer wiring structure 30 is formed on the metal wiring film 20 by a known method. This multilayer wiring structure 30 comprises an insulating material 31, three wiring layers 32, 33 and 34 embedded in the insulating material 31, and conductors 35 and 36 which are mainly used for interlayer connection among the wiring layers 32, 33 and 34. The conductors 35 and 36 are usually embedded in via holes formed in the insulating material 31; however, they are not limited to this. Although the insulating material 31 may be made of a single electrically insulative material, it is often that the insulating material 31 is made of a stack formed by layers of several different electrically insulative materials. Since the configuration and the methods of using and forming the multilayer wiring structure 30 are known, explanations about them are omitted here.

Then, microbump electrodes 37 (which correspond to the "first electrodes") are formed on the surface (which has been planarized) of the multilayer wiring structure 30 by a known method. The shape and size of each microbump electrode 37 is optional; for example, a circular or rectangular shape with a diameter or side of approximately several micrometers is adopted. The state at this time is shown in FIG. 2(d). These microbump electrodes 37 are electrically connected to the corresponding conductive plugs 15 in the trenches 13 by way of the wiring layers 32, 33 or 34 and the conductors 35 or 36 in the multilayer wiring structure 30. In this way, the microbump electrodes 37 located on the surface of the multilayer wiring structure 30 and the conductive plugs 15 located below the same structure 30 are electrically connected to each other, through which electrical interconnection along the vertical direction (stacking direction) of the Si substrate 11 can be made. On the other hand, the MOS transistors formed on the substrate 11 (i.e., the circuits formed on the substrate 11) are electrically connected to the multilayer wiring structure 30 or the conductive plugs 15 by way of the metal wiring films 20 as necessary. Therefore, the input to the MOS transistors (i.e., the circuits formed on the substrate 11) and the output from them can be carried out by way of the microbump electrodes 37 and/or the conductive plugs 15.

The microbump electrodes 37 may be formed by fixing pieces of a conductive material, which have been formed separately, to the predetermined positions on the surface of the multilayer wiring structure 30, or by selectively depositing a conductive material directly onto the surface of the structure 30 by a plating method or the like. Moreover, the electrodes 37 may be formed by utilizing the conductors 36 of the structure 30 or the like. For example, the top ends of the conductors 36 may be formed in such a way as to be exposed from the surface of the structure 30 or to protrude above the surface of the structure 30, resulting in the electrodes 37.

The Si substrate (Si wafer) 11 on which the MOS transistors (the circuits) have been formed in the above-described way, and the multilayer wiring structure 30 formed on the substrate 11 constitute a first semiconductor circuit layer 1.

Subsequently, the first semiconductor circuit layer 1 is fixed to a support substrate 40 using the microbump electrodes 37 formed on the surface of the multilayer wiring structure 30. In other words, mechanical connection between the first semiconductor circuit layer 1 and the support substrate 40 is carried out using the electrodes 37. As the support substrate 40, for example, a wafer made of glass, single-crystal Si, or the like may be preferably used; here, a Si wafer (a LSI wafer into which semiconductor circuits are incorporated) is used. The first semiconductor circuit layer 1 is electrically connected to the semiconductor circuits formed in the support substrate 40 made of a Si wafer with the electrodes 37 also. As the Si wafer, a simple wafer comprising no built-in semiconductor circuits may be used.

In this state, there is a gap corresponds to the thickness of the microbump electrodes 37 between the multilayer wiring structure 30 and the support substrate 40. Therefore, the gap is filled with an electrically insulative adhesive 39 and then, the adhesive 39 thus filled is cured. As the adhesive 39, a polyimide resin, an epoxy resin, or the like may be preferably used. In this way, the first semiconductor circuit layer 1 is electrically and mechanically connected to the support substrate 40 by the adhesive 39 and the electrodes 37.

In addition, when the support substrate 40 is formed by a glass or by a semiconductor wafer comprising no semiconductor circuits, the microbump electrodes 37 are used for only mechanical connection between the first semiconductor circuit layer 1 and the support substrate 40. In this case, the electrodes 37 may be omitted, where the first semiconductor circuit layer 1 and the support substrate 40 are directly adhered to each other.

Thereafter, while holding the first semiconductor circuit layer 1 with the support substrate 40, the back (the second main surface) side of the Si substrate 11 is polished by a mechanical polishing method and a CMP method until the distances from the bottom ends of the trenches 13 are equal to approximately 1 μm, thereby reducing the thickness of the whole substrate 11. The first semiconductor circuit layer 1 thus thinned by polishing will be labeled 1a later. The state at this time is shown in FIG. 2(e).

Next, the back side of the thinned first semiconductor circuit layer 1a (i.e., the Si substrate 11) is selectively removed by isotropic etching such as wet etching, plasma etching, or the like, thereby exposing the $SiO_2$ films 14 that cover the inner wall faces of the trenches 13 to the back side of the layer 1a, as shown in FIG. 3(f). The etching amount at this time is adjusted such that the lower ends of the conductive plugs 15 protrude from the back of the substrate 11 at a predetermined distance when the etching is completed.

Following this, as shown in FIG. 3(g), a $SiO_2$ film 41 is formed on the back of the substrate 11 and the exposed $SiO_2$ films 14 by a known method such as CVD. The thickness of the SiO$_2$ film 41 is set at, for example, approximately 0.2 μm. Subsequently, the SiO$_2$ films 14 are selectively removed along with the SiO$_2$ film 41 by polishing the back side of the substrate 11 by a CMP method, thereby exposing the lower ends of the conductive plugs 15 in the trenches 13, as shown in FIG. 4(h). The remaining SiO$_2$ film 41 covers the areas on the back of the substrate 11 excluding the plugs 15 and the SiO$_2$ films 14, and the entire back of the substrate 11 is planarized. In other words, the whole back of the first semiconductor circuit layer 1a is flat.

Thereafter, microbump electrodes 42 are formed on the exposed lower ends of the respective conductive plugs 15 by a known method, as shown in FIG. 4(i). These microbump electrodes 42 may be formed, for example, by forming a conductive film (not shown) on the whole back of the substrate 11 (the first semiconductor circuit layer 1a) in the state of FIG. 4(h) and then, selectively removing the conductive film thus formed by lithography and etching, or by using a lift-off method or a plating method. When a lift-off method is used, first, a resist film (not shown) having penetrating holes at the positions where the microbump electrodes 42 are to be formed is formed on the whole back of the substrate 1a in the state of FIG. 4(h). Next, a conductive film (not shown) is formed on the resist film and then, the resist film is peeled off. At this time, only the parts of the conductive film, which are in contact with the back of the semiconductor circuit layer 1a through the penetrating holes of the resist film, are selectively left, resulting in the electrodes 42. Each of the electrodes 42 is fixed to the lower end of the corresponding conductive plug 15. When a plating method is used, the electrodes 42 may be formed in a similar way as that using a lift-off method.

Next, a second semiconductor circuit layer 2 is fixed on the back of the first semiconductor circuit layer 1a in the following way. Here, since the second semiconductor circuit layer 2 has an approximately the same structure as that of the first semiconductor circuit layer 1, explanation about the same structure is omitted by attaching the same reference symbols as used for the first semiconductor circuit layer 1 to the corresponding elements. In addition, it is needless to say that the second semiconductor circuit layer 2 may have a different structure from that of the first semiconductor circuit layer 1 according to the necessity.

On the surface of the multilayer wiring structure 30 of the second semiconductor circuit layer 2, as shown in FIG. 5(j) microbump electrodes 43 are formed at the corresponding (superposable) positions to the microbump electrodes 42 formed on the back of the first semiconductor circuit layer 1a (Si wafer 11). These electrodes 43 are respectively joined to the corresponding electrodes 42 on the layer 1a by welding. In this way, the second semiconductor circuit layer 2 is fixed (mechanically connected) to the back side of the first semiconductor circuit layer 1a and at the same time, electrical interconnection between both the circuit layers 1a and 2 is performed. At this time, there is a gap corresponding to the sum of the thicknesses of the electrodes 42 and 43 between the circuit layers 1a and 2. The state at this time is shown in FIG. 5(j).

Here, the joining between the electrodes 43 and 42 is performed by "welding"; however, the embodiment is not limited to this. Any other method may be used for joining between the electrodes 43 and 42. For example, the electrodes 43 and 42 may be directly contacted with each other under pressure at room temperature or with heating, thereby joining the electrodes 43 and 42 together by pressure welding. Alternately, the electrodes 43 and 42 may be indirectly contacted with each other with an intervening bonding metal and then, the bonding metal may be melted by heating, thereby joining the electrodes 43 and 42 together.

Next, as shown in FIG. 6(k), the gap between the first and second semiconductor circuit layers 1a and 2 is filled with an electrically insulative adhesive 44 by an injection method and then, the adhesive 44 thus injected is cured. In this way, the mechanical and electrical interconnection between the first and second semiconductor circuit layers 1a and 2 is completed. As the adhesive 44, a polyimide resin or an epoxy resin may be used.

In addition, instead of filling the gap between the first and second semiconductor circuit layers 1a and 2 with the adhesive 44, the following may be used. Specifically, the adhesive 44 is coated on the opposing surfaces (or one of the opposing surfaces) of the circuit layers 1a and 2 prior to the coupling. Thereafter, when the circuit layers 1a and 2 are coupled, the gap is filled with the adhesive 44 and at the same time, the extra adhesive 44 is pressed out of the gap. In this case, the adhesive 44 in the gap is cured after removing the extra adhesive 44.

Thereafter, similar to the case of the first semiconductor circuit layer 1a, the back side of the Si substrate (wafer) 11 of the second semiconductor circuit layer 2 coupled with the first semiconductor circuit layer 1a is polished by a mechanical polishing method and a CMP method until the distance from the lower end of each trench 13 is equal to, for example, approximately 1 μm. The second semiconductor circuit layer 2 thus thinned will be termed 2a later (please refer to FIG. 7(l)).

Next, in the same manner as that of the first semiconductor circuit layer 1a, the lower part of the substrate (wafer) 11 of the second semiconductor circuit layer 2a is selectively removed, thereby exposing the SiO$_2$ films 14 in the trenches 13. Then, a SiO$_2$ film 41 is formed on the back of the substrate 11 and the exposed SiO$_2$ films 14. The SiO$_2$ film 41 and the SiO$_2$ films 14 are selectively removed to expose the lower ends of the conductive plugs 15. Moreover, microbump electrodes 42 are formed on the exposed lower ends of the conductive plugs 15. In this way, the second semiconductor circuit layer 2a has the structure shown in FIG. 7(l). The second semiconductor circuit layer 2a shown in FIG. 7(l) is in substantially the same state as that of the first semiconductor circuit layer 1a shown in FIG. 4(i).

When the semiconductor device is a three-dimensional stacked semiconductor device with the two-layer structure formed by the first and second semiconductor circuit layers 1a and 2a, the microbump electrodes 42 formed on the back of the second semiconductor circuit layer 2a are used as the microbump electrodes for connection to external circuits. In this case, the back of the circuit layer 2a is covered with the SiO$_2$ film 14 and the SiO$_2$ films 41 and therefore, no problem will occur.

When the semiconductor device further comprises a third semiconductor circuit layer or higher semiconductor circuit layer or layers, the third, fourth, fifth . . . semiconductor circuit layers (not shown) are successively stacked on the second semiconductor circuit layer 2a and fixed together, thereby fabricating a three-, four-, five- . . . layer structured semiconductor device with a three-dimensional stacked structure.

At this stage, as seen from FIG. 7(l), the circuits in the first semiconductor circuit layer 1a are electrically connected to the circuits in the overlying support substrate 40 by way of the wiring lines existing in the multilayer wiring structure 30 of the first semiconductor circuit layer 1a, and the microbump electrodes 37 on one hand. On the other hand, the circuits in the first semiconductor circuit layer 1a are electrically connected to the circuits in the second semiconductor circuit layer 2a by way of the conductive plugs 15 in the first semiconductor circuit layer 1a, the microbump electrodes 42 and 43, and the wiring lines in the multilayer wiring structure 30 of the second semiconductor circuit layer 2a. In the same manner as above, the circuits in the second semiconductor circuit layer 2a are electrically connected to the underlying external circuits or the circuits in the underlying third semiconductor circuit layer by way of the conductive plugs 15 in the second semiconductor circuit layer 2a and the microbump electrodes 42 (and 43).

With the method of fabricating a semiconductor device according to the first embodiment of the invention, as explained above, first, the trenches 13 are formed at the predetermined positions in the Si substrate (Si wafer) 11 that constitutes the first semiconductor circuit layer 1 from the surface side of the substrate 11, where the inner wall faces of the respective trenches 13 are covered with the SiO$_2$ films 14. Then, the insides of the trenches 13 are filled with the conductive material from the surface side of the substrate 11, forming the conductive plugs 15. Next, to constitute the desired circuit, the desired semiconductor elements (here, the MOS transistors) are formed, from the surface side of the substrate 11, on the surface of the substrate 11 in such a way as not to be overlapped with the trenches 13 (i.e., the conductive plugs 15). Thereafter, the multilayer wiring structure 30 is formed over the surface of the substrate 11 through the interlayer insulating film 19, and the microbump electrodes 37 are formed on the surface of the multilayer wiring structure 30, where the microbump electrodes 37 are electrically connected to the conductive plugs 15, respectively. Furthermore, using the microbump electrodes 37, the Si substrate 11 having the multilayer wiring structure 30 is fixed to one surface of the support substrate 40. Subsequently, the Si substrate 11 fixed to the support substrate 40 is selectively removed to be thinned from the back side of the Si substrate 11, thereby exposing the SiO$_2$ films 14 covering the inner wall faces (exposed faces) of the trenches 13 to the back side of the substrate 11. Following this, the conductive plugs 15 are exposed to the back side of the substrate 11 by selectively removing the SiO$_2$ films 14 exposed to the back side of the substrate 11 and then, the microbump electrodes 42 are formed on the exposed ends of the plugs 15. This point is applicable to the second, third, fourth, fifth . . . semiconductor circuit layers.

Each of these steps can be performed by using a known process or processes (e.g., a CVD, isotropic etching, mechanical polishing, or CMP process). Moreover, the electrical interconnection between the microbump electrodes 37 which are formed on the surface of the multilayer wiring structure 30 and the conductive plugs 15 which are formed in the trenches 13 and the ends of which are exposed to the back side of the substrate 11 is performed by utilizing the metal wiring lines in the wiring structure 30 and the wiring film 20 formed on the surface of the interlayer insulating film 19. Therefore, the wiring lines (i.e., the wiring layers 32, 33, and 34 and the conductors 35 and 36) in the wiring structure 30, the wiring film 20, and the conductive plugs 15 will be "buried interconnections" that penetrate through the first semiconductor circuit layer 1a along the stacking direction. Accordingly, by using the buried interconnections and the microbump electrodes 37 (or the microbump electrodes 42 and 43), the electrical interconnection between the support substrate 40 and the first semiconductor circuit layer 1a (or, between the first semiconductor circuit layer 1a and the second semiconductor circuit layer 2a, or between the second semiconductor circuit layer 2a and the semiconductor circuit layer adjoining thereto, and so on) along the stacking direction can be easily realized.

Besides, with the method of fabricating a semiconductor device according to the first embodiment of the invention, the formation of the trenches 13 and the filling of the trenches 13 with the conductive material are carried out from the surface side (the first main surface side) of the Si substrate (wafer) 11, and the trenches 13 do not penetrate through the interlayer insulating film 19. Therefore, this fabrication method is preferably applicable to the case where the formation of the trenches 13 and the filling of the conductive material from the back side (the second main surface side) of the substrate 11 is impossible, or the case where the formation of the trenches 13 that penetrate through the multilayer wiring structure 30 is impossible or difficult. This means that this method can cope with the restrictions due to the layout of the semiconductor elements and the wiring lines in the first semiconductor circuit layer 1a and/or the layout of the wiring lines in the multilayer wiring structure 30. This is similarly applied to the second semiconductor circuit layer 2a and the subsequent semiconductor circuit layers.

In addition, in the above-described embodiment, the first semiconductor circuit layer 1a and the second semiconductor circuit layer 2a are successively stacked and fixed below the support substrate 40. However, needless to say, the first semiconductor circuit layer 1a and the second semiconductor circuit layer 2a may be successively stacked and fixed on the support substrate 40 after turning the support substrate 40 upside down.

Moreover, in the above-described embodiment, after the first semiconductor circuit layer 1 having the structure shown in FIG. 2(d) is formed, the first semiconductor circuit layer 1 is immediately connected to the support substrate 40 with the electrodes 37. Next, after the second semiconductor circuit layer 2 having the structure shown in FIG. 5(j) is formed, the second semiconductor circuit layer 2 is immediately connected to the first semiconductor circuit layer 1 with the microbump electrodes 42 and 43. However, the fabrication method of this embodiment is not limited to this. For example, the following method may be adopted. Specifically, the first semiconductor circuit layer 1 having the structure shown in FIG. 2(d) and the second semiconductor circuit layer 2 having the structure shown in FIG. 5(j) are fabricated in advance. Thereafter, the first semiconductor circuit layer 1 is fixed to the support substrate 40 and then, the back of the first semiconductor circuit layer 1 is processed, thereby forming the first semiconductor circuit layer 1a having the structure shown in FIG. 4(i). Following this, the second semiconductor circuit layer 2 having the structure shown in FIG. 5(j) is fixed to the first semiconductor circuit layer 1a and then, the back of the second semiconductor circuit layer 2 is processed, thereby forming the second semiconductor circuit layer 2a having the structure shown in FIG. 7(l).

Furthermore, the three-dimensional stacked semiconductor device of the wafer size having the above-described structure may be used in its as-is status as a three-dimensional stacked semiconductor device of a single wafer size without dividing the wafer stack formed by the stacked semiconductor wafers. However, needless to say, it may be used as a plurality of three-dimensional stacked semiconductor devices of a smaller size than the wafer size by appropriately dicing the wafer stack along the directions perpendicular to the support substrate 40 (i.e., along the stacking direction) to divide the stack into parts.

Second Embodiment

FIGS. 8(a) to 13(i) are partial cross-sectional views showing a method of fabricating a semiconductor device having a three-dimensional stacked structure according to a second embodiment of the invention, respectively. This second embodiment is an example where semiconductor chips are stacked to fabricate a semiconductor device having a three-dimensional stacked structure.

In the above-described first embodiment, each of the first and second semiconductor circuit layers 1a and 2a is constituted by a Si wafer. In this second embodiment, however, each of first and second semiconductor circuit layers 1a' and 2a' is constituted by a plurality of Si chips arranged in a plane, which is different from the first embodiment. Here, to simplify the explanation, it is supposed that the first semiconductor circuit layer 1a' is constituted by two Si chips 51a and 52a arranged in a plane and the second semiconductor circuit layer 2a' is constituted by two Si chips 61a and 62a arranged in a plane, as shown in FIG. 13(i).

First, a first semiconductor circuit layer 1 having the structure shown in FIG. 2(d) is formed in the same manner as the first embodiment. Then, dicing is applied to the first semiconductor circuit layer 1 by a known method, resulting in two Si chips 51 and 52 shown in FIG. 8(a). The dicing is performed along the directions perpendicular to the Si substrate 11 (i.e., along the stacking direction). It is needless to say that the Si chips 51 and 52 may be fabricated by another method than this.

Subsequently, by utilizing the microbump electrodes 37 formed on the surfaces of the multilayer wiring structures 30 of the Si chips 51 and 52, the Si chips 51 and 52 are respectively fixed (mechanically connected) on one surface of the support substrate 40 at the predetermined positions. As the support substrate 40, for example, glass, single-crystal Si wafer, or the like may be preferably used; here, a Si wafer into which semiconductor circuits are incorporated is used. The Si chips 51 and 52 are electrically connected to the semiconductor circuits formed in the support substrate 40 made of a Si wafer by the microbump electrodes 37.

Only one of the microbump electrodes 37 for connecting the Si chip 51 is shown in FIG. 8(a). However, needless to say, the Si chip 51 is practically connected by a lot of microbump electrodes 37. This point is applicable to the Si chip 5.

In this state, there are gaps between the multilayer wiring structures 30 of the Si chips 51 and 52 and the support substrate 40, respectively, each of which corresponds to the thicknesses of the microbump electrodes 37. Therefore, similar to the first embodiment, the gaps are filled with the electrically insulative adhesive 53 and then, the adhesive 53 thus filled is cured. However, unlike the first embodiment, to enhance the adhesion strength of the adhesive 53 and to fill the gaps between the Si chips 51 and 52, the thickness of the adhesive 53 is set to be sufficiently large. In this way, as shown in FIG. 8(b), the Si chips 51 and 52 are buried in the adhesive 53 except for the parts of the chips 51 and 52 on their back sides. As the adhesive 53, a polyimide resin, an epoxy resin or the like may be used. Thus, finally, the Si chips 51 and 52 are connected electrically and mechanically to the support substrate 40 by the adhesive 53 and the microbump electrodes 37. In this way, the first semiconductor circuit layer 1' including the chips 51 and 52 is formed.

In addition, when the support substrate 40 is made of a glass or a semiconductor wafer comprising no semiconductor circuits, the microbump electrodes 37 are used for only mechanical connection between the Si chips 51 and 52 and the support substrate 40.

Subsequently, while holding the Si chips 51 and 52 together by using the support substrate 40, the back sides (the second main surface sides) of the chips 51 and 52 are polished by a CMP method until the distances from the lower ends of the trenches 13 inside are equal to approximately 1 μm, thereby reducing the thicknesses of the whole chips 51 and 52 11. The chips 51 and 52 thus thinned by polishing will be labeled 51a and 52a below, respectively. The first semiconductor circuit layer 1' thus thinned by polishing will be labeled 1a' below.

Next, the back sides of the Si substrates 11 of the chips 51a and 52a are selectively removed by isotropic etching such as wet etching or plasma etching, thereby exposing the SiO$_2$ films 14 in the trenches 13, as shown in FIG. 9(c). The amount of etching at this time is adjusted such that the lower ends of the conductive plugs 15 in the trenches 13 protrude from the backs of the substrates 11 at predetermined distances after the end of the etching, and such that the exposed surface of the adhesive 53 is flush with the backs of the substrates 11.

Following this, as shown in FIG. 9(d), a SiO$_2$ film 41 with a thickness of approximately 0.2 μm is formed on the backs of the substrates 11 and the SiO$_2$ films 14 exposed from the backs by a known method such as CVD. Subsequently, by polishing the SiO$_2$ film 41 thus formed and the exposed SiO$_2$ films 14 by a CMP method until the lower ends of the conductive plugs 15 are exposed, the SiO$_2$ films 14 are selectively removed along with the SiO$_2$ film 41, thereby exposing the lower ends of the conductive plugs 15, as shown in FIG. 10(e). The remaining SiO$_2$ film 41 covers the areas excluding the plugs 15 on the backs of the substrates 11 of the respective chips 51a and 52a, and the exposed surface of the adhesive 53. The remaining SiO$_2$ film 41 and the plugs 15 are even with each other. In other words, the whole back of the first semiconductor circuit layer 1a' formed by the chips 51a and 52a is flat.

Thereafter, microbump electrodes 42 are formed on the exposed lower ends of the respective conductive plugs 15 by a known method, as shown in FIG. 10(f). These microbump electrodes 42 may be formed by the same manner as described in the first embodiment.

Next, two Si chips 61 and 62 that constitute a second semiconductor circuit layer 2a' are respectively fixed at the predetermined positions on the backs of the chips 51a and 52a that constitute the first semiconductor circuit layer 1a', as shown in FIG. 11(g). Here, since the Si chips 61 and 62 have approximately the same structures as the Si chips 51 and 52, respectively, explanation about the same structure is omitted by attaching the same reference symbols as used for the Si chips 51 and 52 to the corresponding elements. In addition, needless to say, the Si chips 61 and 62 may have different structures from those of the Si chips 61 and 62 according to the necessity, respectively, On the surfaces of the multilayer wiring structures 30 of the Si chips 61 and 62, microbump electrodes 43 are respectively formed at the corresponding positions to the microbump electrodes 42 that have been formed on the backs of the Si chips 51a and 52a, as shown in FIG. 11(g). The microbump electrodes 43 are joined to the corresponding microbump electrodes 42 by welding; however, it is needless to say that this joining may be performed by any other method. In this way, the Si chips 61 and 62 constituting the second semiconductor circuit layer 2' are respectively fixed to the back sides of the Si chips 51a and 52a constituting the first semiconductor circuit layer 1a' and at the same time, electrical interconnection between these two circuit layers 1a' and 2' is performed. At this time, a gap which corresponds to the sum of the thicknesses of the electrodes 42 and 43 is generated between the circuit layers 1a' and 2', as shown in FIG. 11(g).

Next, as shown in FIG. 12(h), the gap between the first and second semiconductor circuit layers 1a' and 2' is filled with an electrically insulative adhesive 44 by an injection method or the like and then, the adhesive 44 thus injected is cured. At this time, to enhance the adhesion strength by the adhesive 44 and to fill the gap between the Si chips 61 and 62, the thickness of the adhesive 44 is set sufficiently large. In this way, the Si chips 61 and 62 excluding their parts on the back sides thereof are buried in the adhesive 44, as shown in FIG. 12(h). Thus, the mechanical and electrical connection between the Si chips 51a and 52a constituting the first semiconductor circuit layer 1a' and the Si chips 61 and 62 constituting the second semiconductor circuit layer 2' is completed. As the adhesive 44, a polyimide resin or an epoxy resin may be used.

Thereafter, the lower parts of the Si substrates 11 of the Si chips 61 and 62 of the second semiconductor circuit layer 2' are polished by a mechanical polishing method and a CMP method until the distances from the bottom ends of the trenches 13 are equal to, for example, approximately 1 μm, thereby reducing the thicknesses of the substrates 11. The Si chips 61 and 62 thus thinned will be respectively labeled 61a and 62a later. The second semiconductor circuit layer 2' thus thinned by polishing will be labeled 2a' later.

Next, the lower parts of the substrates 11 of the Si chips 61a and 62a forming the second semiconductor circuit layer 2a' are selectively removed in the same manner as used for the Si chips 51a and 52a forming the first semiconductor circuit layer 1a', thereby exposing the $SiO_2$ films 14 in the trenches 13. Then, the $SiO_2$ films 14 are selectively removed to expose the lower ends of the conductive plugs 15. Moreover, the microbump electrodes 42 are respectively formed on the exposed lower ends of the plugs 15. In this way, the second semiconductor circuit layer 2a' has the structure shown in FIG. 13(i). The second semiconductor circuit layer 2a' (i.e., the Si chips 61a and 62a) shown in FIG. 13(i) is in substantially the same state as the first semiconductor circuit layer 1a' (i.e., the Si chips 51a and 52a) shown in FIG. 10(f).

When the semiconductor device has the two-layer structure formed by the first and second semiconductor circuit layers 1a' and 2a', the microbump electrodes 42 formed on the back of the second semiconductor circuit layer 2a' (i.e., the Si chips 61a and 62a) are used as the microbump electrodes for connection to external circuits. When the semiconductor device further comprises the third semiconductor circuit layer or higher semiconductor circuit layer or layers, the third, fourth, fifth . . . semiconductor circuit layers (not shown) are stacked and fixed together in the same manner as described above, thereby fabricating a semiconductor device with a three-dimensional stacked structure.

With the method of fabricating a semiconductor device according to the second embodiment of the invention, as explained above, first, the trenches 13 are formed at the predetermined positions in the Si substrates 11 of the Si chips 51 and 52 that constitute the first semiconductor circuit layer 1 from the surface side of the substrates 11. The respective trenches 13 have the predetermined depths, and the inner wall faces of the trenches 13 are respectively covered with the $SiO_2$ films 14. Then, the insides of the trenches 13 are filled with the conductive material from the surface sides of the substrates 11, thereby forming the conductive plugs 15. Next, to form the desired circuits, the desired semiconductor elements (here, the MOS transistors) are formed on the surfaces of the substrates 11, from the surface sides of the substrates 11, in such a way as not to be overlapped with the trenches 13 (i.e., the conductive plugs 15). Thereafter, the multilayer wiring structures 30 are formed over the surfaces of the substrates 11 through the interlayer insulating films 19, and the microbump electrodes 37 are formed on the surfaces of the multilayer wiring structures 30, where the microbump electrodes 37 are electrically connected to the respective conductive plugs 15. Using the microbump electrodes 37, the Si chips 51a and 52a each having the multilayer wiring structure 30 are fixed at the predetermined positions on one surface of the support substrate 40. Subsequently, the Si chips 51a and 52a fixed to the support substrate 40 are selectively removed from the back sides thereof to be thinned, thereby exposing the $SiO_2$ films 14 covering the inner wall faces (the exposed faces) of the trenches 13 to the back sides of the Si chips 51a and 52a. Following this, the conductive plugs 15 are exposed to the back sides of the Si chips 51a and 52a by selectively removing the $SiO_2$ films 14 that have been exposed to the back sides of the Si chips 51a and 52a. Then, the microbump electrodes 42 are respectively formed on the exposed ends of the conductive plugs 15. This point is applicable to the second semiconductor circuit layer 2 and the third, fourth, fifth . . . semiconductor circuit layers.

Each of these steps can be performed by using a known process or processes (e.g., a CVD, isotropic etching, mechanical polishing, or CMP process). Moreover, the electrical interconnection between the microbump electrodes 37 formed on the surfaces of the multilayer wiring structures 30 and the conductive plugs 15 formed in the trenches 13 of the Si chips 51a and 52a and exposed to the back sides of the substrates 11 is performed by utilizing the metal wiring lines existing in the wiring structures 30 and the wiring films 20 formed on the surfaces of the interlayer insulating films 19. Therefore, the wiring lines in the wiring structures 30 (i.e., the wiring layers 32, 33, and 34 and the conductors 35 and 36), the wiring films 20, and the conductive plugs 15 will be "buried interconnections" that penetrate through the first semiconductor circuit layer 1a' (i.e., the chips 51a and 52a) along the stacking direction. Accordingly, the electrical interconnection between the support substrate 40 and the first semiconductor circuit layer 1a' (i.e., the chips 51a and 52a) (or, between the first semiconductor circuit layer 1a' and the second semiconductor circuit layer 2a' (i.e., the chips 61a and 62a), or between the second semiconductor circuit layer 2a' and the next semiconductor circuit layer adjoining thereto, and so on)) along the stacking direction can be easily realized by using the buried interconnections and the microbump electrodes 37 (or the microbump electrodes 42 and 43).

Besides, with the method of fabricating a semiconductor device according to the second embodiment of the invention, the formation of the trenches 13 and the filling of the trenches 13 with the conductive material are carried out from the surface side (the first main surface side) of the Si substrates 11 of the respective chips 51, 52, 61 and 62, and the trenches 13 do not penetrate through the multilayer wiring structures 30 and the interlayer insulating films 19. Therefore, this fabrication method is preferably applicable to the case where the formation of the trenches 13 and the filling of the conductive material from the back side (the second main surface side) of the substrates 11 is impossible, or the case where the formation of the trenches 13 that penetrate through the wiring structure 30 is impossible or difficult. In other words, this method can cope with the restrictions due to the layout of the first semiconductor circuit layer 1a' and/or the layout of the wiring lines in the wiring structures 30. This is similarly applied to the second semiconductor circuit layer 2a and the subsequent semiconductor circuit layer(s).

In addition, in the above-described embodiment, the first semiconductor circuit layer 1a' (i.e., the chips 51a and 52a) and the second semiconductor circuit layer 2a' (i.e., the chips 61a and 62a) are successively stacked and fixed below the support substrate 40. However, needless to say, the first semiconductor circuit layer 1a' and the second semiconductor circuit layer 2a' may be successively stacked and fixed on the support substrate 40 by turning the support substrate 40 upside down.

Furthermore, the three-dimensional stacked semiconductor device having the above-described structure may be used in its as-is status. However, it may be divided into a plurality of parts by dicing the device along the directions perpendicular to the support substrate 40 (i.e., along the stacking direction) and used. In this case, each of the parts formed by dividing will be a three-dimensional stacked semiconductor device.

Each of the first and second semiconductor circuit layers 1a' and 2a' may be constituted by a single Si chip (i.e., a single chip-shaped Si substrate or Si member).

Third Embodiment

FIGS. 14(a) to 16(f) are partial cross-sectional views showing a method of fabricating a semiconductor device having a three-dimensional stacked structure according to a third embodiment of the invention, respectively. In the above-described first and second embodiments, the trenches and the conductive materials filled therein penetrate through only the Si substrate and do not penetrate through the multilayer wiring structure. In this third embodiment, however, the trenches and the conductive materials filled therein penetrate through not only the Si substrate but also the multilayer wiring structure. The third embodiment is different from the first and second embodiments at this point. In addition, explanation will be made here using a Si wafer; however, it is needless to say that the Si wafer may be replaced with one Si chip or two or more Si chips like the second embodiment.

First, as shown in FIG. 14(a) a wafer 11 made of single crystal Si (Si wafer) is prepared as a semiconductor substrate. Next, an insulating film 12 is formed on the surface (the first main surface) of the wafer 11, covering the whole surface of the wafer 11 with the $SiO_2$ film 12. The state at this time is shown in FIG. 14(a).

Next, in the areas on the surface of the substrate 11 where trenches 13 are not to be formed, in other words, at the positions on the surface of the substrate 11 that will not overlap with the trenches 13, a necessary count of MOS transistors are formed by a known method, resulting in a desired circuit. Each of the MOS transistors is constituted by a pair of source/drain regions 16 formed apart from each other in the substrate 11, and a gate electrode 18 formed on a gate insulating film 12b between the source/drain regions 16. The gate insulating film 12b is formed by a $SiO_2$ film formed in a separate process from that of the $SiO_2$ film 12. Specifically, the $SiO_2$ film 12 is selectively removed in the areas where the gate insulating films 12b are to be formed and thereafter, a $SiO_2$ film is formed again in the same areas, resulting in the gate insulating films 12b. The state at this time is shown in FIG. 14(b).

Next, as shown in FIG. 15(c), an interlayer insulating film 19 is formed on the insulating film 12 over the whole surface of the substrate 11, thereby entirely covering the MOS transistors and the exposed surfaces from the MOS transistors. The interlayer insulating film 19 is formed by a known organic or inorganic insulative material. Moreover, the interlayer insulating film 19 is selectively etched to form penetrating holes that reach the desired source/drain regions 16. Next, the penetrating holes of the insulating film 19 corresponding to the source/drain regions 16 are filled with a conductive material by a known method. Thereafter, a conductive metal film (not shown) is formed on the insulating film 19 and then, the metal film is selectively etched to form a patterned metal wiring film 20. The metal wiring film 20 is divided into several wiring parts. In FIG. 15(c), one of the wiring parts is electrically connected to one of the source/drain regions 16 by way of the conductive material 21 embedded in a corresponding one of the penetrating holes of the interlayer insulating film 19.

Subsequently, a multilayer wiring structure 30A is formed on the metal wiring film 20 by a known method. The multilayer wiring structure 30A comprises an insulating material 31, three wiring layers 32, 33 and 34 embedded in the insulating material 31, and conductors 35, 36, and 38 which are mainly used for interlayer connection among the wiring layers 32, 33 and 34. The conductors 35, 36, and 38 are usually embedded in via holes formed in the insulating material 31; however, they are not limited to this. Although the insulating material 31 may be made of a single electrically insulative material, it is often that the insulating material 31 is made of a stack formed by layers of several different electrically insulative materials. Since the configuration, the material, and the formation method of the multilayer wiring structure 30A are known, detailed explanations for them are omitted here.

The Si substrate (Si wafer) 11 having the MOS transistors, and the multilayer wiring structure 30A formed on the substrate 11 constitute a first semiconductor circuit layer 1A.

Next, from the surface side of the multilayer wiring structure 30A, the multilayer wiring structure 30A, the metal wiring films 20, the interlayer insulating film 19, the $SiO_2$ film 12, and the Si substrate 11 are selectively etched by a known method, thereby forming trenches 13 having predetermined depths at the predetermined positions on the substrate 11. These trenches 13 penetrate through the multilayer wiring structure 30A along its vertical direction (along the thickness direction) to reach the inside of the substrate 11 deeply (usually, the trenches 13 enter the inside of the substrate 11 at a depth of approximately 30 to 50 μm from the surface of the substrate 11). However, the trenches 13 do not penetrate through the substrate 11. The trenches 13 are respectively arranged at the positions where the buried interconnections (the conductor plugs) are to be formed. Thereafter, the exposed faces (the inner wall faces) of the trenches 13 are covered with a $SiO_2$ film 14 by a known method (e.g., a CVD method). The $SiO_2$ film 14 covers the surface of the multilayer wiring structure 30A also.

Next, the respective trenches 13, the inner wall faces (the exposed faces) of which have been covered with the insulating film 14, are selectively filled with an appropriate conductive material from the surface side of the multilayer wiring structure 30A by a known method. For example, the method described in the first embodiment may be used for this purpose. Specifically, a conductive material film is deposited on the whole surface of the multilayer wiring structure 30A by a CVD method and thereafter, the part of the conductive material film located outside the trenches 13 is selectively removed by an etch back method or the combination of a mechanical polishing method and a CMP (Chemical Mechanical Polishing) method. Thus, conductive plugs 15 are formed in the respective trenches 13. As the conductive material used here, for example, a semiconductor such as silicon or a metal such as tungsten (W) may be used. The state at this time is shown in FIG. 15(d), where the upper ends of the respective conductive plugs 15 protrude above the surface of the multilayer wiring structure 30A. Thereafter, as shown in FIG. 16(e), microbump electrodes 37 are formed on the respective upper ends of the conductive plugs 15 protruding from the surface of the multilayer wiring structure 30A by a known method.

Following this, the first semiconductor circuit layer 1A is fixed to a support substrate 40 made of a Si wafer by utilizing the microbump electrodes 37 formed on the upper ends of the conductive plugs 15, as shown in FIG. 16(e). In other words, mechanical connection between the first semiconductor circuit layer 1A and the support substrate 40 is performed. The first semiconductor circuit layer 1A is electrically connected to the support substrate 40 by the microbump electrodes 37 as well.

In this state, there is a gap corresponding to the thickness of the microbump electrodes 37 between the multilayer wiring structure 30A and the support substrate 40. Then, the gap is filled with an electrically insulative adhesive 39, and the adhesive 39 thus filled is cured. As the adhesive 39, a polyimide resin, an epoxy resin or the like may be used. In this way, the first semiconductor circuit layer 1A is electrically and mechanically connected to the support substrate 40 by the adhesive 39 and the microbump electrodes 37. The state at this time is shown in FIG. 16(e).

In addition, when the support substrate 40 is formed by a glass, or a semiconductor wafer comprising no semiconductor circuits, the microbump electrodes 37 are used for only mechanical connection between the first semiconductor circuit layer 1A and the support substrate 40.

Subsequently, similar to the first embodiment, while holding the first semiconductor circuit layer 1A by using the support substrate 40, the back side (the second main surface side) of the Si substrate 11 is polished by a mechanical polishing method and a CMP method until the distances from the lower ends of the trenches 13 are equal to approximately 1 μm, thereby reducing the thickness of the entire substrate 11. The first semiconductor circuit layer 1A thus thinned by polishing will be labeled 1Aa later.

Next, similar to the first embodiment, the back side of the thinned Si substrate 11 is selectively removed by isotropic etching such as wet etching or plasma etching, thereby exposing the SiO$_2$ film 14 in the trenches 13. The amount of etching in this process is adjusted such that the lower ends of the conductive plugs 15 in the trenches 13 protrude from the back of the substrate 11 at a predetermined distance after the etching process is completed.

Following this, similar to the first embodiment, a SiO$_2$ film 41 with a thickness of approximately 0.2 μm is formed on the back of the substrate 11 and the exposed SiO$_2$ film 14 by a known method such as a CVD method. Next, the SiO$_2$ film 41 thus formed is polished by a CMP method to remove selectively the SiO$_2$ film 14 along with the SiO$_2$ film 41, thereby exposing the lower ends of the conductive plugs 15 in the trenches 13, as shown in FIG. 16(f). The remaining SiO$_2$ film 41 covers the areas on the back of the substrate 11 excluding the plugs 15 and the SiO$_2$ film 14, and the entire back of the substrate 11 is planarized. In other words, the whole back of the first semiconductor circuit layer 1Aa is flat.

Thereafter, microbump electrodes 42 are formed on the exposed lower ends of the respective conductive plugs 15 by a known method, as shown in FIG. 16(f). The formation method of the electrodes 42 is the same as described in the first embodiment.

Next, a second semiconductor circuit layer (not shown) is fixed on the back of the first semiconductor circuit layer 1Aa in the same way as the first embodiment.

When the semiconductor device has a two-layer structure of the first semiconductor circuit layers 1Aa and the unillustrated second semiconductor circuit layer, the microbump electrodes 42 formed on the back of the second semiconductor circuit layer are used as microbump electrodes for connection to external circuits. When the semiconductor device further comprises a third semiconductor circuit layer or a higher semiconductor circuit layer or layers, the third, fourth, fifth . . . semiconductor circuit layers are stacked and fixed together according to the necessity, thereby fabricating a semiconductor device with a three-dimensional stacked structure.

With the method of fabricating a semiconductor device according to the third embodiment of the invention, as explained above, first, the desired semiconductor elements (here, the MOS transistors) are formed at the predetermined positions on the surface of the Si substrate (the Si wafer) 11 constituting the first semiconductor circuit layer 1Aa from the surface side of the substrate 11 and then, the multilayer wiring structure 30A is formed over the surface of the substrate 11 through the interlayer insulating film 19. Thereafter, the trenches 13 having the predetermined depths are formed from the surface side of the multilayer wiring structure 30A (i.e., the Si substrate 11). The trenches 13 penetrate through the multilayer wiring structure 30A and the interlayer insulating film 19 to reach the inside of the substrate 11, and the inner wall faces of the trenches 13 are covered with the SiO$_2$ film 14. The trenches 13 are formed in such a way as not to overlap with the MOS transistors. Next, the respective trenches 13 are filled with the appropriate conductive material from the surface side of the multilayer wiring structure 30A. Then, the microbump electrodes 37 are formed on the respective upper ends (i.e., the ends on the side of the structure 30A) of the conductive plugs 15. Using the microbump electrodes 37 thus formed, the substrate 11 having the multilayer wiring structure 30A is fixed to the support substrate 40. Subsequently, the substrate 11, which has been fixed to the support substrate 40, is selectively removed to be thinned from the back side of the substrate 11, thereby exposing the SiO$_2$ film 14 to the back side of the substrate 11. Following this, the SiO$_2$ film 14 exposed to the back side of the substrate 11 is selectively removed, thereby exposing the conductive plugs 15 to the back side of the substrate 11. Finally, the microbump electrodes 42 are formed on the exposed ends of the conductive plugs 15. This point is applicable to the second semiconductor circuit layer and the further semiconductor circuit layer or layers (not shown).

Each of these steps can be performed by using a known process or processes (e.g., a CVD, isotropic etching, mechanical polishing, or CMP process). Moreover, since the microbump electrodes 37 on the surface side of the multilayer wiring structure 30A are electrically connected directly to the conductive plugs 15 protruded to the same surface side, the conductive plugs 15 themselves in the trenches 13 will be the "buried interconnections" that penetrate through the first semiconductor circuit layer 1Aa along the stacking direction. Accordingly, the electrical interconnection between the support substrate 40 and the first semiconductor circuit layer 1Aa (or between the first semiconductor circuit layer 1Aa and the second semiconductor circuit layer, or between the second semiconductor circuit layer and the further semiconductor circuit layer adjoining thereto, and so on) along the stacking direction can be easily realized by using the buried interconnections and the microbump electrodes 37 (or the microbump electrodes 42 and 43).

Besides, with the method of fabricating a semiconductor device according to the third embodiment of the invention, the formation of the trenches 13 and the filling of the conductive material are carried out from the surface side of the multilayer wiring structure 30A (i.e., the Si substrate 11), and the trenches 13 penetrate through the structure 30A and the interlayer insulating film 19. Therefore, this fabrication method is preferably applicable to the case where the formation of the trenches 13 and the filling of the conductive material from the back side (the second main surface side) of the substrate 11 is impossible, or the case where the formation of the trenches 13 that penetrate through the wiring structure 30A is possible. This means that this method can cope with the restrictions due to the layout of the semiconductor elements and the wiring lines in the first semiconductor circuit layer 1Aa and the layout of the wiring lines in the structure 30A. This is similarly applied to the second semiconductor circuit layer 2a and the subsequent semiconductor circuit layer(s).

Fourth Embodiment

FIGS. 17(a) to 20(h) are partial cross-sectional views showing a method of fabricating a semiconductor device having a three-dimensional stacked structure according to a fourth embodiment of the invention, respectively. In the above-described first to third embodiments, the formation of the trenches and the filling of the trenches with the conductive material are performed from the surface side of the Si substrate 11 (the multilayer wiring structure 30 or 30A). In the fourth embodiment, unlike this, the formation of the trenches and the filling of the conductive material are performed from the back side of the Si substrate 11. In addition, explanation will be made here using a Si wafer; however, it is needless to say that the Si wafer may be replaced with one Si chip or two or more Si chips similar to the second embodiment.

First, as shown in FIG. 17(a), a Si wafer 11 is prepared as a semiconductor substrate. Next, an insulating film 12 is formed on the surface (the first main surface) of the wafer 11, covering the whole surface of the wafer 11 with the $SiO_2$ film 12.

Next, in the areas on the surface of the substrate 11 where trenches 13 are not to be formed, in other words, at the positions on the surface of the substrate 11 that will not overlap with the trenches 13, a necessary count of MOS transistors are formed by a known method, resulting in a desired circuit. Each of the MOS transistors is constituted by a pair of source/drain regions 16 formed apart from each other in the substrate 11, and a gate electrode 18 formed on a gate insulating film 12b between the source/drain regions 16. The gate insulating film 12b is formed by a $SiO_2$ film formed in a separate process from that of the $SiO_2$ film 12. Specifically, the $SiO_2$ film 12 is selectively removed in the areas where the gate insulating films 12b are to be formed and thereafter, a $SiO_2$ film is formed again in the same areas, resulting in the gate insulating films 12b.

Next, an interlayer insulating film 19 is formed on the insulating film 12 over the whole surface of the substrate 11, thereby entirely covering the MOS transistors and the exposed surfaces from the MOS transistors with the film 19. Moreover, the interlayer insulating film 19 is selectively etched to form penetrating holes that reach the desired source/drain regions 16. Next, the penetrating holes of the interlayer insulating film 19 corresponding to the source/drain regions 16 are filled with a conductive material 21. Thereafter, a conductive metal film (not shown) is formed on the interlayer insulating film 19 and then, the conductive metal film is selectively etched to form a patterned metal wiring film 20. The metal wiring film 20 is divided into several wiring parts. In FIG. 17(a), one of the wiring parts is electrically connected to one of the source/drain regions 16 by way of the conductive material 21 embedded in a corresponding one of the penetrating holes of the interlayer insulating film 19.

Subsequently, a multilayer wiring structure 30B is formed on the metal wiring film 20 by a known method. The multilayer wiring structure 30B comprises an insulating material 31, three wiring layers 32, 33 and 34 embedded in the insulating material 31, and conductors 35 and 36 which are mainly used for interlayer connection among the wiring layers 32, 33 and 34. Since the configuration, the material, and the formation method of the multilayer wiring structure 30B are the same as those of the multilayer wiring structure 30A in the first embodiment, detailed explanations for them are omitted here. Thereafter, the microbump electrodes 37 are formed on the surface of the multilayer wiring structure 30B by a known method. As described later, these electrodes 37 will be electrically connected to the conductive plugs 15 in the trenches 13 by way of the wiring lines in the structure 30B and the metal wiring film 20. The state at this time is shown in FIG. 17(a).

The Si substrate (the Si wafer) 11 having the MOS transistors, and the multilayer wiring structure 30B formed on the substrate 11 constitute a first semiconductor circuit layer 1B.

Subsequently, the first semiconductor circuit layer 1B is fixed (mechanically connected) to the support substrate 40 by utilizing the microbump electrodes 37 formed on the surface of the multilayer wiring structure 30B, as shown in FIG. 17(b). As the support substrate 40, for example, a glass, a single-crystal Si wafer, or the like may be preferably used; here, a Si wafer is used for this purpose. The first semiconductor circuit layer 1B is electrically connected to the semiconductor circuits formed in the support substrate 40 made of a Si wafer by the electrodes 37 also.

In this state, there is a gap corresponding to the thicknesses of the microbump electrodes 37 between the multilayer wiring structure 30B and the support substrate 40. Then, the gap is filled with an electrically insulative adhesive 39 and then, the adhesive 39 thus filled is cured. As the adhesive 39, a polyimide resin, an epoxy resin or the like may be used. In this way, the first semiconductor circuit layer 1B is electrically and mechanically connected to the support substrate 40 by the adhesive 39 and the electrodes 37. The state at this time is shown in FIG. 17(b).

In addition, when the support substrate 40 is formed by a glass, or a semiconductor wafer comprising no semiconductor circuits, the microbump electrodes 37 are used for only mechanical connection between the first semiconductor circuit layer 1B and the support substrate 40.

Thereafter, while holding the first semiconductor circuit layer 1B by using the support substrate 40, the back (the second main surface) of the Si substrate 11 is polished by a mechanical polishing method and a CMP method, thereby reducing the thickness of the whole substrate 11 to a predetermined value. The first semiconductor circuit layer 1B thus thinned by polishing will be labeled 1Ba later. The state at this time is shown in FIG. 18(c).

Next, after covering the whole back of the thinned substrate 11 with a $SiO_2$ film 45, trenches 13a are formed from the back side thereof by anisotropic etching such as plasma etching. Specifically, using a mask (not shown) having openings at the positions where the buried interconnections (the conductive plugs) are to be formed, the $SiO_2$ film 45 located on the back of the substrate 11 is selectively removed, thereby forming openings in the $SiO_2$ film 45 at the positions where the buried interconnections (the conductive plugs) are to be formed. Following this, using the same mask, the Si substrate 11 is selectively removed through the openings of the $SiO_2$ film 45, thereby forming the trenches 13a.

Moreover, using the same mask, the $SiO_2$ film 12 on the surface side of the substrate 11 is selectively removed through the openings of the $SiO_2$ film 45 and the trenches 13a, thereby forming openings in the $SiO_2$ film 12. The bottoms (the lower ends) of the respective trenches 13a thus formed from the back side of the substrate 11 are exposed downward through the corresponding openings of the SiO$_2$ film 45. The tops (the upper ends) of the trenches 13a are exposed upward through the corresponding openings of the SiO$_2$ film 12. As a result, as shown in FIG. 18(d), the lower ends of the metal wiring lines 20 are exposed to the lower side of the substrate 11 (the inside of the trenches 13a) by way of the trenches 13a.

Following this, a SiO$_2$ film 14 is deposited from the back side of the substrate 11 by a known method (e.g., a CVD method). Then, as shown in FIG. 19(e), the exposed surface of the SiO$_2$ film 45 covering the back of the substrate 11, the exposed faces of the inner walls of the trenches 13a, the exposed surface of the metal wiring film 20, the exposed surface of the interlayer insulating film 19, and the exposed surface of the SiO$_2$ film 12 are covered with the SiO$_2$ film 14.

Next, the SiO$_2$ film 14 is selectively removed by anisotropic etching from the back side of the substrate 11. At this time, the amount of etching is adjusted such that the SiO$_2$ film 14 on the exposed surface of the metal wiring film 20 and the exposed surface of the interlayer insulating film 19 is removed completely in the respective trenches 13a. Thus, as shown in FIG. 19(f), the SiO$_2$ film 14 is left on the inner wall side faces of the trenches 13a alone, resulting in the state where the back of the substrate 11 is covered with the SiO$_2$ film 45.

Next, the respective trenches 13a, the inner wall side faces of which have been covered with the SiO$_2$ film 14, are filled with an appropriate conductive material from the back side of the substrate 11 by a known method. For example, a conductive material film is deposited on the SiO$_2$ film 45 by a CVD method over the whole back of the Si substrate (the wafer) 11 and thereafter, the part of the conductive material film located on the SiO$_2$ film 45 is selectively removed, thereby leaving the conductive material film only in the trenches 13. Thus, the respective trenches 13a are filled with the conductive material. As the conductive material used here, for example, a semiconductor such as silicon or a metal such as tungsten (W) may be used. In this state, as shown in FIG. 20(g), the lower ends of the respective conductive plugs 15 are in the same plane as the exposed surface of the SiO$_2$ film 41, and the whole back of the substrate 11, i.e., the first semiconductor circuit layer 1Ba, is flat, where the lower ends of the conductive plugs 15 are exposed.

Following this, a SiO$_2$ film 41 with a thickness of approximately 0.2 μm is formed on the whole back of the substrate 11 by a known method such as a CVD method, thereby covering the whole back of the first semiconductor circuit layer 1Ba with the SiO$_2$ film 41. Then, the SiO$_2$ film 41 thus formed is selectively etched to form openings, thereby exposing the lower ends of the conductive plugs 15 formed in the trenches 13 by way of the corresponding openings of the SiO$_2$ film 41. Thereafter, microbump electrodes 42 are respectively formed on the exposed lower ends of the conductive plugs 15 through the corresponding openings of the SiO$_2$ film 41. Since the height of each microbump electrode 42 is greater than the thickness of the SiO$_2$ film 41, each microbump electrode 42 is protruded downward from the SiO$_2$ film 41. The formation method of the electrodes 42 is the same as described in the first embodiment. The state at this time is shown in FIG. 20(h).

Next, a second semiconductor circuit layer (not shown) is fixed to the back of the first semiconductor circuit layer 1Ba by the microbump electrodes 42 (and the microbump electrodes 43) in the same way as the first embodiment.

When the semiconductor device has a two-layer structure formed by the first semiconductor circuit layer 1Ba and the unillustrated second semiconductor circuit layer, the microbump electrodes 42 formed on the back of the second semiconductor circuit layer are used as microbump electrodes for connection to external circuits. When the semiconductor device further comprises the third semiconductor circuit layer or higher semiconductor circuit layer or layers, the third, fourth, fifth . . . semiconductor circuit layers are stacked and fixed together according to the necessity in the same manner as described above, thereby fabricating a semiconductor device with a three-dimensional stacked structure.

With the method of fabricating a semiconductor device according to the fourth embodiment of the invention, as explained above, first, the desired MOS transistors are formed on the surface (the first main surface) of the Si substrate (the wafer) 11 constituting the first semiconductor circuit layer 1B from the surface side of the substrate 11 to result in the desired circuit and then, the multilayer wiring structure 30B is formed over the MOS transistors by way of the interlayer insulating film 19. Next, the microbump electrodes 37 electrically connected to the wiring lines in the multilayer wiring structure 30B are formed on the surface of the structure 30B. Using the microbump electrodes 37 thus formed, the substrate 11 comprising the structure 30B is fixed to the support substrate 40. After thinning the substrate 11, the trenches 13a are formed to penetrate through the substrate 11 toward its surface (the first main surface) from the back side (the second main surface side) of the substrate 11. The inner wall faces of the trenches 13a thus formed are covered with the insulating film 14 and then, the trenches 13a are filled with the conductive material from the back side of the substrate 11, thereby forming the conductive plugs 15 electrically connected to the wiring lines in the multilayer wiring structure 30B. This point is applicable to the second semiconductor circuit layer and the further semiconductor circuit layer or layers (not shown).

Each of these steps can be performed by using a known process or processes (e.g., a CVD, isotropic etching, mechanical polishing, or CMP process). Moreover, the trenches 13a and the conductive plugs 15, which penetrate through the substrate 11, are electrically connected to the wiring lines in the multilayer wiring structure 30B by way of the metal wiring film 20 formed on the surface of the substrate 11. Further, the wiring lines in the multilayer wiring structure 30B are electrically connected to the microbump electrodes 30B formed on the surface of the structure 30B. Therefore, the conductive plugs 15 in the trenches 13a, the metal wiring film 20, and the wiring lines in the structure 30B will be "buried interconnections" that penetrate through the first semiconductor circuit layer 1Ba along the stacking direction (along the thickness direction). Accordingly, the electrical interconnection between the support substrate 40 and the first semiconductor circuit layer 1Ba (or between the first semiconductor circuit layer 1Ba and the second semiconductor circuit layer, or between the second semiconductor circuit layer and the further semiconductor circuit layer adjoining thereto, and so on) along the stacking direction can be easily realized by using the buried interconnections and the microbump electrodes 37 (or the microbump electrodes 42 and 43).

Besides, with the method of fabricating a semiconductor device according to the fourth embodiment of the invention, the formation of the trenches 13a and the filling of the trenches 13a with the conductive material are carried out from the back side (the second main surface side) of the Si substrate 11. Therefore, this fabrication method is preferably applicable to the case where the formation of the trenches 13a and the filling of the conductive material from the surface side (the first main surface side) of the substrate 11 is impossible, or the case where the formation of the trenches 13 that penetrate through the wiring structure 30 is impossible or difficult. This means that this method can cope with the restrictions due to the layout of the semiconductor elements and the wiring lines in the first semiconductor circuit layer 1Ba and/or the layout of the wiring lines in the structure 30B. This is applicable to the second semiconductor circuit layer and the subsequent semiconductor circuit layer(s).

Fifth Embodiment

FIGS. 21(a) to 21(c) are partial cross-sectional views showing a method of fabricating a semiconductor device having a three-dimensional stacked structure according to a fifth embodiment of the invention, respectively. This fifth embodiment corresponds to the first variation of the above-described first embodiment, where the order of the formation of the MOS transistors and that of the formation of the trenches and the conductive plugs are reversed in the above-described first embodiment. Specifically, the formation of the trenches and the conductive plugs is performed before the formation of the MOS transistors in the first embodiment; on the other hand, the formation of the MOS transistors is performed before the formation of the trenches and the conductive plugs in the fifth embodiment. These two embodiments are different from each other at this point and they are the same at the other points.

First, as shown in FIG. 21(a), a $SiO_2$ film 12 is formed on the surface (the first main surface) of a Si wafer 11 as a substrate, covering the whole surface of the wafer 11 with the $SiO_2$ film 12. Next, in the areas on the surface of the substrate 11 where trenches 13 are not to be formed, in other words, at the positions on the surface of the substrate 11 that will not overlap with the trenches 13, a necessary count of MOS transistors are formed by a known method, resulting in a desired circuit. Each of the MOS transistors is constituted by a pair of source/drain regions 16 formed apart from each other in the substrate 11, a gate insulating film 12b formed between the source/drain regions 16, and a gate electrode 18 formed on the gate insulating film 12b. The gate insulating film 12b is formed by a $SiO_2$ film formed in a separate process from that of the $SiO_2$ film 12. Specifically, the $SiO_2$ film 12 is selectively removed in the areas where the gate insulating films 12b are to be formed and thereafter, a $SiO_2$ film is formed again in the same areas, resulting in the gate insulating films 12b. The state at this time is shown in FIG. 21(b).

After the MOS transistors are formed in this way, the Si substrate 11 and the $SiO_2$ film 12 are selectively etched by a known method from the surface side of the substrate 11, thereby forming the trenches 13 having predetermined depths at predetermined positions on the substrate 11. Then, the inner wall faces of the trenches 13 are covered with a $SiO_2$ film 14 by a thermal oxidation method, and each of the trenches 13 thus formed is filled with a conductive material from the surface side of the substrate 11, resulting in conductive plugs 15.

The subsequent process steps, i.e., the formation of an interlayer insulating film 19 and the formation of a multilayer wiring structure 30, are the same as those of the first embodiment. Therefore, the explanation about them is omitted here.

The method of fabricating a semiconductor device according to the fifth embodiment is the same as that of the first embodiment except that the order of the formation of the MOS transistors and the order of the formation of the trenches and the conductive plugs are reversed. Therefore, it is apparent that the method of the fifth embodiment has the same advantages as those of the first embodiment.

Sixth Embodiment

FIG. 22 is a partial cross-sectional view showing a method of fabricating a semiconductor device having a three-dimensional stacked structure according to a sixth embodiment of the invention. This sixth embodiment corresponds to the second variation of the above-described first embodiment, where microbump electrodes 42a are formed directly on the ends of conductive plugs 15 by an electroless plating method or a selective CVD method instead of the microbump electrodes 42 formed on the lower ends of the conductive plugs 15 in the trenches 13 in the first embodiment. The sixth embodiment is the same as the first embodiment at the other points.

Specifically, in the sixth embodiment, if a conductive material for the conductive plugs 15 is selected appropriately and a metal film is formed on the back of the first semiconductor circuit layer 1a by an electroless plating method, the metal film can be selectively grown on only the end faces of the conductive plugs 15. In other words, the microbump electrodes 42a made of the metal film are formed in self-alignment on the lower end faces of the respective conductive plugs 15.

As the conductive material for the conductive plugs 15 which is suitable for the electroless plating method, Ni, Cu, Sn, Ag, Au, Ti, Pt or Ta, or an alloy made of two or more of these metals, or stacked films comprising subfilms made of two or more of these metals and/or alloys.

This is applied to the case where a selective CVD method is used. Specifically, if a conductive film for the conductive plugs 15 is selected appropriately and then, the conductive film thus selected, which is made of a metal or made of a material other than metals, is grown on the back of the first semiconductor circuit layer 1a by a selective CVD method, the conductive film will grow selectively on only the end faces of the conductive plugs 15. In this way, the microbump electrodes 42a are formed in self-alignment on the end faces of the conductive plugs 15.

As the conductive material for the conductive plugs 15 which is suitable for the selective CVD method, Cu, Ni, W, Ti, Ta, TiN, TaN, or an alloy made of two or more of these metals, or stacked films comprising subfilms made of two or more of these metals and/or alloys.

Accordingly, it is apparent that the method of fabricating a semiconductor device according to the sixth embodiment has the same advantages as those of the above-described first embodiment.

Seventh Embodiment

FIGS. 23(a) to 25(e) are partial cross-sectional views showing a method of fabricating a semiconductor device having a three-dimensional stacked structure according to a seventh embodiment of the invention. This seventh embodiment corresponds to the third variation of the above-described first embodiment, where the microbump electrodes 42 are formed in a different way from that of the first embodiment. Specifically, after the process steps shown in FIGS. 1(a) to 3(g) are performed in the same manner as that of the first embodiment, the subsequent process steps shown in FIGS. 23(b) to 25(e) are performed successively.

First, the structure shown in FIG. 23(a) (which is the same as that of FIG. 3(f)) is formed in the same way as the first embodiment. Next, a $SiO_2$ film 41 is formed on the back of the Si substrate 11 and the $SiO_2$ film 14 exposed from the back, as shown in FIG. 23(b). In the first embodiment, the $SiO_2$ film 41 is polished by a CMP method immediately after this state, thereby selectively removing the $SiO_2$ film 14 along with the $SiO_2$ film 41. In this way, the lower ends of the conductive plugs 15 in the trenches 13 are exposed, as shown in FIG. 4(h). On the other hand, in the seventh embodiment, a resist film 60 as a planarization film is formed on the $SiO_2$ film 41 thus formed. Thus, the unevenness on the back of the first semiconductor circuit layer 1a is eliminated by the resist film 60 and as a result, the back of the first semiconductor circuit layer 1a is planarized, as shown in FIG. 23(*b*).

Thereafter, the resist film (the planarization film) 60 is selectively etched by an etch-back method, thereby exposing the SiO$_2$ film 41 from the resist film 60 at the lower ends of the respective conductive plugs 15, as shown in FIG. 24(*c*). At this time, the resist film 60 is left on the SiO$_2$ film 41 outside the conductive plugs 15 and the SiO$_2$ film 14.

Then, using the remaining resist film 60 on the SiO$_2$ film 41 as a mask, the SiO$_2$ film 14 and the SiO$_2$ film 41 located above the film 14 are selectively removed, thereby exposing the lower ends of the conductive plugs 15 in the trenches 13, as shown in FIG. 24(*d*). In this state, the lower ends of the respective conductive plugs 15 are in the same level as the SiO$_2$ film 41 and the resist film 60, where the whole back of the substrate 11, i.e., the first semiconductor circuit layer 1a, is flat.

Following this, the microbump electrodes 42 are formed on the exposed lower ends of the respective conductive plugs 15, as shown in FIG. 25(*e*). As the formation method of the electrodes 42, the method used in the above-described first or sixth embodiment may be used. The remaining SiO$_2$ film 41 and the remaining resist film 60 provide electrical insulation action from the second semiconductor circuit layer (not shown).

In addition, the remaining resist film 60 may be removed in the state of FIG. 24(*d*). In this case, the remaining SiO$_2$ film 41 provides electrical insulation action from the second semiconductor circuit layer (not shown). Due to the removal of the remaining resist film 60, a gap is generated in the area where the resist film 60 has existed. However, no problem will occur. This is because the gap is filled with an adhesive when the first semiconductor circuit layer 1a is fixed to the second semiconductor circuit layer (not shown).

It is apparent that the method of fabricating a semiconductor device according to the seventh embodiment has the same advantages as those of the first embodiment.

Eighth Embodiment

FIG. 26 is a partial cross-sectional view showing a method of fabricating a semiconductor device having a three-dimensional stacked structure according to an eighth embodiment of the invention, which corresponds to FIG. 2(*d*). This eighth embodiment corresponds to the fourth variation of the above-described first embodiment, where the first semiconductor circuit layer does not comprise the multilayer wiring structure 30. The method of the eighth embodiment is the same as that of the first embodiment at the other points.

In any one of the above-described first to seventh embodiments, the first semiconductor circuit layer comprises a multilayer wiring structure; however, the present invention is not limited to such the structure. The eighth embodiment is shown as an example comprising no multilayer wiring structure. Although the eighth embodiment is explained here as still another variation of the first embodiment, the structure of the eighth embodiment may be applied to a variation of any one of the second to seventh embodiments.

In the eighth embodiment, as shown in FIG. 26, a first semiconductor circuit layer 1" does not comprise the multilayer wiring structure 30. A patterned metal wiring film 20 (which is a conductive film for electrical connection between the MOS transistors and the conductive plugs 15 and which is not included in the multilayer wiring structure 30) is formed on the interlayer insulating film 19 located on the surface of the Si substrate 11 that constitutes the first semiconductor circuit layer 1". The metal wiring film 20 is covered with another interlayer insulating film 19a formed on the interlayer insulating film 19. The surface of the interlayer insulating film 19a is planarized, on which microbump electrodes 37 are formed. The microbump electrodes 37 are respectively connected to the corresponding parts of the metal wiring film 20 by way of conductors 35a. Accordingly, the surface of the substrate 11 is covered with the two interlayer insulating films 19 and 19a in the eighth embodiment.

Needless to say, the structure of FIG. 26 is applicable to the second semiconductor circuit layer and the subsequent semiconductor circuit layer or layers.

As seen from the above, in the present invention, it is sufficient that the semiconductor circuit layer that constitutes one of the semiconductor circuit layers of the three-dimensional stacked semiconductor device comprises a semiconductor substrate and an element or a circuit formed in the semiconductor substrate or on the surface thereof. This means that the semiconductor circuit layer may or may not comprise a single-layer wiring structure or a multilayer wiring structure.

VARIATIONS

The above-described first to eighth embodiments are disclosed to show concrete examples of the invention. Therefore, needless to say, the invention is not limited to these embodiments, and various modifications thereof are possible without departing from the spirit of the invention. For example, although microbump electrodes are used in each of the above-described embodiments, the microbump electrodes may be omitted if the ends of the conductive materials filled in the trenches can be functioned as microbump electrodes. Moreover, the microbump electrodes located on the adjoining semiconductor circuit layers are bonded to each other by welding in each of the above-described first to seventh embodiments; however, the invention is not limited to this. The joining operation by welding may be impossible or difficult according to the material of the microbump electrodes. In such a case, it is needless to say that the microbump electrodes may be bonded to each other using a bonding metal (e.g., a solder alloy).

Moreover, in the above-described first to eighth embodiments, explanation is chiefly made for the case where the first semiconductor circuit layer is fixed to the support substrate; however, the invention is not limited to this. For example, if the invention is applied to the second semiconductor circuit layer, the second semiconductor circuit layer will be fixed to the first semiconductor circuit layer adjacent thereto.

Furthermore, in the above-described first to eighth embodiments, explanation is made for the case where each of the semiconductor circuit layers is formed by a single semiconductor wafer and the case where each of the semiconductor circuit layers is formed by a plurality of semiconductor chips. However, the invention is not limited to these cases. For example, at least one of the semiconductor circuit layers may be formed by a single semiconductor wafer while each of the remaining semiconductor circuit layers may be formed by a plurality of semiconductor chips. When one of the semiconductor circuit layers is formed by a plurality of semiconductor chips, it is unnecessary that every semiconductor chip includes an electronic circuit. In other words, some of the semiconductor chips may be "dummy chips" each of which does not include an electronic circuit (or, each of which includes an electronic circuit unused). In addition, when one of the semiconductor circuit layers is formed by a single semiconductor wafer, the semiconductor wafer may include a "dummy region" where no electronic circuit is formed (or, where an electronic circuit is formed but unused).

BRIEF DESCRIPTION OF THE DRAWINGS

FIGS. 1(a) to 1(c) are partial cross-sectional views showing the process steps of a method of fabricating a semiconductor device having a three-dimensional stacked structure according to a first embodiment of the invention, respectively.

FIGS. 2(d) to 2(e) are partial cross-sectional views showing the process steps of the method of fabricating the semiconductor device having a three-dimensional stacked structure according to the first embodiment of the invention, respectively, which is subsequent to FIG. 1(c).

FIGS. 3(f) to 3(g) are partial cross-sectional views showing the process steps of the method of fabricating the semiconductor device having a three-dimensional stacked structure according to the first embodiment of the invention, respectively, which is subsequent to FIG. 2(e).

FIGS. 4(h) to 4(i) are partial cross-sectional views showing the process steps of the method of fabricating the semiconductor device having a three-dimensional stacked structure according to the first embodiment of the invention, respectively, which is subsequent to FIG. 3(g).

FIG. 5(j) is a partial cross-sectional view showing the process step of the method of fabricating the semiconductor device having a three-dimensional stacked structure according to the first embodiment of the invention, which is subsequent to FIG. 4(i).

FIG. 6(k) is a partial cross-sectional view showing the process step of the method of fabricating the semiconductor device having a three-dimensional stacked structure according to the first embodiment of the invention, which is subsequent to FIG. 5(j).

FIG. 7(l) is a partial cross-sectional view showing the process step of the method of fabricating the semiconductor device having a three-dimensional stacked structure according to the first embodiment of the invention, which is subsequent to FIG. 6(k).

FIGS. 8(a) to 8(b) are partial cross-sectional views showing the process steps of a method of fabricating a semiconductor device having a three-dimensional stacked structure according to a second embodiment of the invention, respectively.

FIGS. 9(c) to 9(d) are partial cross-sectional views showing the process steps of the method of fabricating the semiconductor device having a three-dimensional stacked structure according to the second embodiment of the invention, respectively, which is subsequent to FIG. 8(b).

FIGS. 10(e) to 10(f) are partial cross-sectional views showing the process steps of the method of fabricating the semiconductor device having a three-dimensional stacked structure according to the second embodiment of the invention, respectively, which is subsequent to FIG. 9(d).

FIG. 11(g) is a partial cross-sectional view showing the process step of the method of fabricating the semiconductor device having a three-dimensional stacked structure according to the second embodiment of the invention, which is subsequent to FIG. 10(f).

FIG. 12(h) is a partial cross-sectional view showing the process step of the method of fabricating the semiconductor device having a three-dimensional stacked structure according to the second embodiment of the invention, which is subsequent to FIG. 11(g).

FIG. 13(i) is a partial cross-sectional view showing the process step of the method of fabricating the semiconductor device having a three-dimensional stacked structure according to the second embodiment of the invention, which is subsequent to FIG. 12(h).

FIGS. 14(a) to 14(b) are partial cross-sectional views showing the process steps of a method of fabricating a semiconductor device having a three-dimensional stacked structure according to a third embodiment of the invention, respectively.

FIGS. 15(c) to 15(d) are partial cross-sectional views showing the process steps of the method of fabricating a semiconductor device having a three-dimensional stacked structure according to the third embodiment of the invention, respectively, which is subsequent to FIG. 14(b).

FIGS. 16(e) to 16(f) are partial cross-sectional views showing the process steps of the method of fabricating a semiconductor device having a three-dimensional stacked structure according to the third embodiment of the invention, respectively, which is subsequent to FIG. 15(d).

FIGS. 17(a) to 17(b) are partial cross-sectional views showing the process steps of a method of fabricating a semiconductor device having a three-dimensional stacked structure according to a fourth embodiment of the invention, respectively.

FIGS. 18(c) to 18(d) are partial cross-sectional views showing the process steps of the method of fabricating a semiconductor device having a three-dimensional stacked structure according to the fourth embodiment of the invention, respectively, which is subsequent to FIG. 17(b).

FIGS. 19(e) to 19(f) are partial cross-sectional views showing the process steps of the method of fabricating a semiconductor device having a three-dimensional stacked structure according to the fourth embodiment of the invention, respectively, which is subsequent to FIG. 18(d).

FIGS. 20(g) to 20(h) are partial cross-sectional views showing the process steps of the method of fabricating a semiconductor device having a three-dimensional stacked structure according to the fourth embodiment of the invention, respectively, which is subsequent to FIG. 19(f).

FIGS. 21(a) to 21(c) are partial cross-sectional views showing the process steps of a method of fabricating a semiconductor device having a three-dimensional stacked structure according to a fifth embodiment of the invention, respectively.

FIG. 22 is a partial cross-sectional view showing the process step of a method of fabricating a semiconductor device having a three-dimensional stacked structure according to a sixth embodiment of the invention.

FIGS. 23(a) to 23(b) are partial cross-sectional views showing the process steps of a method of fabricating a semiconductor device having a three-dimensional stacked structure according to a seventh embodiment of the invention, respectively.

FIGS. 24(c) to 24(d) are partial cross-sectional views showing the process steps of the method of fabricating a semiconductor device having a three-dimensional stacked structure according to the seventh embodiment of the invention, respectively, which is subsequent to FIG. 23(b).

FIG. 25(e) is a partial cross-sectional view showing the process step of the method of fabricating a semiconductor device having a three-dimensional stacked structure according to the seventh embodiment of the invention, which is subsequent to FIG. 24(d).

FIG. 26 is a partial cross-sectional views showing the process step of a method of fabricating a semiconductor device having a three-dimensional stacked structure according to an eighth embodiment of the invention.

DESCRIPTION OF THE REFERENCE SYMBOLS 1, 1', 1", 1A, 1B first semiconductor circuit layer
1a, 1a', 1Aa, 1Ba thinned first semiconductor circuit layer
2, 2' second semiconductor circuit layer
2a, 2a' thinned second semiconductor circuit layer
11 semiconductor substrate
12 SiO$_2$ film
12b gate insulating film
13, 13a trench
14 SiO$_2$ film
15 conductive plug
16 source/drain region
18 gate electrode
19, 19a interlayer insulating film
20 metal wiring film
21 conductive film
30, 30A, 30B multilayer wiring structure
31 insulative material
32, 33, 34 wiring layer
35, 35a, 36 conductor
37 microbump electrode
38 conductor
39 adhesive
40 support substrate
41 adhesive
42, 42a, 43 microbump electrode
44 adhesive
51, 52 Si chip
51a, 52a thinned Si chip
53 adhesive
61, 62 Si chip
61a, 62a thinned Si chip

The invention claimed is:

1. A method of fabricating a semiconductor device having a three-dimensional stacked structure formed by stacking semiconductor circuit layers on a support substrate, comprising the steps of:
  forming a trench in a semiconductor substrate that constitutes one of the semiconductor circuit layers from a surface side of the semiconductor substrate, an inner wall face of the trench being covered with a first insulating film;
  filling an inside of the trench with a conductive material from the surface side of the semiconductor substrate, thereby forming a conductive plug;
  forming a desired element or circuit, from the surface side of the semiconductor substrate, in an inside or on a surface of the semiconductor substrate where the conductive plug has been formed;
  covering the surface of the semiconductor substrate where the element or circuit has been formed with a second insulating film; and
  fixing the semiconductor substrate to the support substrate or a remaining one of the semiconductor circuit layers by joining the second insulating film to the support substrate or the remaining one of the semiconductor circuit layers directly or indirectly through a wiring structure, wherein the semiconductor substrate is joined to the support substrate or to the remaining one of the semiconductor circuit layers from the surface side of the semiconductor substrate;
  selectively removing the semiconductor substrate which has been fixed to the support substrate or the remaining one of the semiconductor circuit layers from a back side of the semiconductor substrate, thereby exposing the first insulating film to the back side of the semiconductor substrate; and
  selectively removing the first insulating film which has been exposed to the back side of the semiconductor substrate, thereby exposing the conductive plug to the back side of the semiconductor substrate.

2. The method according to claim 1, wherein the end of the conductive plug which has been exposed to the back side of the semiconductor substrate is used as the second electrode.

3. The method according to claim 1, wherein the semiconductor substrate is formed by a single semiconductor member.

4. The method according to claim 1, wherein the semiconductor substrate is formed by a combination of a plurality of semiconductor members.

5. The method according to claim 1, further comprising a step of disposing a first electrode on at least one of the second insulating film or the wiring structure and the support substrate or the remaining one of the semiconductor circuit layers;
  wherein the step of fixing the semiconductor substrate to the support substrate or the remaining one of the semiconductor circuit layers is performed by using the first electrode.

6. The method according to claim 5, wherein the semiconductor circuit layer comprises a wiring structure formed on the second insulating film in addition to the element or circuit; and
  the first electrode is formed indirectly over the second insulating film through the wiring structure.

7. The method according to claim 1, further comprising a step of forming a second electrode on an end of the conductive plug that has been exposed to the back side of the semiconductor substrate.

8. The method according to claim 7, wherein in the step of forming the second electrode, a piece of conductive material formed separately is fixed onto the end of the conductive plug, resulting in the second electrode.

9. The method according to claim 7, wherein in the step of forming the second electrode, a conductive material is directly deposited onto the end of the conductive plug, resulting in the second electrode.

10. A method of fabricating a semiconductor device having a three-dimensional stacked structure formed by stacking semiconductor circuit layers on a support substrate, comprising the steps of:
  forming a desired element or circuit in an inside or on a surface of a semiconductor substrate that constitutes one of the semiconductor circuit layers from a surface side of the semiconductor substrate;
  forming, from the surface side of the semiconductor substrate, a trench in the semiconductor substrate where the element or circuit has been formed, an inner wall face of the trench being covered with a first insulating film;
  filling an inside of the trench with a conductive material from the surface side of the semiconductor substrate, thereby forming a conductive plug;
  covering the surface of the semiconductor substrate, where the element or circuit and the conductive plug have been formed, with a second insulating film; and
  fixing the semiconductor substrate to the support substrate or a remaining one of the semiconductor circuit layers by joining the second insulating film to the support substrate or the remaining one of the semiconductor circuit layers directly or indirectly through a wiring structure, wherein the semiconductor substrate is joined to the support substrate or to the remaining one of the semiconductor circuit layers from the surface side of the semiconductor substrate;

selectively removing, from a back side of the semiconductor substrate, the semiconductor substrate which has been fixed to the support substrate or the remaining one of the semiconductor circuit layers, thereby exposing the first insulating film to the back side of the semiconductor substrate; and selectively removing the first insulating film which has been exposed to the back side of the semiconductor substrate, thereby exposing the conductive plug to the back side of the semiconductor substrate.

11. The method according to claim 10, further comprising a step of disposing a first electrode on at least one of the second insulating film or the wiring structure and the support substrate or the remaining one of the semiconductor circuit layers;

wherein the step of fixing the semiconductor substrate to the support substrate or the remaining one of the semiconductor circuit layers is performed by using the first electrode.

12. The method according to claim 11, wherein the semiconductor circuit layer comprises a wiring structure formed on the second insulating film in addition to the element or circuit; and the first electrode is formed indirectly over the second insulating film through the wiring structure.

13. The method according to claim 10, wherein the end of the conductive plug which has been exposed to the back side of the semiconductor substrate is used as the second electrode.

14. The method according to claim 10, wherein the semiconductor substrate is formed by a single semiconductor member.

15. The method according to claim 10, wherein the semiconductor substrate is formed by a combination of a plurality of semiconductor members.

16. The method according to claim 10, further comprising a step of forming a second electrode on an end of the conductive plug that has been exposed to the back side of the semiconductor substrate.

17. The method according to claim 16, wherein in the step of forming the second electrode, a piece of conductive material formed separately is fixed onto the end of the conductive plug, resulting in the second electrode.

18. The method according to claim 16, wherein in the step of forming the second electrode, a conductive material is directly deposited onto the end of the conductive plug, resulting in the second electrode.

19. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

forming a trench from the surface side of the semiconductor substrate, the trench penetrating through the first insulating film to reach the inside of the semiconductor substrate, and an inner wall face of the trench being covered with a second insulating film;

filling an inside of the trench with a conductive material from the surface side of the semiconductor substrate, thereby forming a conductive plug;

fixing the semiconductor substrate to the support substrate or a remaining one of the semiconductor circuit layers by using a first electrode disposed on a corresponding position to an end of the conductive plug on the surface side of the semiconductor substrate, wherein the semiconductor substrate is joined to the support substrate or to the remaining one of the semiconductor circuit layers from the surface side of the semiconductor substrate;

selectively removing the semiconductor substrate, which has been fixed to the support substrate or the remaining one of the semiconductor circuit layers, from a back side of the semiconductor substrate, thereby exposing the second insulating film to the back side of the semiconductor substrate; and selectively removing the second insulating film which has been exposed to the back side of the semiconductor substrate, thereby exposing the conductive plug to the back side of the semiconductor substrate.

20. The method according to claim 19, wherein the semiconductor circuit layer comprises a wiring structure formed on the first insulating film in addition to the element or circuit; and the trench is formed to penetrate through the first insulating film and the wiring structure.

21. The method according to claim 19, wherein the end of the conductive plug, which has been exposed to the back side of the semiconductor substrate, is used as the second electrode.

22. The method according to claim 19, wherein the semiconductor substrate is formed by a single semiconductor member.

23. The method according to claim 19, wherein the semiconductor substrate is formed by a plurality of semiconductor members.

24. The method according to claim 19, further comprising a step of forming a second electrode on an end of the conductive plug which has been exposed to the back side of the semiconductor substrate.

25. The method according to claim 24, wherein in the step of forming the second electrode, a piece of conductive material formed separately is fixed onto the end of the conductive plug, resulting in the second electrode.

26. The method according to claim 24, wherein in the step of forming the second electrode, a conductive material is directly deposited onto the end of the conductive plug, resulting in the second electrode.

27. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

fixing the semiconductor substrate to the support substrate or a remaining one of the semiconductor circuit layers by joining the first insulating film to the support substrate or the remaining one of the semiconductor circuit layers directly or indirectly through a wiring structure, wherein the semiconductor substrate is joined to the support substrate or to the remaining one of the semiconductor circuit layers from the surface side of the semiconductor substrate;

forming, from the back side of the semiconductor substrate, a trench in the semiconductor substrate which has been fixed to the support substrate or the remaining one of the semiconductor circuit layers, an inner wall face of the trench being covered with a second insulating film; and filling an inside of the trench with a conductive material from the back side of the semiconductor substrate, thereby forming a conductive plug.

28. The method according to claim 27, further comprising a step of disposing a first electrode on at least one of the first insulating film or the wiring structure and the support substrate or the remaining one of the semiconductor circuit layers;

wherein the step of fixing the semiconductor substrate to the support substrate or the remaining one of the semiconductor circuit layers is performed by using the first electrode.

29. The method according to claim 28, wherein the semiconductor circuit layer comprises a wiring structure formed on the first insulating film in addition to the element or circuit; and the first electrode is formed indirectly over the first insulating film through the wiring structure.

30. The method according to claim 28, wherein the end of the conductive plug that has been exposed to the back side of the semiconductor substrate is used as the second electrode.

31. The method according to claim 28, wherein the semiconductor substrate is formed by a single semiconductor member.

32. The method according to claim 28, wherein the semiconductor substrate is formed by a plurality of semiconductor members.

33. The method according to claim 28, wherein in the step of forming the trench whose inner wall face is covered with the second insulating film, the semiconductor substrate is selectively removed from the back side of the semiconductor substrate, thereby forming the trench that penetrates through the semiconductor substrate; and the second insulating film that covers the inner wall face of the trench is formed in such a way as to have an opening that enables electrical interconnection between the first electrode and the conductive plug.

34. The method according to claim 33, wherein the opening of the second insulating film is formed near an end of the trench on the surface side of the semiconductor substrate.

35. The method according to claim 28, further comprising a step of forming a second electrode on an end of the conductive plug that has been exposed to the back side of the semiconductor substrate.

36. The method according to claim 35, wherein in the step of forming the second electrode, a piece of conductive material formed separately is fixed onto the end of the conductive plug, resulting in the second electrode.

37. The method according to claim 35, wherein in the step of forming the second electrode, a conductive material is directly deposited onto the end of the conductive plug, resulting in the second electrode.

38. A method of fabricating a semiconductor device having a three dimensional stacked structure formed by stacking semiconductor circuit layers on a support substrate, comprising the steps of:

forming a trench in a semiconductor substrate that constitutes one of the semiconductor circuit layers from a surface side of the semiconductor substrate, an inner wall face of the trench being covered with a first insulating film;

filling an inside of the trench with a conductive material from the surface side of the semiconductor substrate, thereby forming a conductive plug;

forming a desired element or circuit, from the surface side of the semiconductor substrate, in an inside or on a surface of the semiconductor substrate where the conductive plug has been formed;

covering the surface of the semiconductor substrate where the element or circuit has been formed with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing the semiconductor substrate which has been fixed to the support substrate or the remaining one of the semiconductor circuit layers from a back side of the semiconductor substrate, thereby exposing the first insulating film to the back side of the semiconductor substrate;

selectively removing the first insulating film which has been exposed to the back side of the semiconductor substrate, thereby exposing the conductive plug to the back side of the semiconductor substrate; and forming a third insulating film that covers the back of the semiconductor substrate between the step of exposing the first insulating film to the back side of the semiconductor substrate and the step of exposing the conductive plug to the back side of the semiconductor substrate;

wherein in the step of exposing the conductive plug, the third insulating film is selectively removed along with the first insulating film.

39. A method of fabricating a semiconductor device having a three-dimensional stacked structure formed by stacking semiconductor circuit layers on a support substrate, comprising the steps of:

forming a trench in a semiconductor substrate that constitutes one of the semiconductor circuit layers from a surface side of the semiconductor substrate, an inner wall face of the trench being covered with a first insulating film;

filling an inside of the trench with a conductive material from the surface side of the semiconductor substrate, thereby forming a conductive plug;

forming a desired element or circuit, from the surface side of the semiconductor substrate, in an inside or on a surface of the semiconductor substrate where the conductive plug has been formed;

covering the surface of the semiconductor substrate where the element or circuit has been formed with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing the semiconductor substrate which has been fixed to the support substrate or the remaining one of the semiconductor circuit layers from a back side of the semiconductor substrate, thereby exposing the first insulating film to the back side of the semiconductor substrate;

selectively removing the first insulating film which has been exposed to the back side of the semiconductor substrate, thereby exposing the conductive plug to the back side of the semiconductor substrate; and forming a third insulating film that covers the back of the semiconductor substrate; a step of forming a planarization film on the third insulating film; and a step of selectively removing the planarization film, between the step of exposing the first insulating film to the back side of the semiconductor substrate and the step of exposing the conductive plug to the back side of the semiconductor substrate; and wherein in the step of exposing the conductive plug, the third insulating film and the remaining planarization film are selectively removed along with the first insulating film.

40. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

forming a trench from the surface side of the semiconductor substrate, the trench penetrating through the first insulating film to reach the inside of the semiconductor substrate, and an inner wall face of the trench being covered with a second insulating film;

filling an inside of the trench with a conductive material from the surface side of the semiconductor substrate, thereby forming a conductive plug;

fixing the semiconductor substrate to the support substrate or a remaining one of the semiconductor circuit layers by using a first electrode disposed on a corresponding position to an end of the conductive plug on the surface side of the semiconductor substrate;

selectively removing the semiconductor substrate, which has been fixed to the support substrate or the remaining one of the semiconductor circuit layers, from a back side of the semiconductor substrate, thereby exposing the second insulating film to the back side of the semiconductor substrate;

selectively removing the second insulating film which has been exposed to the back side of the semiconductor substrate, thereby exposing the conductive plug to the back side of the semiconductor substrate; and forming a third insulating film that covers the back of the semiconductor substrate between the step of exposing the second insulating film to the back side of the semiconductor substrate and the step of exposing the conductive plug to the back side of the semiconductor substrate;

wherein in the step of exposing the conductive plug, the third insulating film is selectively removed along with the second insulating film that covers the wall face of the trench.

41. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

covering the surface of the semiconductor substrate where the element or circuit has been formed with a first insulating film;

forming a trench from the surface side of the semiconductor substrate, the trench penetrating through the first insulating film to reach the inside of the semiconductor substrate, and an inner wall face of the trench being covered with a second insulating film;

filling an inside of the trench with a conductive material from the surface side of the semiconductor substrate, thereby forming a conductive plug;

fixing the semiconductor substrate to the support substrate or a remaining one of the semiconductor circuit layers by using a first electrode disposed on a corresponding position to an end of the conductive plug on the surface side of the semiconductor substrate;

selectively removing the semiconductor substrate, which has been fixed to the support substrate or the remaining one of the semiconductor circuit layers, from a back side of the semiconductor substrate, thereby exposing the second insulating film to the back side of the semiconductor substrate;

selectively removing the second insulating film which has been exposed to the back side of the semiconductor substrate, thereby exposing the conductive plug to the back side of the semiconductor substrate; and forming a third insulating film that covers the back of the semiconductor substrate; a step of forming a planarization film on the third insulating film; and a step of selectively removing the planarization film, between the step of exposing the second insulating film to the back side of the semiconductor substrate and the step of exposing the conductive plug to the back side of the semiconductor substrate;

wherein in the step of exposing the conductive plug, the third insulating film and the remaining planarization film are selectively removed along with the second insulating film.

42. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

forming, from the surface side of the semiconductor substrate, a trench in the semiconductor substrate where the element or circuit has been formed, an inner wall face of the trench being covered with a first insulating film;

filling an inside of the trench with a conductive material from the surface side of the semiconductor substrate, thereby forming a conductive plug;

covering the surface of the semiconductor substrate, where the element or circuit and the conductive plug have been formed, with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing, from a back side of the semiconductor substrate, the semiconductor substrate which has been fixed to the support substrate or the remaining one of the semiconductor circuit layers, thereby exposing the first insulating film to the back side of the semiconductor substrate;

selectively removing the first insulating film which has been exposed to the back side of the semiconductor substrate, thereby exposing the conductive plug to the back side of the semiconductor substrate; and forming a third insulating film that covers the back of the semiconductor substrate between the step of exposing the first insulating film to the back side of the semiconductor substrate and the step of exposing the conductive plug to the back side of the semiconductor substrate;

wherein in the step of exposing the conductive plug, the third insulating film is selectively removed along with the first insulating film.

43. A method of fabricating a semiconductor device having a three-dimensional stacked structure formed by stacking semiconductor circuit layers on a support substrate, comprising the steps of:

forming a desired element or circuit in an inside or on a surface of a semiconductor substrate that constitutes one of the semiconductor circuit layers from a surface side of the semiconductor substrate;

forming, from the surface side of the semiconductor substrate, a trench in the semiconductor substrate where the element or circuit has been formed, an inner wall face of the trench being covered with a first insulating film;

filling an inside of the trench with a conductive material from the surface side of the semiconductor substrate, thereby forming a conductive plug;

covering the surface of the semiconductor substrate, where the element or circuit and the conductive plug have been formed, with a second insulating film; and fixing the semiconductor substrate to the support substrate or a remaining one of the semiconductor circuit layers by joining the second insulating film to the support substrate or the remaining one of the semiconductor circuit layers directly or indirectly through a wiring structure;

selectively removing, from a back side of the semiconductor substrate, the semiconductor substrate which has been fixed to the support substrate or the remaining one of the semiconductor circuit layers, thereby exposing the first insulating film to the back side of the semiconductor substrate;

selectively removing the first insulating film which has been exposed to the back side of the semiconductor substrate, thereby exposing the conductive plug to the back side of the semiconductor substrate;

forming a third insulating film that covers the back of the semiconductor substrate; a step of forming a planarization film on the third insulating film; and a step of selectively removing the planarization film, between the step of exposing the first insulating film to the back side of the semiconductor substrate and the step of exposing the conductive plug to the back side of the semiconductor substrate; and wherein in the step of exposing the conductive plug, the third insulating film and the remaining planarization film are selectively removed along with the first insulating film.

* * * * *